(12) United States Patent
Nagaosa et al.

(10) Patent No.: US 9,859,017 B2
(45) Date of Patent: Jan. 2, 2018

(54) MAGNETIC ELEMENT, SKYRMION MEMORY, SKYRMION MEMORY-DEVICE, SOLID-STATE ELECTRONIC DEVICE, DATA-STORAGE DEVICE, DATA PROCESSING AND COMMUNICATION DEVICE

(71) Applicant: RIKEN, Saitama (JP)

(72) Inventors: Naoto Nagaosa, Tokyo (JP); Wataru Koshibae, Saitama (JP); Junichi Iwasaki, Tokyo (JP); Masashi Kawasaki, Tokyo (JP); Yoshinori Tokura, Tokyo (JP); Yoshio Kaneko, Chiba (JP)

(73) Assignee: RIKEN, Saitama (JP)

( * ) Notice: Subject to any disclaimer, the term of this patent is extended or adjusted under 35 U.S.C. 154(b) by 0 days.

(21) Appl. No.: 15/450,003

(22) Filed: Mar. 5, 2017

(65) Prior Publication Data

US 2017/0178746 A1 Jun. 22, 2017

Related U.S. Application Data

(63) Continuation of application No. PCT/JP2015/075118, filed on Sep. 3, 2015.

(51) Int. Cl.
*G11C 19/00* (2006.01)
*G11C 19/08* (2006.01)

(52) U.S. Cl.
CPC ........ *G11C 19/085* (2013.01); *G11C 19/0866* (2013.01)

(58) Field of Classification Search
CPC .................. G11C 19/085; G11C 19/0866
See application file for complete search history.

(56) References Cited

U.S. PATENT DOCUMENTS

| 6,834,005 | B1 | 12/2004 | Parkin | |
|---|---|---|---|---|
| 2011/0261602 | A1* | 10/2011 | Moutafis | B82Y 10/00 365/8 |
| 2016/0314827 | A1* | 10/2016 | Cros | G11C 11/16 |
| 2016/0351242 | A1* | 12/2016 | Nagaosa | G11C 11/16 |
| 2017/0053686 | A1* | 2/2017 | Oike | G11C 11/16 |

(Continued)

FOREIGN PATENT DOCUMENTS

JP 2014-86470 A 5/2014

OTHER PUBLICATIONS

Junichi Iwasaki, Masahito Mochizuki, and Naoto Nagaosa, "Current-induced skyrmion dynamics in constricted geometries", Nature Nanotechnology, the United Kingdom, Nature Publishing Group, Sep. 8, 2013, vol. 8, p. 742-747.

*Primary Examiner* — Harry W Byrne
*Assistant Examiner* — R Lance Reidlinger

(57) ABSTRACT

To provide a magnetic element capable of performing skyrmion transfer, a skyrmion memory to which this magnetic element is applied, and a shift register, for example, a magnetic element capable of performing skyrmion transfer is provided, the magnetic element providing a transverse transfer arrangement in which the skyrmion is transferred substantially perpendicular to a current between an upstream electrode and a downstream electrode, and including a plurality of stable positions in which the skyrmion exists more stably than in other regions of a magnet, and a skyrmion sensor that detects a position of the skyrmion.

20 Claims, 49 Drawing Sheets

(56) References Cited

U.S. PATENT DOCUMENTS

2017/0169898 A1\* 6/2017 Nagaosa .............. G11C 19/085
2017/0178748 A1\* 6/2017 Nagaosa ............ G11C 19/0841
2017/0179375 A1\* 6/2017 Nagaosa ................ H01L 43/02

\* cited by examiner

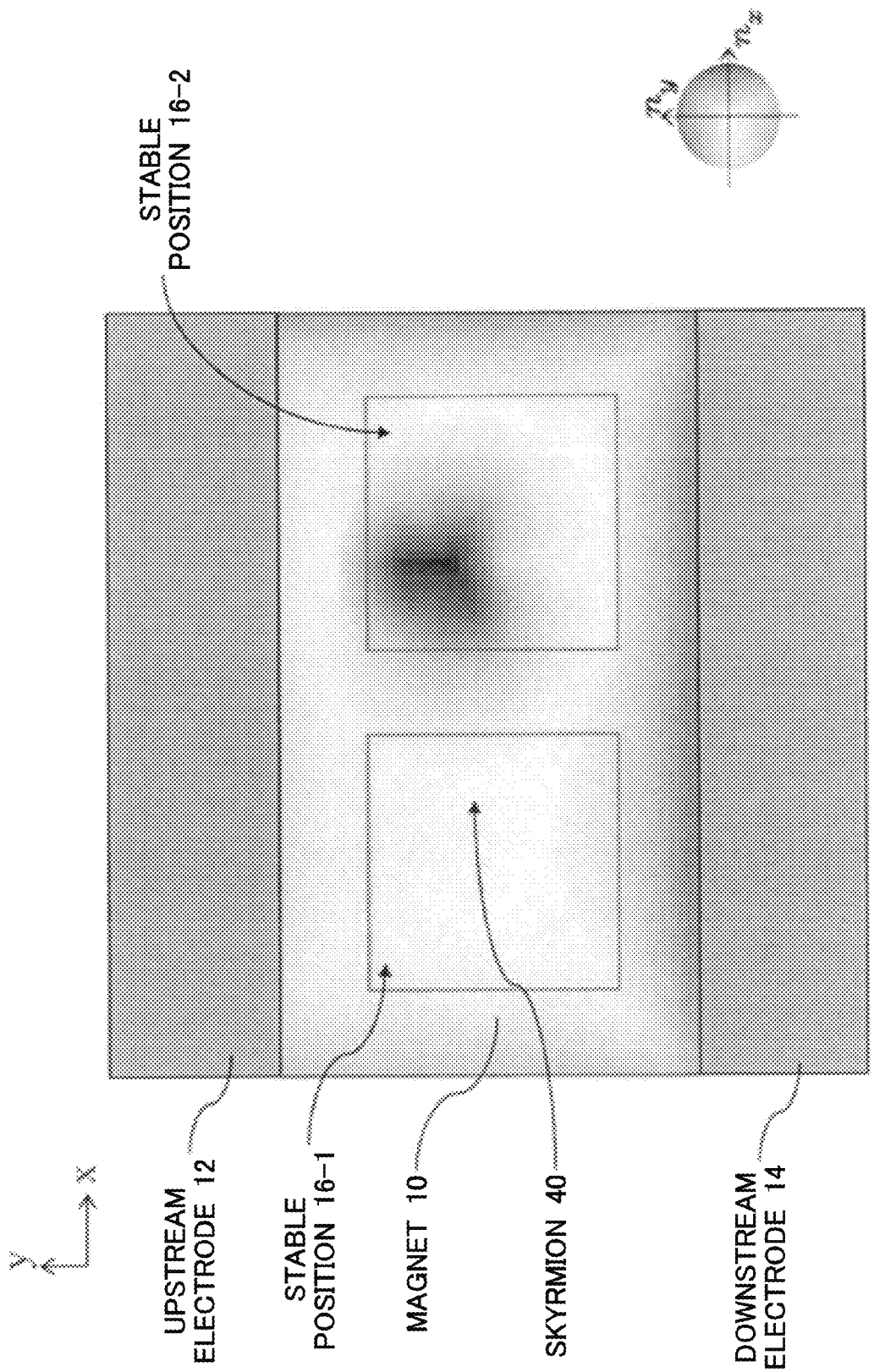

MAGNETIC ELEMENT, SKYRMION MEMORY, SKYRMION MEMORY-DEVICE, SOLID-STATE ELECTRONIC DEVICE, DATA-STORAGE DEVICE, DATA PROCESSING AND COMMUNICATION DEVICE

The contents of the following Japanese patent application(s) are incorporated herein by reference:
NO. 2014-219692 filed in JP on Oct. 28, 2014, and PCT/JP2015/075118 filed on Sep. 3, 2015

BACKGROUND

Technical Field

The present invention relates to a magnetic element capable of transferring a skyrmion, a skyrmion memory using the magnetic element, a shift register using the magnetic element, a skyrmion memory device using the magnetic element, a skyrmion memory embedded solid-state electronic device, a data recording apparatus with a built-in skyrmion memory, a data processing apparatus with a built-in skyrmion memory, and a communication apparatus with a built-in skyrmion memory.

Related Art

A magnetic element is known that uses a magnetic moment of a magnet as digital information. The magnetic element has a nanoscale magnetic structure that functions as an element of a non-volatile memory that does not require electrical power when information is held. Based on advantages of ultrahigh density properties or the like from the nanoscale magnetic structure, the magnetic element is expected to be applied as a magnetic medium with large storage capacity of information, and the importance thereof increases as a memory device of an electronic device.

As a candidate for a next-generation magnetic memory device, a magnetic shift register has been proposed mainly by IBM in the United States. The magnetic shift register drives a magnetic domain wall, transfers an arrangement of the magnetic moment thereof through a current, and reads stored information (refer to Patent Document 1).

FIG. 29 is a schematic view showing the principle of driving of magnetic domain wall with current. The domain wall is a boundary of a magnetic region where the orientations of magnetic moments are mutually phase-inverted. In FIG. 29, the domain walls in a magnetic shift register 1 are shown by solid lines. The magnetic domain walls are driven by causing a current with the orientation of arrows to flow in the magnetic shift register 1. The magnetism by the orientation of the magnetic moments positioned above a magnetic sensor 2 changes by moving the domain wall. This magnetic change is sensed by the magnetic sensor 2, and magnetic information is derived.

However, this type of magnetic shift register 1 requires a large current when the magnetic domain walls are moved, and also has a drawback in that transfer velocity of the magnetic domain walls is low. As a result, writing time and erasing time of memory become slow, increasing power consumption.

Therefore, the inventors of the present application proposed a skyrmion magnetic element that uses skyrmions generated in the magnet as a storage unit (Patent Document 2). Further, in Non-Patent Document 1, the inventors of the present application showed that it is possible to transfer skyrmions in an arrangement in which the skyrmions are transferred substantially parallel to the direction of current.

In the present specification, the arrangement in which the drive current and the transfer direction of the skyrmions are substantially parallel is defined as a longitudinal transfer arrangement. In a case where the longitudinal transfer arrangement disclosed in Non-Patent Document 1 is applied as a memory, electrodes that apply current are provided to both end portions of the fine line structure of the magnet having skyrmions. Therefore, a width of the fine line is nanoscale, a resistance value between both end portions of the long fine line is large, and thus, it is not possible to cause a large current density to flow. Therefore, there is a restriction on current density for the current, and the transfer velocity of the skyrmion becomes low. There is a problem in that memory writing time and memory reading time are not shortened. Non-Patent Document 1 proposes skyrmion transfer by steady-state current as a storage memory. Since the steady-state current is necessary, the skyrmion transfer cannot be used as a non-volatile memory. Also, since Non-Patent Document 1 does not disclose a method of achieving a memory function when the skyrmion transfer is applied as a memory, there is a major problem in putting it into practical use.

PRIOR ART DOCUMENTS

Patent Documents

[Patent Document 1] U.S. Pat. No. 6,834,005
[Patent Document 2] Japanese Unexamined Patent Application, Publication No. 2014-86470
[Non-Patent Document 1] Junichi Iwasaki, Masahito Mochizuki, and Naoto Nagaosa, "Current-induced skyrmion dynamics in constricted geometries", Nature Nanotechnology, the United Kingdom, Nature Publishing Group, Sep. 8, 2013, Vol. 8, p. 742-747

SUMMARY OF THE INVENTION

Problems to be Solved by the Invention

A skyrmion has an extremely small magnetic structure with a diameter from 1 nm to 500 nm, and since this structure can be held stably for a long time without power supply from the outside, there has been increasing expectation of skyrmions being applied in memory elements. Therefore, a configuration of a magnetic element or the like, capable of being applied to a memory element is provided.

Means for Solving the Problems

In a first aspect of the present invention, a magnetic element capable of transferring a skyrmion is provided, the magnetic element including a magnet in a thin layer shape surrounded by a non-magnetic material, an upstream electrode being a conductor connected to a spreading direction of the magnet, a downstream electrode being a conductor connected to a spreading direction of the magnet separately from the upstream electrode, and a skyrmion sensor that detects a position of the skyrmion, wherein the magnet has a plurality of stable positions in which the skyrmion exists more stably than in other regions of the magnet, and a transferring configuration with a direction perpendicular to a current direction is provided in which a direction in which a current caused to flow between the upstream electrode and the downstream electrode is arranged substantially perpendicular to a direction in which one or more skyrmions are transferred.

In a second aspect of the present invention, a skyrmion memory is provided, the skyrmion memory including the magnetic element of the first aspect, a generating unit of magnetic field that is provided opposite to the magnet, and that is capable of applying a magnetic field to the magnet, a power supply that is connected to the upstream electrode and the downstream electrode, and applies a current to the magnet between the upstream electrode and the downstream electrode, and a measuring unit that is connected to the skyrmion sensor, and detects the position of the skyrmion based on a detection result of the skyrmion sensor. The skyrmion memory may have a plurality of magnetic elements stacked in a thickness direction.

In a third aspect of the present invention, a skyrmion memory device is provided, the skyrmion memory device including the skyrmion memory of the second aspect, a plurality of electric lines to transfer a skyrmion that are connected to the plurality of skyrmion memories, and supply, to the respective skyrmion memories corresponding thereto, a current to transfer a skyrmion that transfers the skyrmion between the plurality of stable positions, a plurality of word lines to read a skyrmions that are connected to the plurality of skyrmion memories, transmit a voltage or a current according to the position of the skyrmion of the respective magnetic elements corresponding thereto, a plurality of switches that are provided to the plurality of electric lines to transfer a skyrmion and the plurality of word lines to read a skyrmion, and select the skyrmion memory, and a detection circuit that detects the position of the skyrmion in the magnetic element selected by the switch based on the current or the voltage flowing through the word line to read a skyrmion.

In a fourth aspect of the present invention, a skyrmion memory device is provided, the skyrmion memory device including a substrate, a semiconductor element formed on the substrate, and at least one skyrmion memory of the second aspect stacked above the semiconductor element.

In a fifth aspect of the present invention, a skyrmion memory embedded solid-state electronic device is provided, the skyrmion memory embedded solid-state electronic device including, within the same chip, the skyrmion memory or the skyrmion memory device of the second to fourth aspects, and a solid-state electronic device.

In a sixth aspect of the present invention, a data recording apparatus on which the skyrmion memory or the skyrmion memory device of the second to the fourth aspects is mounted is provided.

In a seventh aspect of the present invention, a data processing apparatus on which the skyrmion memory or the skyrmion memory device of the second to the fourth aspects is mounted is provided.

In an eighth aspect of the present invention, a communication apparatus on which the skyrmion memory or the skyrmion memory device of the second to the fourth aspects is mounted is provided.

BRIEF DESCRIPTION OF THE DRAWINGS

FIG. 5C shows a simulation result of a magnetic moment of the magnet 10 at t=5000(1/J) in a case where a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a positive current to transfer a skyrmion of 0.001 is caused to flow from the upstream electrode 12 to the downstream electrode 14 constantly.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

A chiral magnet is one example of a magnet capable of generating skyrmions. The chiral magnet is a magnet in which a magnetic moment arrangement when an external magnetic field is not applied involves a magnetic ordered phase that rotates in a helical manner relative to a progression direction of the magnetic moment. By applying an external magnetic field, the chiral magnet is caused to transition through a state where the skyrmion exists to a ferromagnetic phase.

Figure 1:
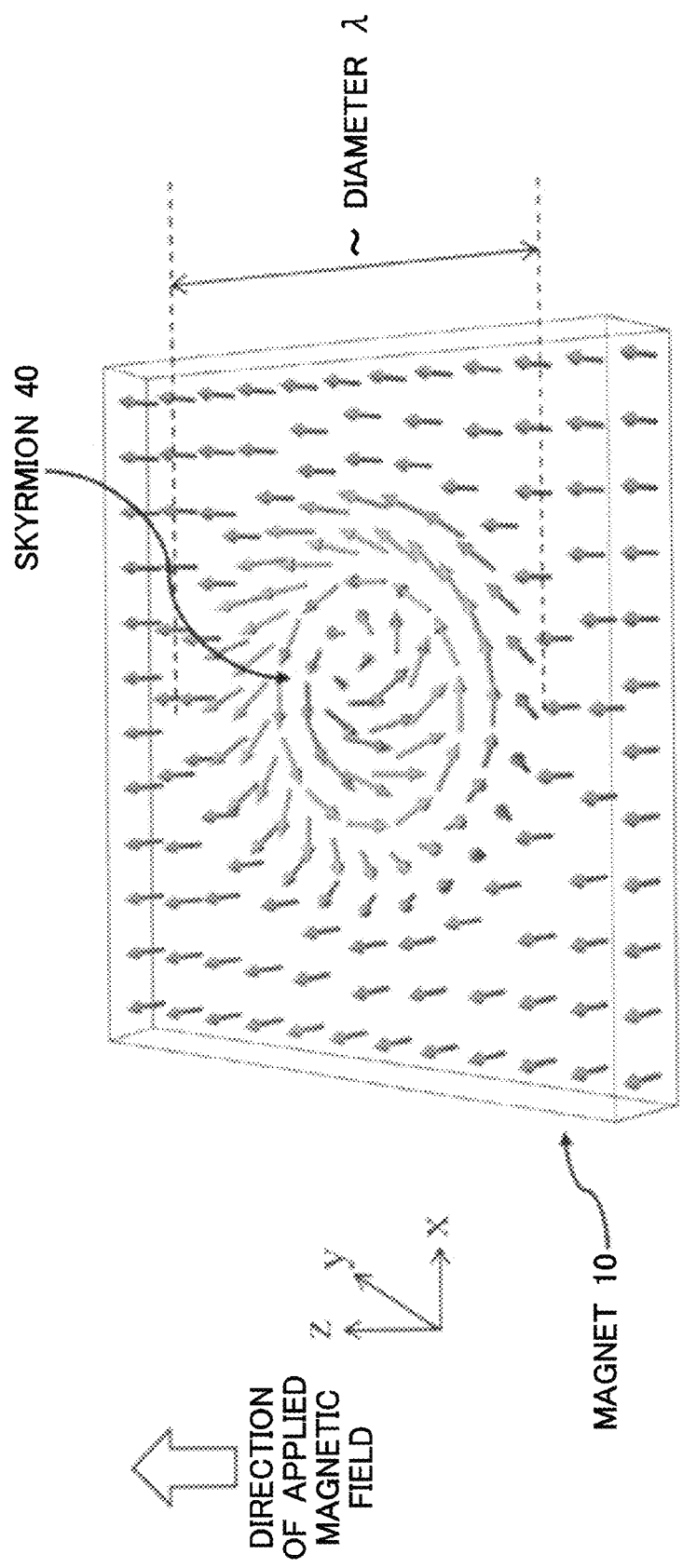
FIG. 1 is a schematic view showing one example of a skyrmion 40 which is a nanoscale magnetic texture in a magnet 10. Intensity and orientation of a magnetic moment are schematically shown by arrows.

FIG. 1 is a schematic view showing one example of a skyrmion 40 which is a nanoscale magnetic texture in a magnet 10. In FIG. 1, each arrow shows an orientation of a magnetic moment in the skyrmion 40. The x axis and the y axis are axes orthogonal to each other, and the z axis is an axis orthogonal to the x-y plane.

The magnet 10 has a plane parallel to the x-y plane. The magnetic moment facing every orientation on the plane of the magnet 10 constitutes the skyrmion 40. In the present example, the orientation of the magnetic field applied to the magnet 10 is the positive z direction. In this case, the magnetic moment of the outermost circumference of the skyrmion 40 of the present example is oriented in the positive z direction.

The magnetic moment in the skyrmion 40 rotates in a spiral from the outermost circumference toward the inside. Further, the orientation of the magnetic moment gradually changes from the positive z direction to the negative z direction in accordance with the rotation in this spiral.

Between the center and the outermost circumference of the skyrmion 40, the orientation of the magnetic moment spirals continuously. That is, the skyrmion 40 is a nanoscale magnetic texture in which the magnetic moment has a spiral texture. In a case where the magnet 10 in which the skyrmion 40 exists is a thin board-shaped solid material, the magnetic moment that constitutes the skyrmion 40 is a magnetic moment with the same orientation in the thickness direction of the magnet 10. That is, the magnetic moment is made from the magnetic moment with the same orientation from a front surface to a back surface in a depth direction (z direction) of the board. The diameter λ of the skyrmion 40 refers to a diameter of the outermost circumference of the skyrmion 40. In the present example, the outermost circumference refers to a circumference of the magnetic moment in the same direction as the external magnetic field shown in FIG. 1.

A number of skyrmion Nsk features the skyrmion 40 which is a nanoscale magnetic texture having a spiral texture. The number of skyrmion can be expressed using [Equation 1] and [Equation 2] given below. In [Equation 2], the polar angle Θ(r) between the magnetic moment and the z axis is a continuous function of the distance r from the center of the skyrmion 40. The polar angle Θ(r) is changed from π to zero or from zero to π when r is changed from 0 to ∞.

$$Nsk = \frac{1}{4}\pi \int\int d^2 r n(r) \cdot \left[\left(\frac{\partial n(r)}{\partial x}\right) \times \left(\frac{\partial n(r)}{\partial y}\right)\right] \quad \text{[Equation 1]}$$

$$n(r) = (\cos\Phi(\varphi)\sin\Theta(r), \sin\Phi(\varphi)\sin\Theta(r), \cos\Theta(r)) \quad \text{[Equation 2]}$$

$$\Phi(\varphi) = m\varphi + \gamma$$

In [Equation 1], n(r) is a unit vector indicating the orientation of the magnetic moment of the skyrmion 40 at a position r. In [Equation 2], m is voracity, and γ is helicity. From [Equation 1] and [Equation 2], when r is changed from 0 to ∞, and Θ(r) is changed from π to zero, Nsk=−m.

Figure 2:
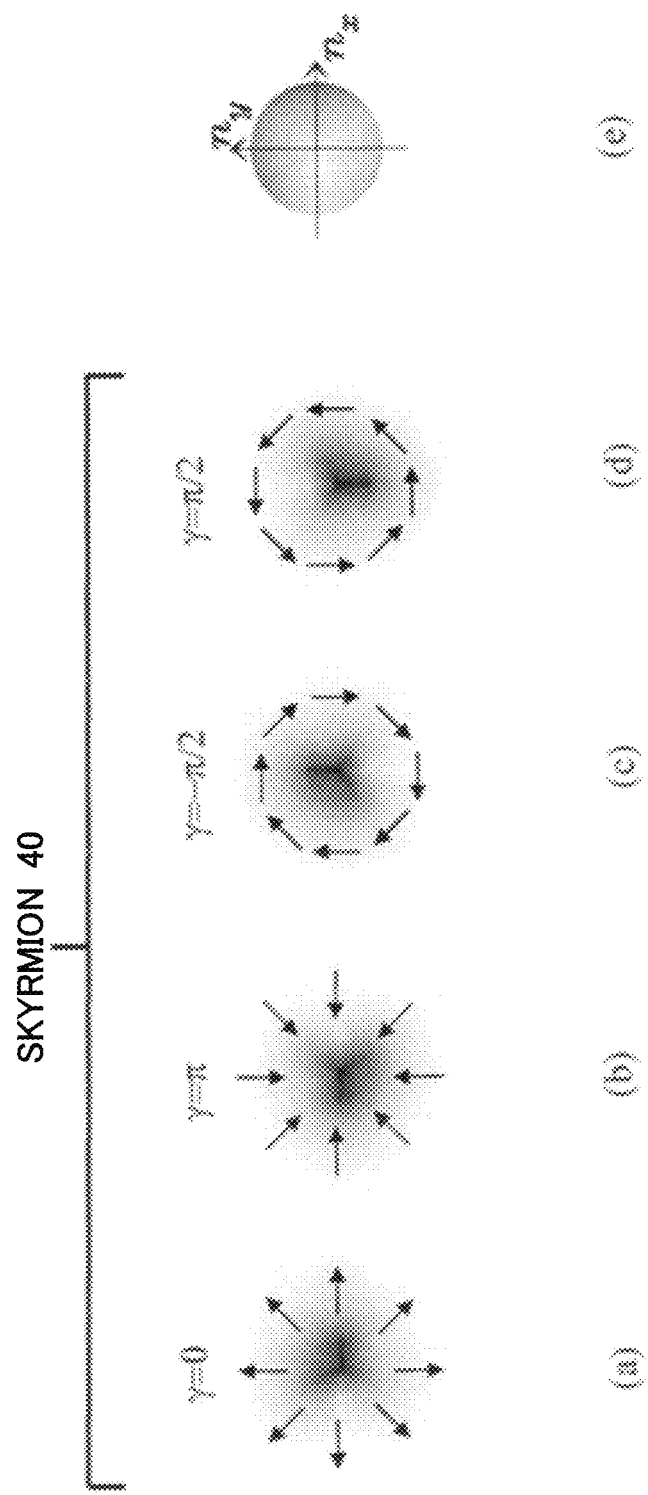
FIG. 2 is a schematic view showing the skyrmion 40 in which helicity γ is different.

FIG. 2 is a schematic view showing the skyrmion 40 in which helicity γ is different. In particular, FIG. 2 shows one example in a case where the number of skyrmion Nsk=−1. (e) of FIG. 2 shows how the coordinates of the magnetic moment n (right-handed system) are defined. It should be noted that since the right-handed system is shown, the $n_z$ axis adopts an orientation from the back to the front of the sheet of paper, relative to the $n_x$ axis and the $n_y$ axis. From (a) of FIG. 2 to (e) of FIG. 2, light and shade shows the orientation of the magnetic moment.

The magnetic moment shown by the light and shade on the circumference in (e) of FIG. 2 has an orientation on the $n_x$-$n_y$ plane. Meanwhile, the magnetic moment shown by the light and shade which is the lightest (white) at the center of the circle in (e) of FIG. 2 has an orientation from the back to the front of the sheet of paper. An angle of the magnetic moment shown by the light and shade at each position from the circumference to the center relative to the $n_z$ axis adopts a value from π to zero according to the distance from the center. The orientation of each magnetic moment in (a) of FIG. 2 to (d) of FIG. 2 is shown by the same light and shade in (e) of FIG. 2. It should be noted that as shown by the centers of the skyrmions 40 in (a) of FIG. 2 to (d) of FIG. 2, the magnetic moment shown by the light and shade which is the darkest (black) has an orientation from the front of the sheet of paper to the back of the sheet of paper. Each arrow in (a) of FIG. 2 to (d) of FIG. 2 shows the magnetic moment at a predetermined distance from the center of a magnetic texture. The magnetic textures shown in (a) of FIG. 2 to (d) of FIG. 2 are in a state that can be defined as the skyrmion 40.

In (a) of FIG. 2 (γ=0), the light and shade at a predetermined distance from the center of the skyrmion 40 matches the light and shade on the circumference in (e) of FIG. 2. Therefore, the orientation of the magnetic moment shown by the arrows in (a) of FIG. 2 forms a radial shape from the center to the outside. The orientation of each magnetic moment in (b) of FIG. 2 (γ=π) is an orientation where each magnetic moment in (a) of FIG. 2 is rotated by 180°, in contrast to each magnetic moment in (a) of FIG. 2 (γ=0). The orientation of each magnetic moment in (c) of FIG. 2 (γ=−π/2) is an orientation where each magnetic moment in (a) of FIG. 2 is rotated by −90 degrees (90 degrees clockwise), in contrast to each magnetic moment in (a) of FIG. 2 (γ=0).

The orientation of each magnetic moment in (d) of FIG. 2 (γ=π/2) is an orientation where each magnetic moment in (a) of FIG. 2 is rotated by 90 degrees (90 degrees counterclockwise), in contrast to each magnetic moment in (a) of FIG. 2 ($\gamma$=0). It should be noted that the skyrmion with the helicity $\gamma$=$\pi$/2 shown in (d) of FIG. 2 corresponds to the skyrmion 40 of FIG. 1.

Although the magnetic structures of the four examples illustrated in (a) of FIG. 2 to (d) of FIG. 2 appear to be different, they are the same magnetic textures topologically. The skyrmions having the structures in (a) of FIG. 2 to (d) of FIG. 2 exist stably once they are generated, and act as carriers that convey information in the magnet 10 to which the external magnetic field is applied.

Figure 3:
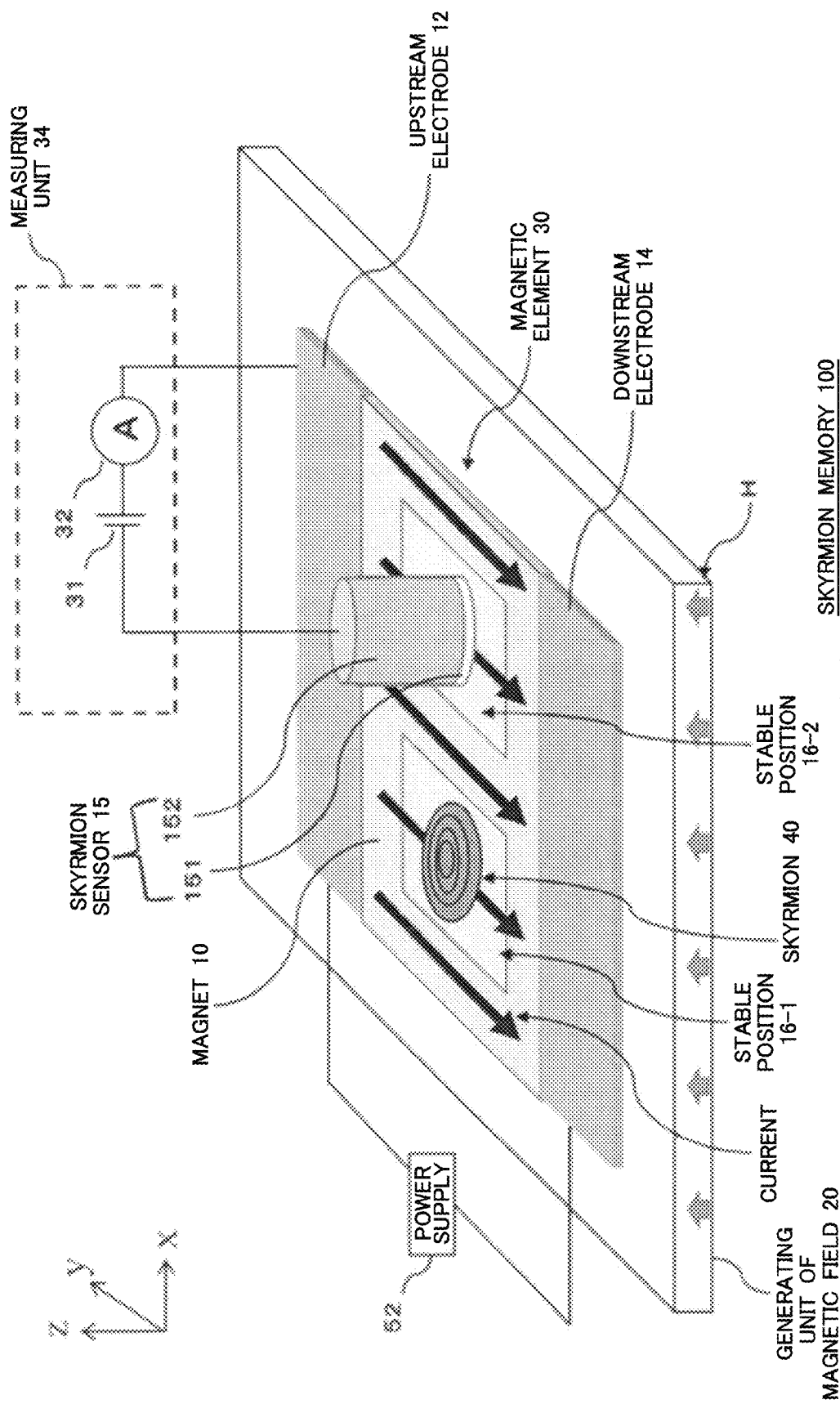
FIG. 3 is a schematic view showing a configuration example of a skyrmion memory 100 in a case of a transferring configuration with a direction perpendicular to a current direction in which a direction in which a current is caused to flow between an upstream electrode 12 and a downstream electrode 14 is arranged substantially perpendicular to a direction in which the skyrmion is transferred.

FIG. 3 is a schematic view showing a configuration example of a skyrmion memory 100 in which a transferring configuration with a direction perpendicular to a current direction is provided in which a direction in which a current is caused to flow between an upstream electrode 12 and a downstream electrode 14 is arranged substantially perpendicular to a direction in which the skyrmion is transferred. The skyrmion memory 100 of the present example includes a magnetic element 30, a generating unit of magnetic field 20, a power supply 52, and a measuring unit 34. The skyrmion memory 100 can transfer and arrange the skyrmion 40 in the magnet 10 in a stable position 16-1 (a first stable position) or a stable position 16-2 (a second stable position) of the magnet 10 by causing a current to transfer a skyrmion to flow through the magnet 10 of the magnetic element 30. There is a significant feature in making the transferring configuration with a direction perpendicular to a current direction in which the direction in which the current is caused to flow between the upstream electrode 12 and the downstream electrode 14 is arranged substantially perpendicular to the direction in which the skyrmion is transferred. In the present example, the presence or absence of the skyrmion 40 in the stable position 16-2 of the magnet 10 corresponds to one bit of information. The measuring unit 34 senses the presence or absence of the skyrmion in the stable position 16-2.

Also, the magnetic element 30 can detect the skyrmion 40 by the application of the current to the magnet 10. Also, the magnetic element 30 may be capable of generating and erasing the skyrmion 40 by the application of the current to the magnet 10. Also, the magnetic element 30 of the present example has a thin layer shape. The magnetic element 30 of the present example has the magnet 10, the upstream electrode 12, the downstream electrode 14, and a skyrmion sensor 15.

The magnet 10 has a thin layer shape, and exhibits at least a skyrmion crystal phase and a ferromagnetic phase according to an applied magnetic field. The skyrmion crystal phase refers to a state where the skyrmion 40 may be generated in the magnet 10. For example, the magnet 10 is a chiral magnet. The magnet 10 is in a thin layer shape such that the skyrmion 40 can exist stably. The magnet 10 may have a thickness of approximately 10 times or less of the diameter of the skyrmion 40, for example The diameter of the skyrmion 40 refers to the diameter of the outermost circumference of the skyrmion.

The magnet 10 has a plurality of stable positions 16. The plurality of stable positions 16 are provided in a region sandwiched between the upstream electrode 12 and the downstream electrode 14 in the magnet 10. The magnet 10 of the present example has a stable position 16-1 and a stable position 16-2. The stable positions 16 refer to regions where the skyrmion 40 can exist more stably than in any other regions of the magnet 10. The stable positions 16 may refer to a region where the skyrmion 40 remains as long as a force is not imparted to the skyrmion 40 from the outside by a current or the like, for example It is possible to achieve the formation of such a region by making magnetic field intensity generated from the generating unit of magnetic field 20 weaker than magnetic field intensity in the vicinity of the stable positions 16, as will be described below. Also, the stable positions 16 may also refer to regions isolated by some barriers in a case where the skyrmion 40 is moved from the region. These barriers can be achieved by providing, to each of the upstream electrode 12 and the downstream electrode 14, a position with a notch structure that protrudes toward the inside of the magnet 10. Each stable position 16 accounts for a predetermined range on the surface of the magnet 10 parallel to the x-y plane. The magnetic element 30 can transfer the skyrmion 40 between the plurality of stable positions 16 by the current to transfer a skyrmion.

The generating unit of magnetic field 20 applies the magnetic field H to the magnet 10. In the present example, the generating unit of magnetic field 20 is provided opposite to the magnet 10. The generating unit of magnetic field 20 may be provided opposite to the back surface of the magnet 10. The generating unit of magnetic field 20 of the present example generates the magnetic field H that causes the magnet 10 to be in the ferromagnetic phase. Also, the generating unit of magnetic field 20 applies, to the magnet 10, the magnetic field H which is substantially perpendicular to the surface of the magnet 10 in a thin film shape. In the present example, the magnet 10 has a surface (one plane) parallel to the x-y plane, and the generating unit of magnetic field 20 generates the magnetic field H in the positive z direction as shown by the arrows in the generating unit of magnetic field 20.

In the present example, the generating unit of magnetic field 20 has a structure that causes the magnetic field applied to the stable position 16-1 and the stable position 16-2 of the magnet 10 to be the magnetic field Ha which is weaker than the magnetic field intensity H applied to other regions of the magnet 10. The generating unit of magnetic field 20 may have a structure in which the magnitude of the magnetic moment in the region opposite to the stable positions 16 is less than the magnitude of the magnetic moments in other regions. In the generating unit of magnetic field 20, the region opposite to the stable positions 16 and other regions may be formed from different materials, and the region opposite to the stable positions 16 and other regions may have different thicknesses in the z direction. Thereby, it is possible to make the magnetic field applied to the stable positions 16 less than the magnetic fields applied to other regions, and to cause the skyrmion 40 to exist stably in the stable positions 16. As one example, the generating unit of magnetic field 20 may apply the magnetic field that causes the stable positions 16 and other regions to be in the ferromagnetic phase, which will be described below. The generating unit of magnetic field 20 may be separated from the magnet 10 and may also be in contact with the magnet 10. In a case where the generating unit of magnetic field 20 is a metal, the generating unit of magnetic field 20 is preferably separated from the magnet 10.

The upstream electrode 12 is made from a non-magnetic metal connected to the magnet 10. The upstream electrode 12 is connected to the magnet 10 in its spreading direction. In the present example, the spreading direction of the magnet 10 refers to a direction parallel to the x-y plane. The upstream electrode 12 may have a thin layer shape. Also, the upstream electrode 12 may have a thickness which is the same as that of the magnet 10.

The downstream electrode 14 is made from a non-magnetic metal connected to the magnet 10 separately from the upstream electrode 12. The downstream electrode 14 is connected to the magnet 10 in its spreading direction. The upstream electrode 12 and the downstream electrode 14 are arranged such that the current to transfer a skyrmion which is in the direction almost parallel to the x-y plane is caused to flow through the magnet 10, in a case where a voltage is applied.

The upstream electrode 12 and the downstream electrode 14 are used for causing a current that transfers, generates, or erases the skyrmion 40 to flow through the magnet 10. It should be noted that at least one of the upstream electrode 12 and the downstream electrode 14 in the present example also functions as an electrode that causes a current to flow through the skyrmion sensor 15 that detects the position of the skyrmion 40.

The skyrmion sensor 12 of the present example is a tunnel magneto resistance element (TMR element). The skyrmion sensor 12 is positioned in at least one stable position. The skyrmion sensor 12 of the present example has a stacking structure of a non-magnetic thin film 151 contacting the surface of the magnet 10 positioned in the stable position 16-2 and a magnetic metal 152.

The magnetic metal 152 is caused to transition to a ferromagnetic phase having a magnetic moment in the positive z direction by the magnetic field in the positive z direction from the magnet 10. The measuring unit 34 is connected between one of the magnet 10 and the upstream electrode 12, and an end portion of the magnetic metal 152 on the opposite side of the magnet 10. Thereby, a resistance value detected by the skyrmion sensor 12 can be sensed. In the skyrmion sensor 15, a resistance value including a case where the skyrmion 40 does not exist within the stable position 16-2 of the magnet 10 shows a minimum value, and the resistance value is increased when the skyrmion 40 exists. The resistance value of the skyrmion sensor 12 is determined when probability of an electronic tunneling current of the non-magnetic thin film 151 depends on the orientation of the magnetic moment with the magnetic metal 152 caused to transition to the ferromagnetic phase and the magnet 10. A high resistance (H) and a low resistance (L) of the skyrmion sensor 12 correspond to the presence or absence of the skyrmion 40, and correspond to information "1" and "0" stored by the memory cell. The measuring unit 34 may measure the change in the resistance value of the skyrmion sensor 15, and may also measure the change in a voltage or a current according to the change in the resistance value of the skyrmion sensor 15. Thereby, information saved by the skyrmion memory 100 can be read. The skyrmion sensor 12 may be provided in the stable positions 16 which are positioned closest to the end portion of the magnet 10 out of the plurality of stable positions 16. In the present example, the skyrmion sensor 15 is provided in the stable position 16-2 only out of two stable positions 16.

The power supply 52 is connected to the upstream electrode 12 and the downstream electrode 14. The power supply 52 selects either the direction from the upstream electrode 12 to the downstream electrode 14 or the direction from the downstream electrode 14 to the upstream electrode 12, and causes the current to transfer a skyrmion to flow through the magnet 10. The transferring configuration with a direction perpendicular to a current direction is provided in which the direction in which the current is caused to flow between the upstream electrode 12 and the downstream electrode 14 is arranged substantially perpendicular to the direction in which the skyrmion is transferred. By the current to transfer a skyrmion flowing through the magnet 10, the skyrmion 40 is transferred substantially perpendicular to the direction in which the current is caused to flow between the electrodes. Specifically, the skyrmion 40 receives a force in the orientation orthogonal to the direction of the current to transfer a skyrmion and moves within the magnet 10. The stable position 16-1 and the stable position 16-2 are arrayed in the direction orthogonal to the orientation of the current to transfer a skyrmion flowing between the upstream electrode 12 and the downstream electrode 14 such that the skyrmion 40 can move between the stable position 16-1 and the stable position 16-2 easily.

As one example, when the upstream electrode 12 and the downstream electrode 14 are arranged on the positive side of the y axis and the negative side of the y axis, respectively, the stable position 16-1 and the stable position 16-2 are arranged on the negative side of the x axis and the positive side of the x axis within the magnet 10, respectively. The power supply 52 applies, to the magnet 10, a positive current to transfer a skyrmion in a direction from the upstream electrode 12 to the downstream electrode 14 in a case where the skyrmion 40 that exists in the magnet 10 is transferred from the stable position 16-1 to the stable position 16-2. In this case, the skyrmion 40 receives a force in a direction from the stable position 16-1 to the stable position 16-2. Also, the power supply 52 applies, to the magnet 10, a negative current to transfer a skyrmion in the direction from the upstream electrode 12 to the downstream electrode 14 in a case where the skyrmion 40 that exists in the magnet 10 is transferred from the stable position 16-2 to the stable position 16-1. In this case, the skyrmion 40 receives a force of the direction from the stable position 16-2 to the stable position 16-1.

The skyrmion memory 100 uses the skyrmion 40 for storage medium of information. For example, the skyrmion memory 100 makes the position of the skyrmion 40 correspond to information. In the present example, the skyrmion memory 100 makes a state where the skyrmion 40 exists in the stable position 16-2 (that is, a state where the skyrmion 40 does not exist in the stable position 16-1) correspond to information "1", and makes a state where the skyrmion 40 does not exist in the stable position 16-2 (that is, a state where the skyrmion 40 exists in the stable position 16-1) correspond to information "0". In another example, the skyrmion memory 100 may make the state where the skyrmion 40 exists in the stable position 16-1 correspond to information "1", and make the state where the skyrmion 40 does not exist in the stable position 16-1 correspond to information "0". In FIG. 3, the direction of the positive current to transfer a skyrmion is shown by the arrows (the orientation of electron current is opposite to this direction). By this positive current to transfer a skyrmion, it is possible to transfer the skyrmion 40 of the magnet 10 from the stable position 16-1 to the stable position 16-2. Also, by the negative current to transfer a skyrmion, it is possible to transfer the skyrmion 40 of the magnet 10 from the stable position 16-2 to the stable position 16-1.

In the present example, since the stable position 16-2 is provided at the end portion of the magnet 10 on the positive side of the x axis, the skyrmion which originally exists in the stable position 16-2 remains in the stable position 16-2 even if the positive current to transfer a skyrmion is caused to flow from the upstream electrode 12 to the downstream electrode 14. That is, the application of the positive current to transfer a skyrmion from the upstream electrode 12 to the downstream electrode 14 always causes the skyrmion 40 to be arranged in the stable position 16-2. Also, since the stable position 16-1 is provided at the end portion of the magnet 10 on the negative side of the x axis, the application of the negative current to transfer a skyrmion from the upstream electrode 12 to the downstream electrode 14 always causes the skyrmion 40 to be arranged in the stable position 16-1.

In view of the above-described matter, by controlling whether to cause the positive or negative current to transfer a skyrmion to flow from the upstream electrode 12 to the downstream electrode 14 corresponding to information "1" and "0", it is possible to make information "1" and "0" correspond to the presence or absence of the skyrmion 40 in the stable position 16-2. Moreover, if the skyrmion sensor 12 senses the presence or absence of the skyrmion 40 arranged in the stable position 16-2, the stored information can be read.

The skyrmion memory 100 of the present example only has to change the position of the skyrmion 40 according to information "1" and "0" to be saved, and may not generate or erase the skyrmion 40 each time the information is written. Therefore, an operation to write in the skyrmion memory 100 can be accelerated. The skyrmion 40 may be generated when the skyrmion memory 100 is shipped, and may also be generated when the skyrmion memory 100 is operated first time.

A method of initially generating the skyrmion 40 includes, for example, a method of generating the skyrmion 40 by locally weakening an external magnetic field of the stable position 16-1 with the use of a magnetic field locally generated by a coil, or the like. For example, the external magnetic field is a magnetic field that causes the stable positions 16-1 to be in a skyrmion crystal phase, which will be described below. As described above, the skyrmion 40 may be generated by using a local magnetic field from the outside when the skyrmion memory 100 is shipped. The skyrmion 40 generated once exists stably even if the magnet 10 and the stable positions 16 are caused to be in the ferromagnetic phase.

Also, there is a method of forming a position with a notch structure on the surface of the magnet 10 and generating the skyrmion 40 by a current to generate a skyrmion. For example, the magnet 10 may have a generation region where the skyrmion 40 is generated in a region closer to the negative side of the x axis than the stable position 16-1. The position with a notch structure formed with the non-magnetic material is provided at the end side of this region on the negative side of the x axis. In the vicinity of corners of this position with a notch structure, the orientation of the magnetic moment rotates in a state where the external magnetic field is not applied, which makes it easier to generate the skyrmion 40. The skyrmion 40 is generated in the vicinity of the corners of the position with a notch structure by causing the current to generate a skyrmion to flow through the generation region in the y axis direction. The current to generate a skyrmion relative to the generation region can be preferably controlled independently from the current to transfer a skyrmion between the upstream electrode 12 and the downstream electrode 14. The magnetic field to be applied to the generation region by the generating unit of magnetic field 20 may be the same as the region other than the stable positions 16 of the magnet 10.

Also, the skyrmion 40 can be generated by locally heating the magnet 10 by a laser, a metal probe, or the like. The local heating may be performed on the stable positions 16. Although the magnetic moment in the region of the magnet 10 locally heated changes so as to be in various directions transiently by thermal energy, the magnetic moment becomes stable depending on the state of the skyrmion 40.

In the present example, the skyrmion 40 exists in the stable position 16-1 or the stable position 16-2. As described above, in the skyrmion sensor 15, a resistance value including a case where the skyrmion 40 does not exist in an opposite position shows a minimum value, and the resistance value is increased when the skyrmion 40 exists. The high resistance (H) and the low resistance (L) of the skyrmion sensor 12 correspond to the presence or absence of the skyrmion 40, and correspond to information "1" and "0" stored by the memory cell.

Such an information record principle has advantages always capable of overwriting information to be stored. That is, even if the location of the skyrmion 40 exists in the stable position 16-1 or the stable position 16-2 which is not intended, new information can be written as long as the skyrmion exists in the stable position 16-1 or the stable position 16-2. It is not necessary to initialize memory of old information (for example, to restore the skyrmion to the state of the stable position 16-1) each time new information is written.

Further, if a greater current density than a current density to transfer a skyrmion is applied to the magnet 10 in the direction from the upstream electrode 12 to the downstream electrode 14, the skyrmion 40 can be erased from the magnet 10. This function can be used to reset the skyrmion memory 100 when a malfunction occurs for some reasons, including a case where the skyrmion disappears from the stable positions including both of the stable position 16-1 and the stable position 16-2. Also, this function can be used to collectively erase the skyrmion or the like in one memory track in an aspect where the plurality of skyrmion memories 100 are provided in this one memory track. Subsequently, the skyrmion 40 is generated in the stable position 16-1 of the memory track. Thereby, the initialization of the memory track can be performed in a short time.

The notable feature of the skyrmion memory 100 is that the time needed to transfer a nano-size skyrmion with a current may be approximately 1 nsec of an extremely short pulse. The above-described time is faster by one digit compared to approximately 20 nsec which is needed for data writing to DRAM (Dynamic Random Access Memory). Also, the time needed for data writing to high-speed SRAM (Static Random Access Memory) is approximately 2 nsec, which is equivalent to the above-described time. In addition, once the skyrmion 40 is generated, it exists stably in the magnet 10, and thus the skyrmion memory 100 is non-volatile. Since the above-described matter can be achieved, it is possible to achieve an ultimate non-volatile memory element capable of realizing high-speed operation.

The magnetic element 30 capable of generating the skyrmion 40 is an element formed in a thin layer shape having a thickness of 500 nm or less, for example, and can be formed using a technique of MBE (Molecular Beam Epitaxy), spattering, or the like. The upstream electrode 12 and the downstream electrode 14 are made from a conductive non-magnetic metal of Cu, W, Ti, TiN, Al, Pt, Au, or the like. The magnet 10 is a chiral magnet, and is made from FeGe, MnSi, or the like.

It should be noted that the above-described conclusion can be applied even to a dipole magnet, a frustrated magnet, or a structure obtained by stacking a magnet and a non-magnetic material, instead of a chiral magnet in which the magnet 10 exhibits helical magnetism. The dipole magnet is a magnet in which magnetic dipole-dipole interaction is important. The frustrated magnet is a magnet including a spatial structure of magnetic interaction which prefers a magnetically mismatched state. The magnet having a stacking structure of the magnetic material and the non-magnetic material is a magnet in which the magnetic moment of the magnetic material contacting the non-magnetic material is modulated by the spin trajectory interaction of the non-magnetic material.

The skyrmion memory 100 of the above-described constitution can be embodied as a magnetic element capable of transferring and erasing the skyrmion 40 in the magnet 10. Hereinafter, the method of transferring and erasing the skyrmion 40 in the skyrmion memory 100 will be described through the embodiments.

First Embodiment

In the first embodiment, simulation experiment is performed regarding the transfer of the skyrmion 40 with a current in details. Simulation experiment regarding the motion of the skyrmion in a transferring configuration with a direction perpendicular to a current direction is performed in which a current to transfer a skyrmion is caused to flow through the magnet 10 between the upstream electrode 12 and the downstream electrode 14 which are arranged in parallel to each other, and the skyrmion 40 is transferred between the stable position 16-1 and the stable position 16-2 which are arrayed in a direction perpendicular to the direction in which the current to transfer a skyrmion is caused to flow.

The motion of the skyrmion 40 can be described using the following equation. Hereinafter, the equations of [Equation 3] and [Equation 4] having adiabatic and non-adiabatic spin transfer torque are solved numerically.

$$dM_r/dt = -\gamma M_r \times B_r^{eff} + (\alpha/M) M_r \times dM_r/dt + pa^3/2eM(j(r)\cdot\nabla)M_r - (pa^3\beta/(2eM^2))[M_r\times(j(r)\cdot\nabla)M_r])$$ [Equation 3]

Also, Hamiltonian of a chiral magnet can be expressed using [Equation 4].

$$H = -J\Sigma M_r\cdot(M_{r+ex}+M_{r+ey}) - D\Sigma(M_r\times M_{r+ex}\cdot e_x + M_r\times M_{r+ey}\cdot e_y) - B\cdot\Sigma M_r$$ [Equation 4]

In the above-described [Equation 3] and [Equation 4], × indicates a cross product. Here, $Mr=M\cdot n(r)$, and $n(r)$ is a unit vector indicating the orientation of the magnetic moment of the skyrmion 40 at the position r, shown in [Equation 2]. As a result of $B_r^{eff}=-(1/(h\gamma))(\partial H/\partial M_r)$, [Equation 3] and [Equation 4] are associated with each other. $\gamma=g\mu_B/h$ (>0) is a magnetic rotation ratio. h is Planck constant. $M_r$ indicates magnetization. Also, $e_x$ and $e_y$ are unit vectors in the x direction and the y direction, respectively. $M_{r+ex}$ and $M_{r+ey}$ show magnetic moment in a different position of the unit vector in the x direction and y direction relative to $M_r$, respectively. $\xi=2eM/(pa^3)$.

Here, the Hamiltonian H shown in [Equation 4] is that of a chiral magnet. Concerning a dipole magnet, a frustrated magnet, and a magnet having a stack interface of a magnetic material and a non-magnetic material, this H expression only has to be replaced with a term that describes each magnet.

In the present embodiment, periodic boundary conditions of the x direction and the y direction are not placed, and simulation is performed using the above-described equation based on conditions that the electrode made from the non-magnetic material is arranged in parallel to the x axis, the magnetic field is applied from the back surface of the magnet 10 (surface opposite to the generating unit of magnetic field 20) to the direction of the front surface.

Figure 4:
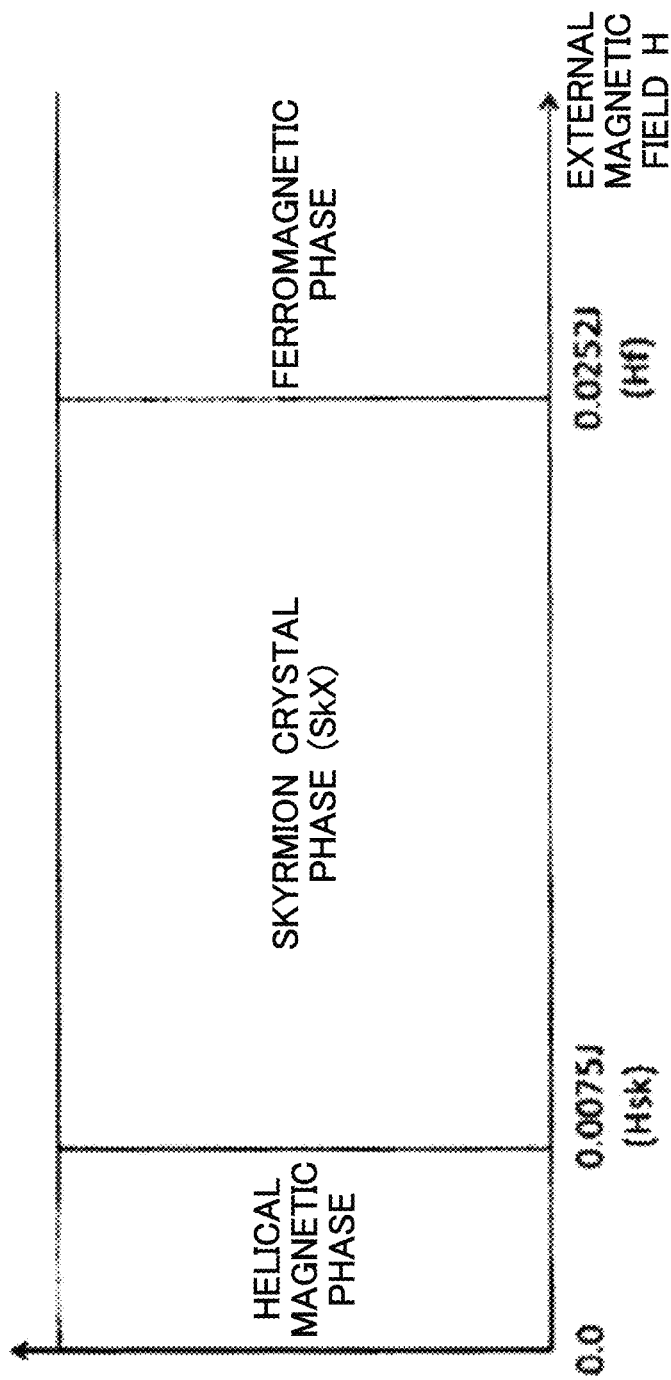
FIG. 4 is a phase diagram showing magnetic field dependency of a chiral magnet magnetic phase.

FIG. 4 is a phase diagram showing the magnetic field dependency of the chiral magnet magnetic phase. In the present embodiment, simulation experiment was performed using, as the magnet 10, the chiral magnet of Hsk and Hf shown in FIG. 4. The chiral magnet is a magnet that enters the skyrmion crystal phase (SkX) from the chiral magnetic phase due to the magnetic field intensity Hsk, and enters the ferromagnetic phase from the skyrmion crystal phase (SkX) at greater magnetic field intensity Hf. In the skyrmion crystal phase (SkX), a plurality of the skyrmions 40 are generated within the x-y plane in alignment in the close-packed structure.

Next, with J indicating the magnitude of the magnetic exchange interaction of this magnet, various physical quantities are described using values standardized by this amount. In this case, the magnet enters the skyrmion crystal phase at magnetic field intensity of Hsk=0.0075J, from the chiral phase having a magnetic structure with a helical magnetic moment at a low magnetic field. The diameter λ of the skyrmion 40 can be shown by $\lambda=2\pi\sqrt{2}\cdot J\times a/D$. Here, "a" is a lattice constant of the magnet 10, and "D" is the magnitude of the Dzyaloshinskii-Moriya interaction and is a physical constant specific to the substance. Accordingly, the skyrmion diameter λ becomes the constant specific to the substance. The skyrmion diameter λ is, for example, 70 nm and 18 nm for FeGe and MnSi, respectively, as seen in Non-Patent Document 1.

The chiral magnet, the magnetic moment, and the Gilbert damping constant used in the present embodiment are D=0.18J, M=1, and α=0.04, respectively. In the present example, D=0.18J, and thus λ=50a. In a case where the lattice constant of the magnet 10 is a=0.5 nm, the size is λ=25 nm. Further, in the chiral magnet used in the present embodiment, the magnet enters the ferromagnetic phase from the skyrmion crystal phase at the magnetic field intensity of Hf=0.0252J.

The external magnetic field of H=0.03J is applied to the magnet 10, and the magnet 10 enters the ferromagnetic state. The external magnetic field of Ha=0.029J is applied to the stable position 16-1 and the stable position 16-2. Although positions of the magnets in the stable position 16-1 and the stable position 16-2 is also in the ferromagnetic state, the magnetic field of Ha is a weakened magnetic field by 0.001J compared to H. Ha is caused to be a low magnetic field compared to H, and the stable positions 16 of the skyrmion 40 is formed in the magnet 10. Details will be described in the following simulation.

Figure 5A:
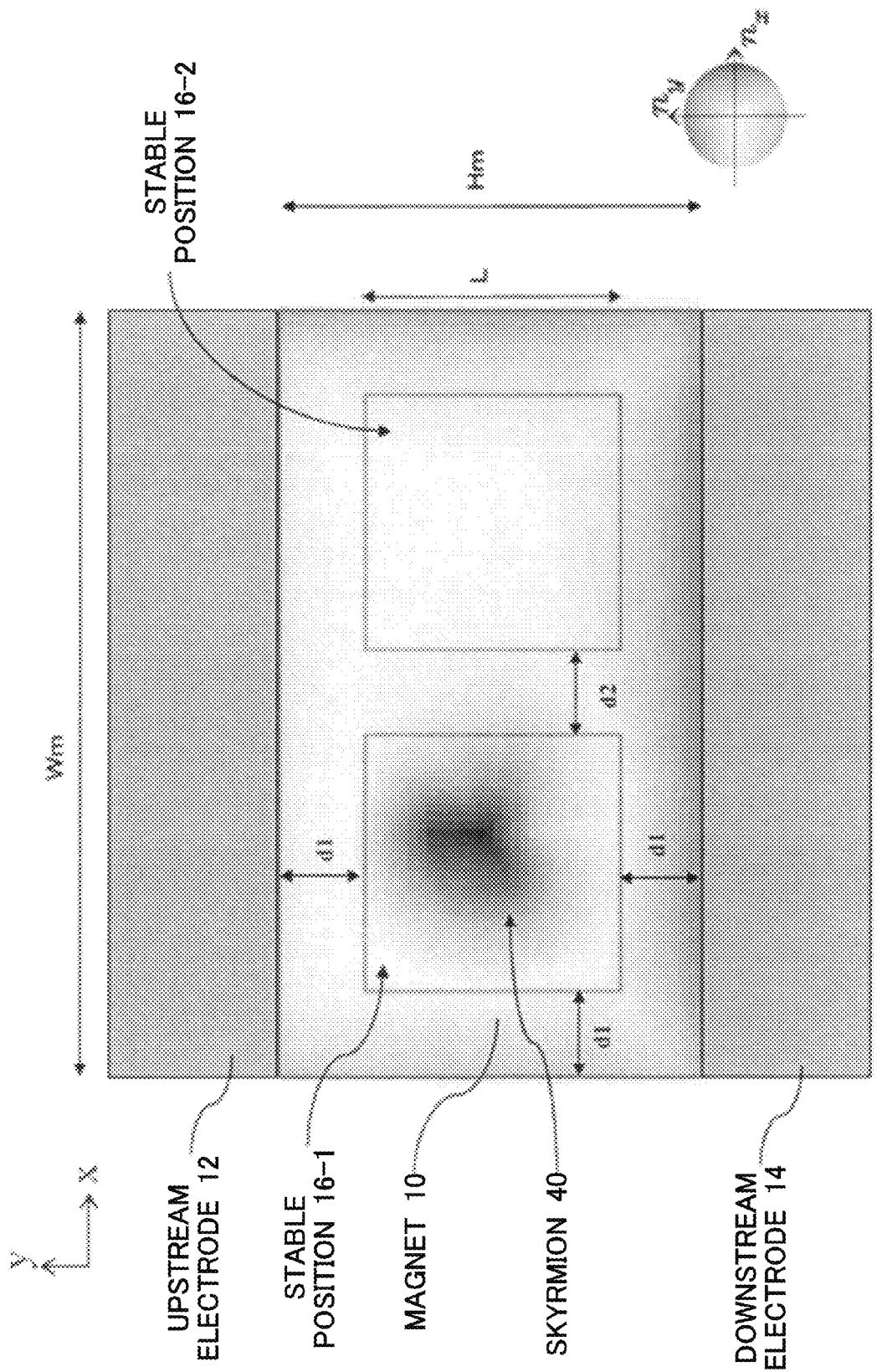
FIG. 5A shows a simulation result of a magnetic moment of the magnet 10 at t=0(1/J) in a case where a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a positive current to transfer a skyrmion of 0.001 is caused to flow from the upstream electrode 12 to the downstream electrode 14 constantly.

FIG. 5A shows a simulation result of a magnetic moment of the magnet 10 at t=0(1/J) in a case where a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a positive current to transfer a skyrmion of 0.001ξ is caused to flow from the upstream electrode 12 to the downstream electrode 14 constantly. In the present example, the skyrmion 40 exists in the stable position 16-1. The magnet 10 has a rectangular shape with the height Hm in the y direction and the width of Wm in the x direction. In the present example, with the lattice constant "a" of the magnet 10 as a unit, the size is Wm×Hm=90×50. Also, the stable position 16-1 and the stable position 16-2 have a square shape with the size of one side L=30. Also, with the distance between the stable position 16-1 and the stable position 16-2, and the end portion of the magnet 10 is taken as d1=10, and the distance between the stable position 16-1 and the stable position 16-2 as d2=10. Unless otherwise clearly indicated, the shapes of the magnet 10 and the stable positions 16 in each simulation in the present specification are the same.

Figure 5B:
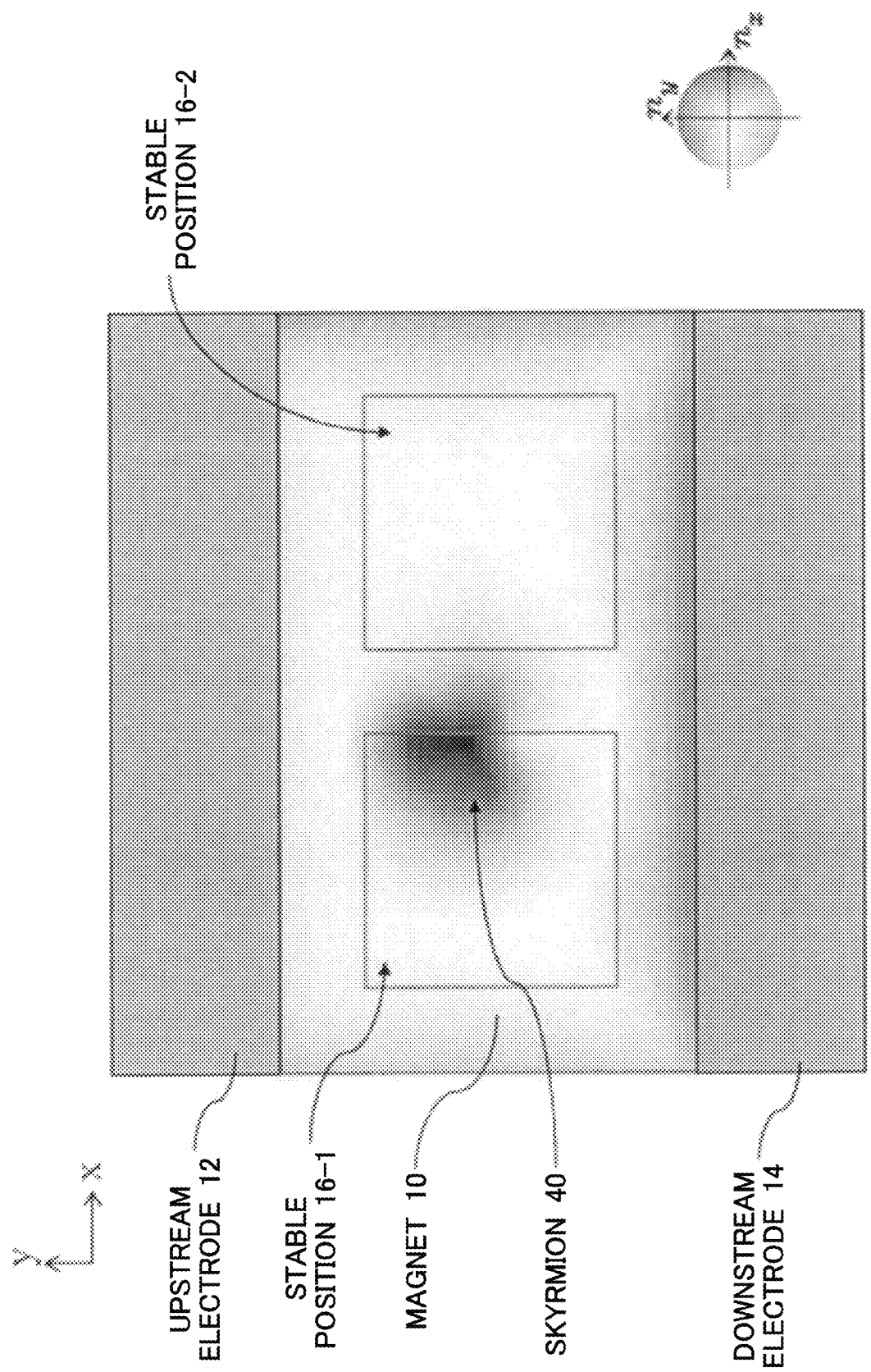
FIG. 5B shows a simulation result of a magnetic moment of the magnet 10 at t=2000(1/J) in a case where a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a positive current to transfer a skyrmion of 0.001 is caused to flow from the upstream electrode 12 to the downstream electrode 14 constantly.

FIG. 5B shows a simulation result of a magnetic moment of the magnet 10 at t=2000(1/J) in a case where a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a positive current to transfer a skyrmion of 0.001 is caused to flow from the upstream electrode 12 to the downstream electrode 14 constantly. The skyrmion 40 attempts to overcome a boundary between the stable position 16-1 and the stable position 16-2. It should be noted that the time of 3000 (1/J) in the present example corresponds to roughly 1 nsec. Also, the current density of 0.001ξ corresponds to $1.0 \times 10^6$ A/cm². It is understood that the skyrmion 40 moves near the boundary of the stable position 16-1 and the stable position 16-2. It should be noted that an electronic spin current flowing in the opposite direction of the current to transfer a skyrmion is caused to flow from the downstream electrode 14 to the upstream electrode 12.

This spin current acts in such a way as to move the skyrmion 40 in the positive direction of the x axis by Magnus force. As a result, the skyrmion 40 can overcome a potential wall which is the boundary between the stable position 16-1 and the stable position 16-2. It should be noted that although the skyrmion 40 receives a force in the direction along the spin current from the electronic spin current, this force is less than spin-transfer torque, and the skyrmion 40 does not move in this direction that much. The intensity of the external magnetic field H applied to the boundary region between the stable position 16-1 and the stable position 16-2 is greater by 0.001J only than the intensity of the external magnetic field Ha applied to the stable position 16-1 and the stable position 16-2. The external magnetic field applied in the positive direction of the z direction acts in the direction that causes the magnet 10 further enter the ferromagnetic state, and thus for the skyrmion 40, the greater magnetic field H functions as a high potential barrier.

FIG. 5C shows a simulation result of a magnetic moment of the magnet 10 at t=5000(1/J) in a case where a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a positive current to transfer a skyrmion of 0.001 is caused to flow from the upstream electrode 12 to the downstream electrode 14 constantly. The skyrmion 40 approaches the stable position 16-2.

Figure 5D:
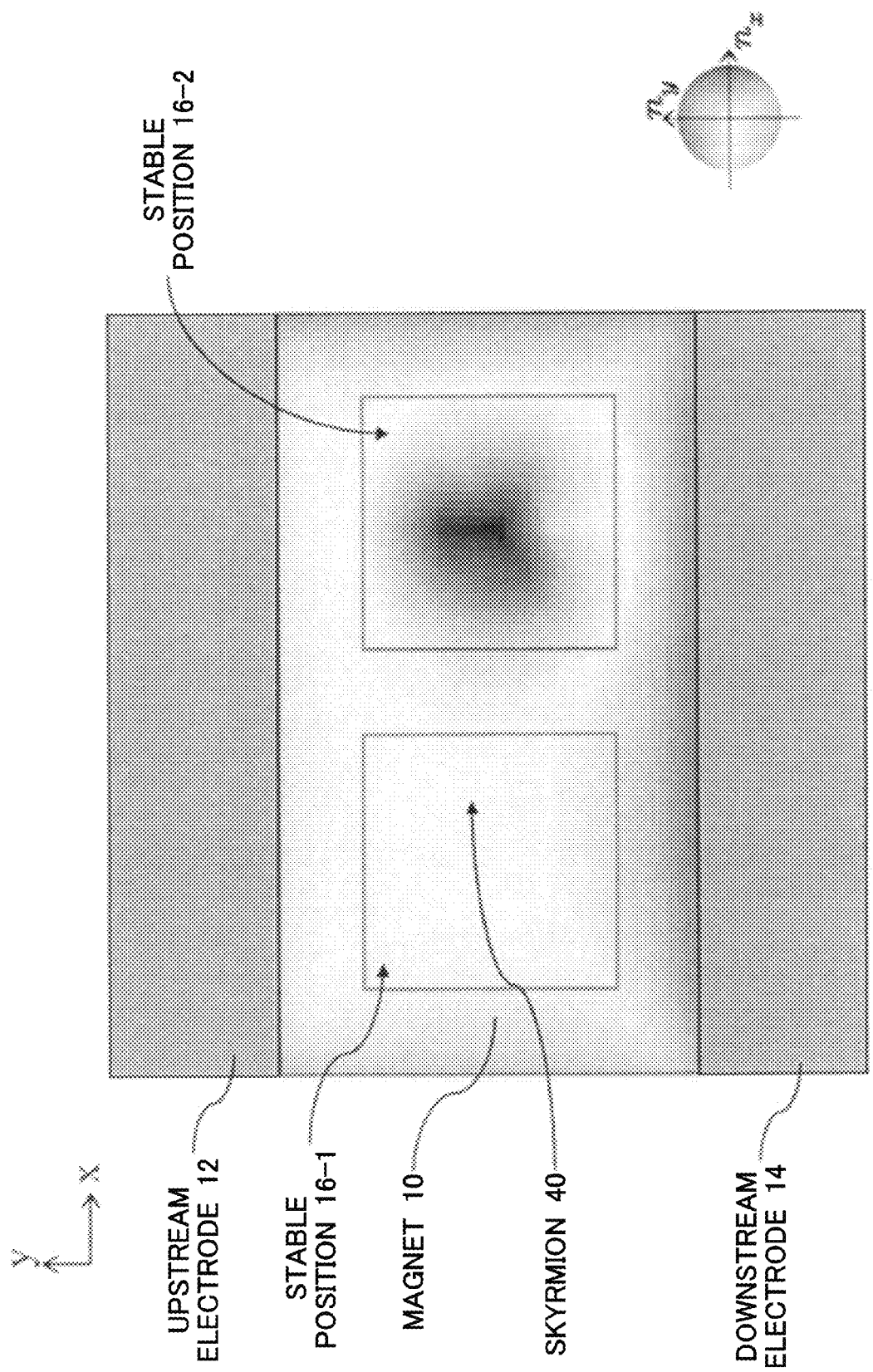
FIG. 5D shows a simulation result of a magnetic moment of the magnet 10 at t=14000(1/J) in a case where a transferring configuration with a direction perpendicular to a current direction is provided in which a direction in which a current is caused to flow between the upstream electrode 12 and the downstream electrode 14 is arranged substantially perpendicular to the direction in which the skyrmion is transferred, and a positive current to transfer a skyrmion of 0.001 is caused to flow from the upstream electrode 12 to the downstream electrode 14 constantly.

FIG. 5D shows a simulation result of a magnetic moment of the magnet 10 at t=14000(1/J) in a case where a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a positive current to transfer a skyrmion of 0.001 is caused to flow from the upstream electrode 12 to the downstream electrode 14 constantly. The skyrmion 40 moves in the positive direction of the x axis by the positive current to transfer a skyrmion, and is stabilized in the stable position 16-2.

The height Hm of the magnet 10 may be in the range of $3 \cdot \lambda > Hm \geq \lambda/2$, where λ denotes a diameter of the skyrmion to be generated in the magnet. The lower limit of Hm is a size necessary for the skyrmion 40 to exist stably. The skyrmion 40 cannot exist if Hm is less than this lower limit. Although the upper limit may be greater than 3·λ, this value is desirably as less as possible to improve the density of the memory. Also, the width Wm of the magnet 10 may be in the range of $5 \cdot \lambda > Wm \geq \lambda$. The range of Wm is determined based on Wm=2·d1+d2+2·L. The length L of one side of the stable positions 16 may be in the range of $\lambda > L \geq \lambda/2$. In a case where L is λ/2 or less, the skyrmion 40 does not remain in the stable positions 16.

Also, the distance d1 between the stable positions 16 and the magnet 10 may be in the range of $\lambda/2 > d1 \geq 0$. To improve the density, d1 is desirably as narrow as possible. d1 may be zero because there is a potential in the end portion of the magnet. Also, the distance d2 between the stable positions 16 may be in the range of $\lambda/2 > d2 \geq \lambda/10$. To improve the density, d2 is desirably as narrow as possible. However, when d2 is narrower than λ/10, there is a case where the skyrmion 40 cannot remain in one of the two stable positions 16 stably, and the skyrmion moves in the other stable position 16 unintentionally.

Second Embodiment

Figure 6A:
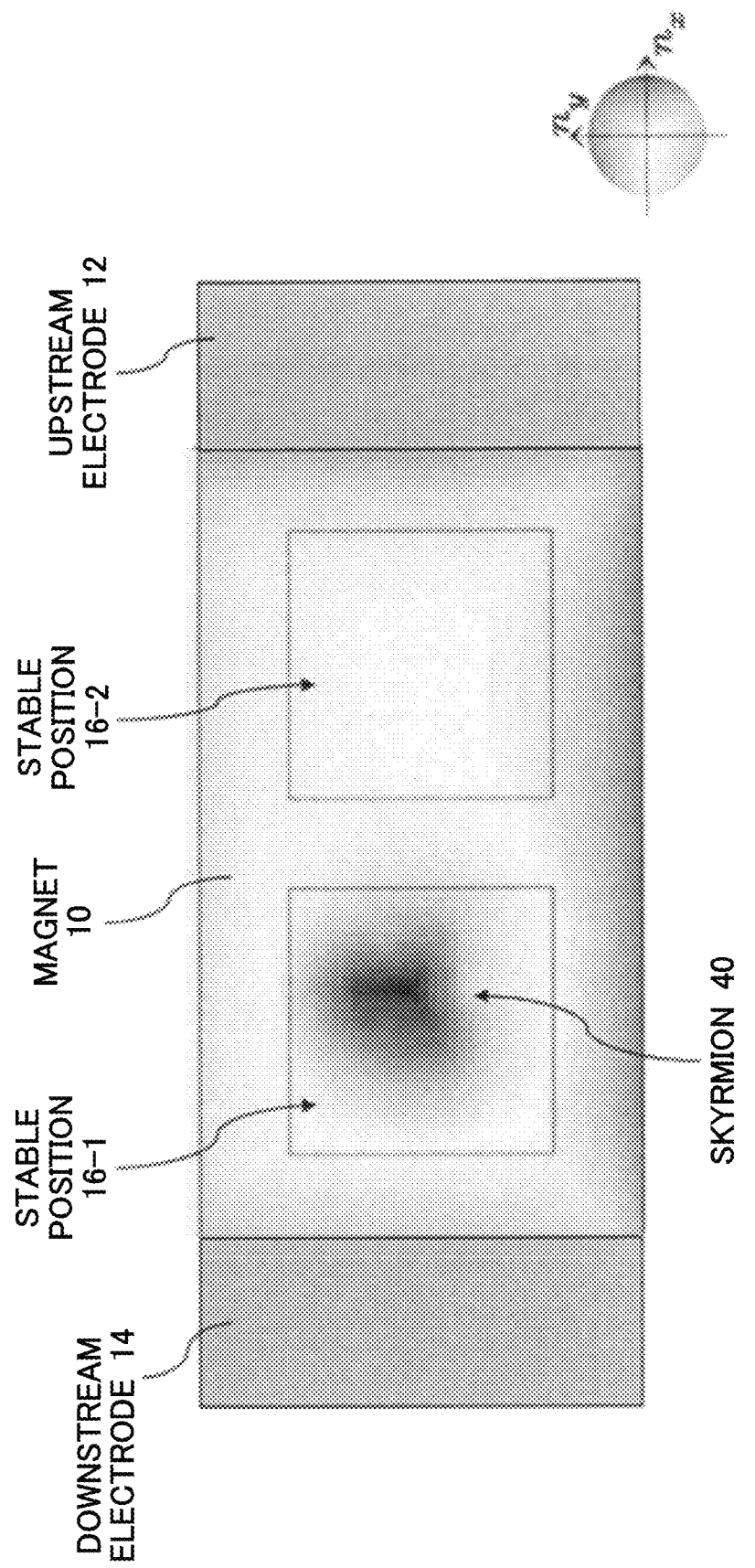
FIG. 6A shows a simulation result of a magnetic moment of the magnet 10 in a case where a configuration with a direction parallel to a current direction is provided in which a direction in which a current is caused to flow between the upstream electrode 12 and the downstream electrode 14 is arranged substantially parallel to a direction in which the skyrmion is transferred.

FIG. 6A shows a simulation result of a magnetic moment of the magnet 10 in a case where a configuration with a direction parallel to a current direction is provided in which a direction in which a current is caused to flow between the upstream electrode 12 and the downstream electrode 14 is arranged substantially parallel to a direction in which the skyrmion is transferred. As shown in FIG. 6A, the upstream electrode 12 and the downstream electrode 14 are arrayed in the x axis direction. That is, the orientation of the current flowing from the upstream electrode 12 to the downstream electrode 14 and the array direction of the stable position 16-1 and the stable position 16-2 are the same. It should be noted that the size of the magnet 10 and the size of the stable positions 16 are the same as those of the first embodiment. This electrode position is called a configuration with a direction parallel to a current direction. FIG. 6A shows a simulation result of a magnetic moment of the magnet 10 at t=0(1/J). The skyrmion 40 exists in the stable position 16-1.

Figure 6B:
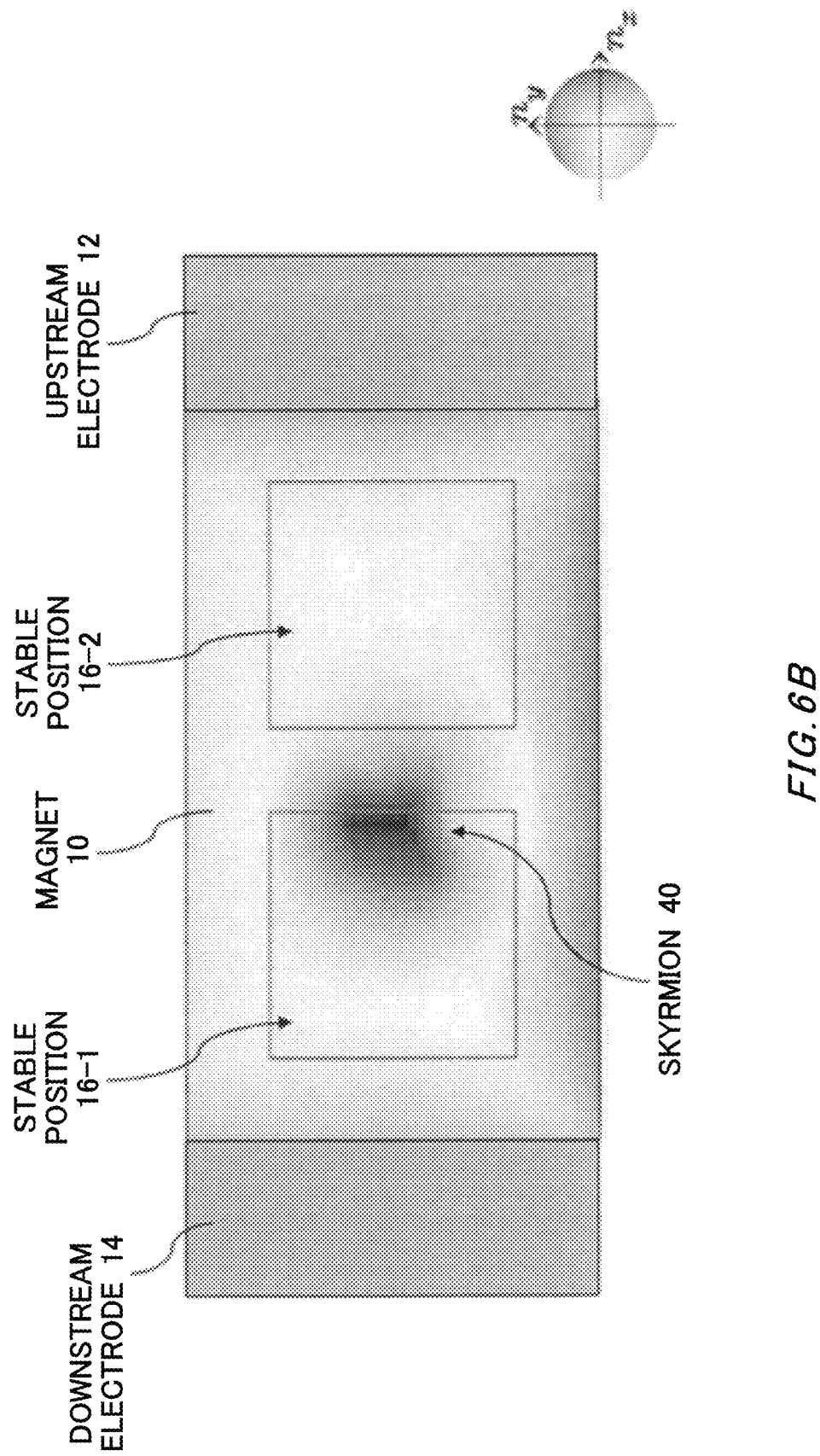
FIG. 6B shows a simulation result of a magnetic moment of the magnet 10 at t=3700(1/J) in a case where a configuration with a direction parallel to a current direction is provided in which a direction in which a current is caused to flow between the upstream electrode 12 and the downstream electrode 14 is arranged substantially parallel to a direction in which the skyrmion is transferred, and a positive current density to transfer a skyrmion of 0.001 is caused to flow from the upstream electrode 12 to the downstream electrode 14 constantly.

FIG. 6B shows a simulation result of a magnetic moment of the magnet 10 at t=3700(1/J) in a case where a configuration with a direction parallel to a current direction is provided in which a direction in which a current is caused to flow between the upstream electrode 12 and the downstream electrode 14 is arranged substantially parallel to a direction in which the skyrmion is transferred, and a positive current density to transfer a skyrmion of 0.001ξ is caused to flow from the upstream electrode 12 to the downstream electrode 14 constantly. The skyrmion 40 receives a force in the direction along the direction of the electron current, and approaches the boundary between the stable position 16-1 and the stable position 16-2. However, the skyrmion 40 cannot overcome the potential barrier in the boundary between the stable position 16-1 and the stable position 16-2.

Figure 6C:
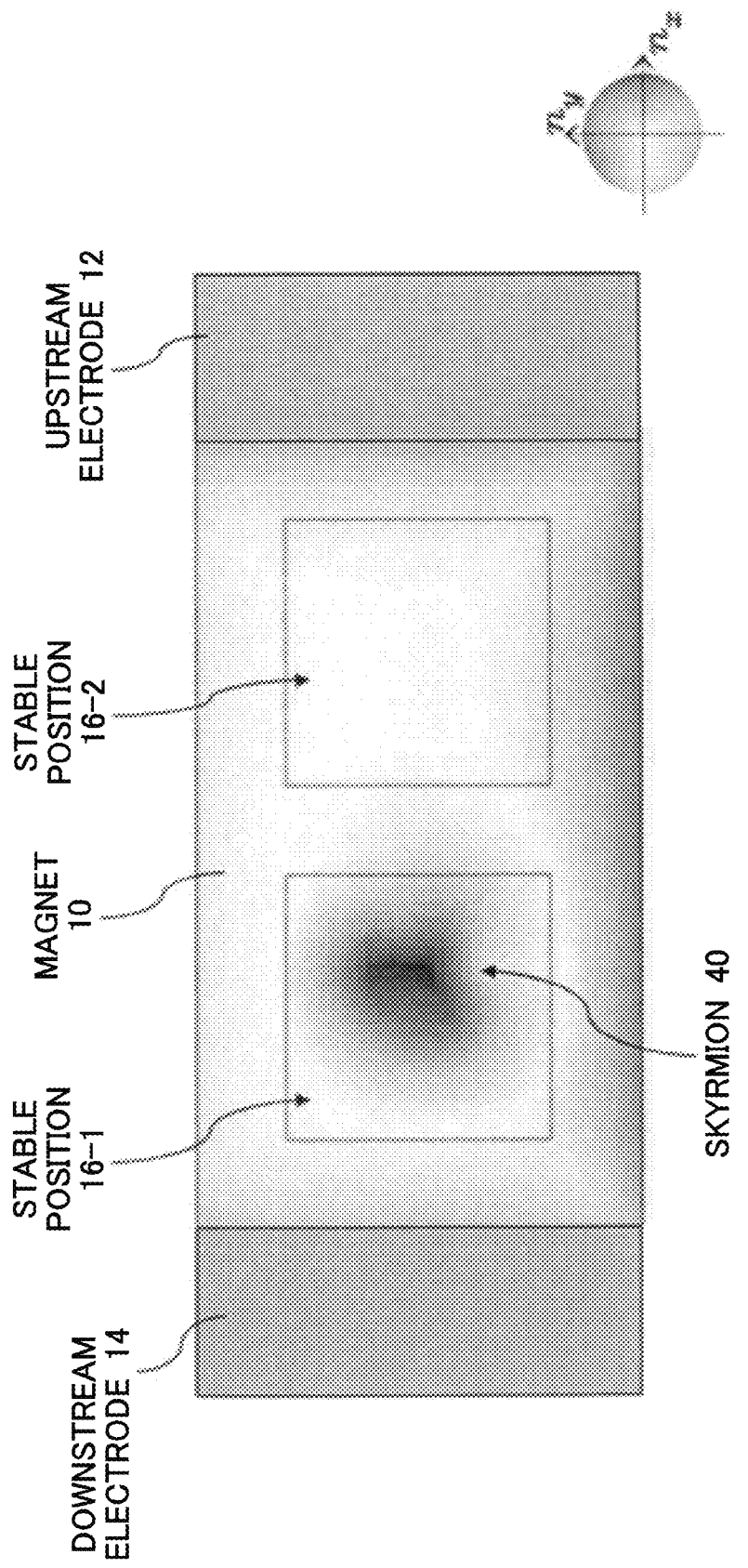
FIG. 6C shows a simulation result of a magnetic moment of the magnet 10 at t=7000(1/J) in a case where a configuration with a direction parallel to a current direction is provided in which a direction in which a current is caused to flow between the upstream electrode 12 and the downstream electrode 14 is arranged substantially parallel to a direction in which the skyrmion is transferred, and a positive current density to transfer a skyrmion of 0.001 is caused to flow from the upstream electrode 12 to the downstream electrode 14 constantly.

FIG. 6C shows a simulation result of a magnetic moment of the magnet 10 at t=7000(1/J) in a case where a configuration with a direction parallel to a current direction is provided in which a direction in which a current is caused to flow between the upstream electrode 12 and the downstream electrode 14 is arranged substantially parallel to a direction in which the skyrmion is transferred, and a positive current density to transfer a skyrmion of 0.001ξ is caused to flow from the upstream electrode 12 to the downstream electrode 14 constantly. The skyrmion 40 is bounced back by the potential barrier between the stable position 16-1 and the stable position 16-2, and returns to the stable position 16-1. As a result, in the magnitude of the current density of 0.001ξ which is the same magnitude as the transferring configuration with a direction perpendicular to a current direction in the first embodiment, the skyrmion 40 cannot overcome the boundary between the stable positions 16, and the skyrmion 40 cannot be transferred from the stable position 16-1 to the stable position 16-2.

Figure 7A:
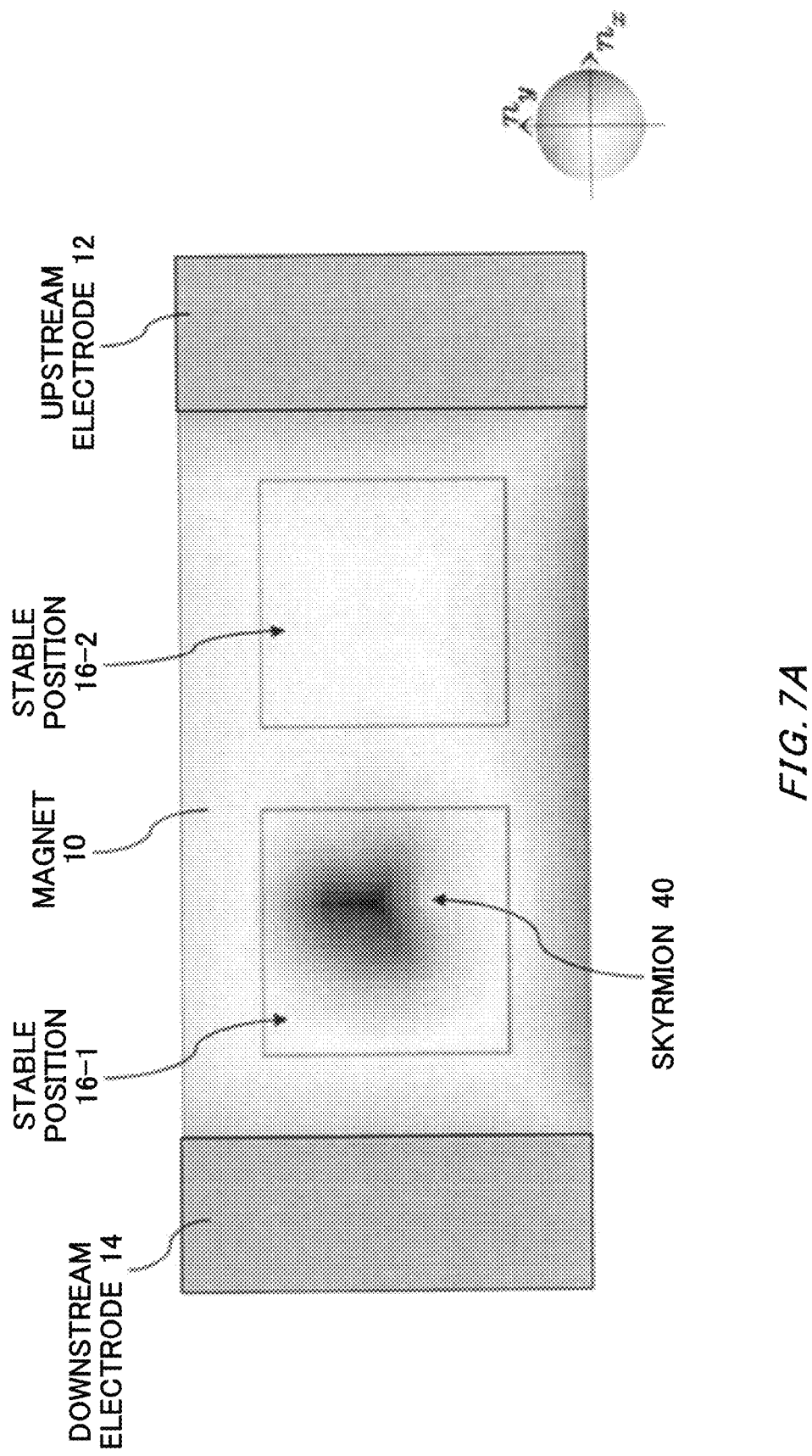
FIG. 7A shows a simulation result of a magnetic moment of the magnet 10 at t=0(1/J) when a configuration with a direction parallel to a current direction is provided in which a direction in which a current is caused to flow between the upstream electrode 12 and the downstream electrode 14 is arranged substantially parallel to a direction in which the skyrmion is transferred, and a current pulse to generate a skyrmion is caused to flow through the magnet 10 from the upstream electrode 12 to the downstream electrode 14.

Next, the positive current density to transfer a skyrmion applied to the magnet 10 in the configuration with a direction parallel to a current direction is increased to 0.01ξ. FIG. 7A shows a simulation result of a magnetic moment of the magnet 10 at t=0(1/J) when a current pulse to generate a skyrmion is caused to flow through the magnet 10 from the upstream electrode 12 to the downstream electrode 14. In an initial state shown in FIG. 7A, the skyrmion 40 is arranged in the stable position 16-1.

Figure 7B:
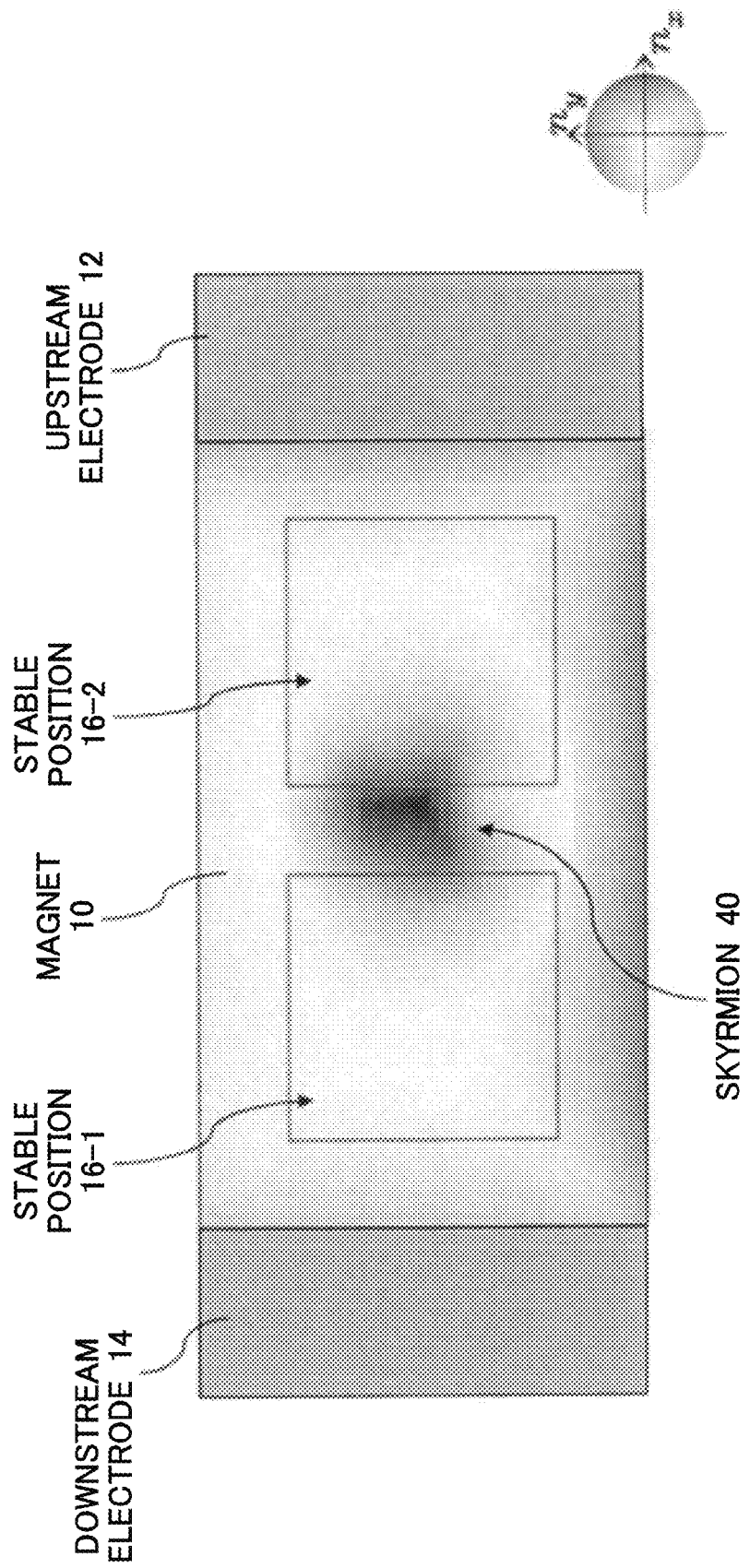
FIG. 7B shows a simulation result of a magnetic moment of the magnet 10 at t=1800(1/J) in a case where a configuration with a direction parallel to a current direction is provided in which a direction in which a current is caused to flow between the upstream electrode 12 and the downstream electrode 14 is arranged substantially parallel to a direction in which the skyrmion is transferred, and a positive current density to transfer a skyrmion of 0.01 is caused to flow from the upstream electrode 12 to the downstream electrode 14 constantly.

FIG. 7B shows a simulation result of a magnetic moment of the magnet 10 at t=1800(1/J) when a configuration with a direction parallel to a current direction is provided in which a direction in which a current is caused to flow between the upstream electrode 12 and the downstream electrode 14 is arranged substantially parallel to a direction in which the skyrmion is transferred, and a positive current density to transfer a skyrmion of 0.01ξ is caused to flow from the upstream electrode 12 to the downstream electrode 14 constantly. The skyrmion 40 overcomes the boundary between the stable position 16-1 and the stable position 16-2.

Figure 7C:
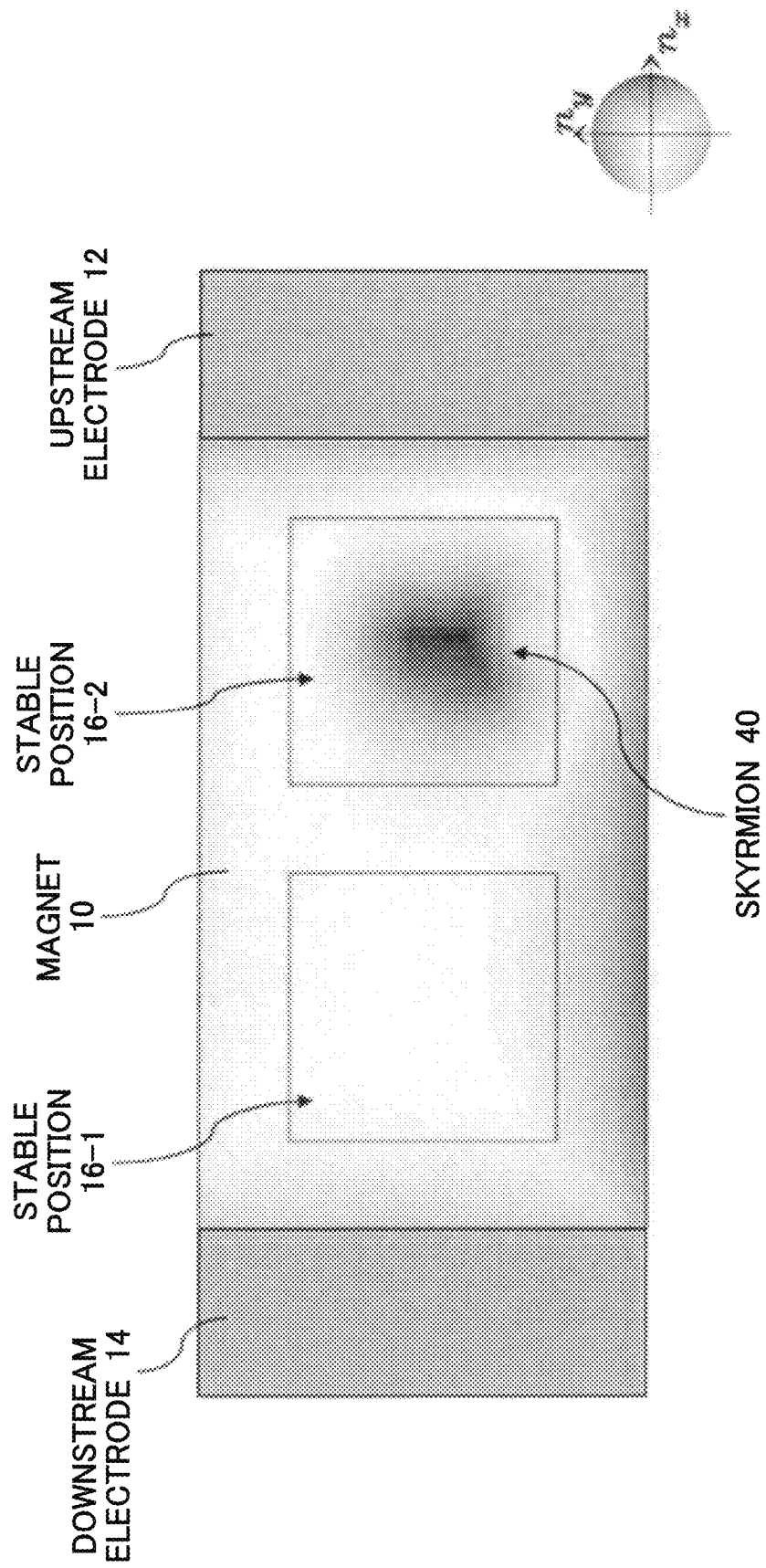
FIG. 7C shows a simulation result of a magnetic moment of the magnet 10 at t=4000(1/J) in a case where a configuration with a direction parallel to a current direction is provided in which a direction in which a current is caused to flow between the upstream electrode 12 and the downstream electrode 14 is arranged substantially parallel to a direction in which the skyrmion is transferred, and a positive current density to transfer a skyrmion of 0.01 is caused to flow from the upstream electrode 12 to the downstream electrode 14 constantly.

FIG. 7C shows a simulation result of a magnetic moment of the magnet 10 at t=4000(1/J) when a configuration with a direction parallel to a current direction is provided in which a direction in which a current is caused to flow between the upstream electrode 12 and the downstream electrode 14 is arranged substantially parallel to a direction in which the skyrmion is transferred, and a positive current density to transfer a skyrmion of 0.01ξ is caused to flow from the upstream electrode 12 to the downstream electrode 14 constantly. The skyrmion 40 moves in the stable position 16-2.

Figure 7D:
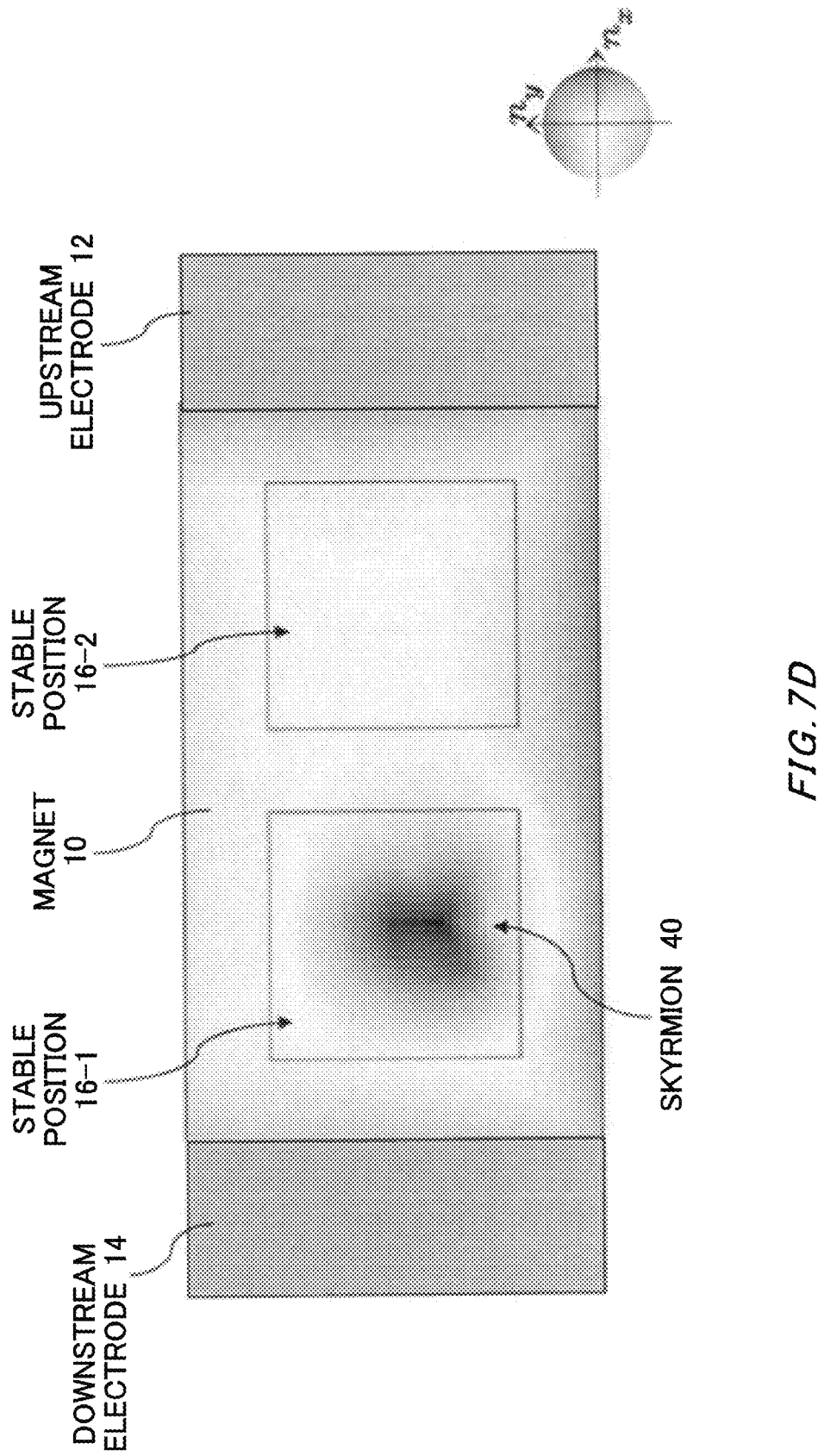
FIG. 7D shows a simulation result of a magnetic moment of the magnet 10 at t=11000(1/J) in a case where a configuration with a direction parallel to a current direction is provided in which a direction in which a current is caused to flow between the upstream electrode 12 and the downstream electrode 14 is arranged substantially parallel to a direction in which the skyrmion is transferred, and a positive current density to transfer a skyrmion of 0.01 is caused to flow from the upstream electrode 12 to the downstream electrode 14 constantly.

FIG. 7D shows a simulation result of a magnetic moment of the magnet 10 at t=11000(1/J) when a configuration with a direction parallel to a current direction is provided in which a direction in which a current is caused to flow between the upstream electrode 12 and the downstream electrode 14 is arranged substantially parallel to a direction in which the skyrmion is transferred, and a positive current density to transfer a skyrmion of 0.01ξ is caused to flow from the upstream electrode 12 to the downstream electrode 14 constantly. The skyrmion 40 once entering the stable position 16-2 bounces at the end portion in the positive direction of the x axis of the magnet 10. The skyrmion 40 is pushed back in the negative direction of the x axis by inertia, and returns to the stable position 16-1.

As shown in the second embodiment given above, in the configuration with a direction parallel to a current direction, the skyrmion cannot overcome the boundary between the stable position 16-1 and the stable position 16-2 when the current density is not greater than the transferring configuration with a direction perpendicular to a current direction. Also, if the current density is increased too much, the skyrmion which overcomes the boundary passes through the stable position 16-2, and returns to the stable position 16-1 again. Accordingly, in a case of the configuration with a direction parallel to a current direction, it is more difficult to transfer the skyrmion 40 stably between two stable positions 16 compared to the transferring configuration with a direction perpendicular to a current direction.

Third Embodiment

Figure 8:
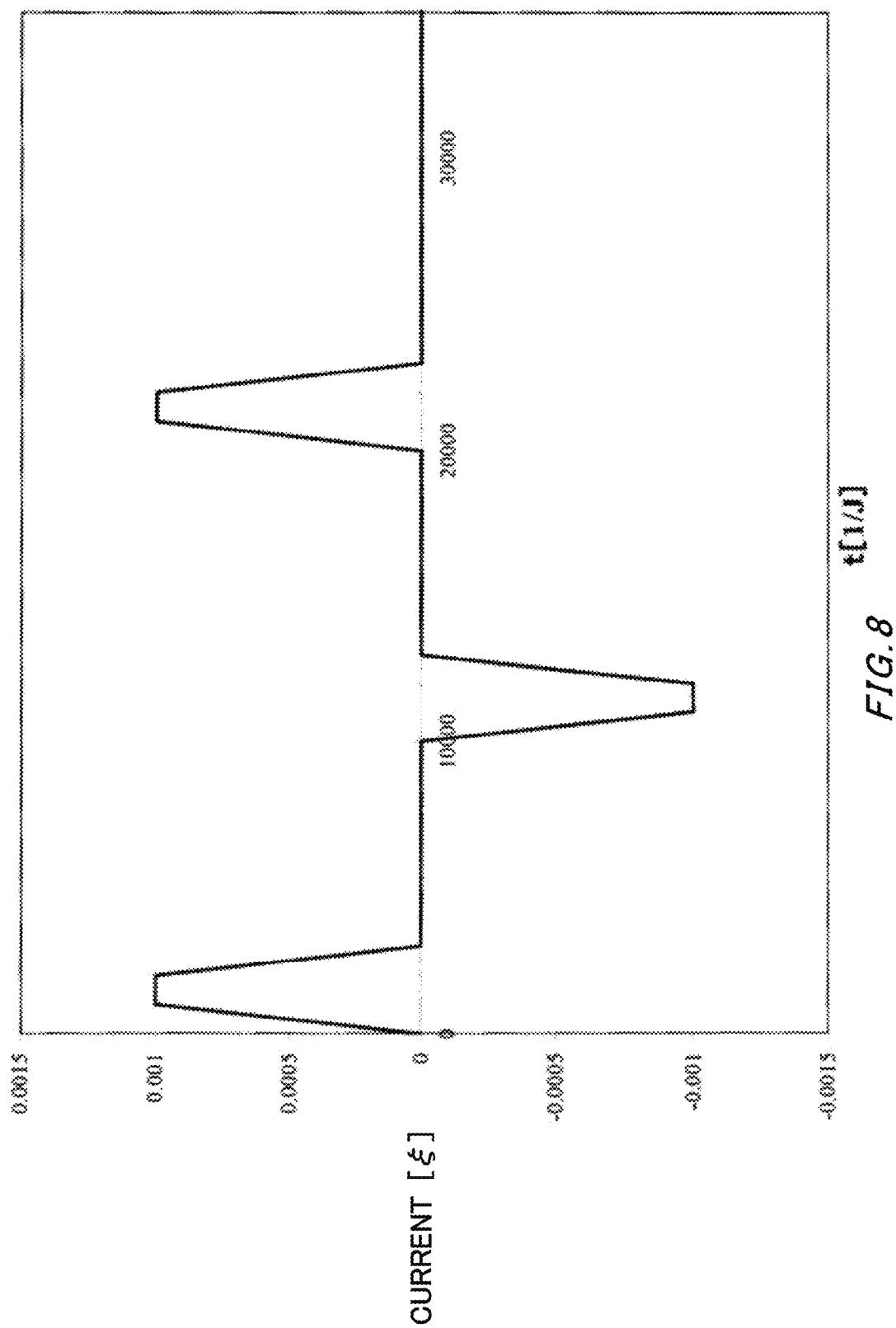
FIG. 8 shows a current pulse to transfer a skyrmion in which a transferring configuration with a direction perpendicular to a current direction is provided in which a direction in which a current is caused to flow between the upstream electrode 12 and the downstream electrode 14 is arranged substantially perpendicular to the direction in which the skyrmion is transferred, and which is caused to flow from the upstream electrode 12 to the downstream electrode 14.

Simulation experiment is performed for a case where a pulse current is used as a current to transfer a skyrmion in the transferring configuration with a direction perpendicular to a current direction. FIG. 8 shows a current pulse to transfer a skyrmion caused to flow from the upstream electrode 12 to the downstream electrode 14. First, a first positive current pulse to transfer a skyrmion is applied, and the skyrmion 40 is transferred from the stable position 16-1 to the stable position 16-2. Next, a second negative current pulse to transfer a skyrmion is applied, and the skyrmion 40 is transferred from the stable position 16-2 to the stable position 16-1. Next, a third positive current pulse to transfer a skyrmion is applied, and the skyrmion 40 is transferred from the stable position 16-2 to the stable position 16-1.

As one example of the first current pulse to transfer a skyrmion, first, from t=0(1/J) to t=1000(1/J), the current density applied to the magnet 10 is changed from 0ξ to +0.001ξ. Between t=1000(1/J) and t=2000(1/J), the current density applied to the magnet 10 is maintained at +0.001ξ. From t=2000(1/J) to t=3000(1/J), the current density applied to the magnet 10 is changed from +0.001ξ to 0.

As one example of the second current pulse to transfer a skyrmion, first, from t=10000(1/J) to t=11000(1/J), the current density applied to the magnet 10 is changed from 0ξ to −0.001ξ. Between t=11000(1/J) and t=12000(1/J), the current density applied to the magnet 10 is maintained at −0.001ξ. From t=12000(1/J) to t=13000(1/J), the current density applied to the magnet 10 is changed from −0.001ξ to 0.

As one example of the third current pulse to transfer a skyrmion, first, from t=20000(1/J) to t=21000(1/J), the current density applied to the magnet 10 is changed from 0ξ to +0.001ξ. Between t=21000(1/J) and t=22000(1/J), the current density applied to the magnet 10 is maintained at +0.001ξ. From t=22000(1/J) to t=23000(1/J), the current density applied to the magnet 10 is changed from +0.001ξ to 0.

Figure 9A:
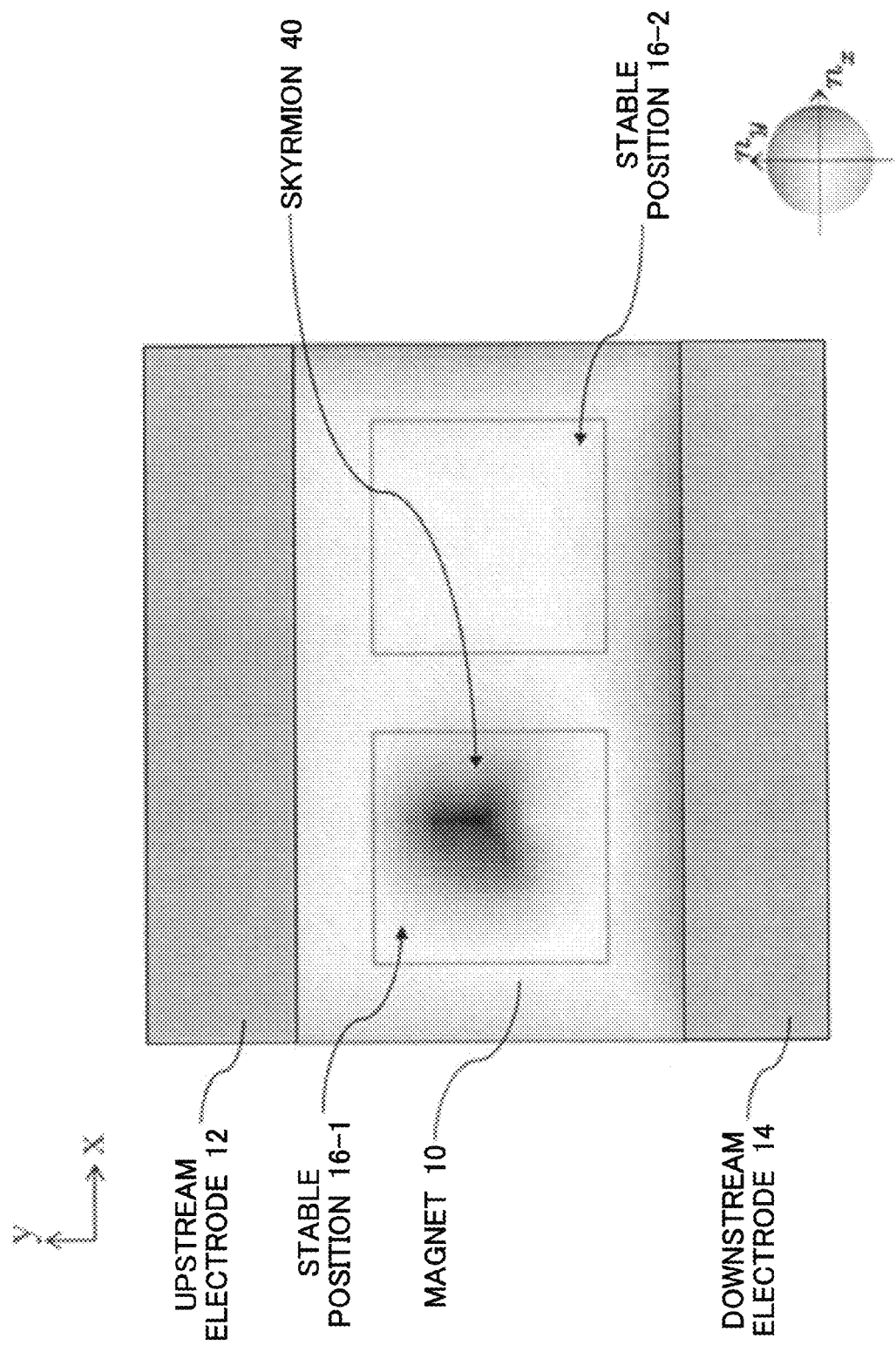
FIG. 9A shows a simulation result of a magnetic moment of the magnet 10 at t=0(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a first positive current pulse to transfer a skyrmion is caused to flow through the magnet 10 from the upstream electrode 12 to the downstream electrode 14.

FIG. 9A shows a simulation result of a magnetic moment of the magnet 10 at t=0(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a first positive current pulse to transfer a skyrmion is caused to flow through the magnet 10 from the upstream electrode 12 to the downstream electrode 14. The skyrmion 40 is in an initial state where it exists in the stable position 16-1.

Figure 9B:
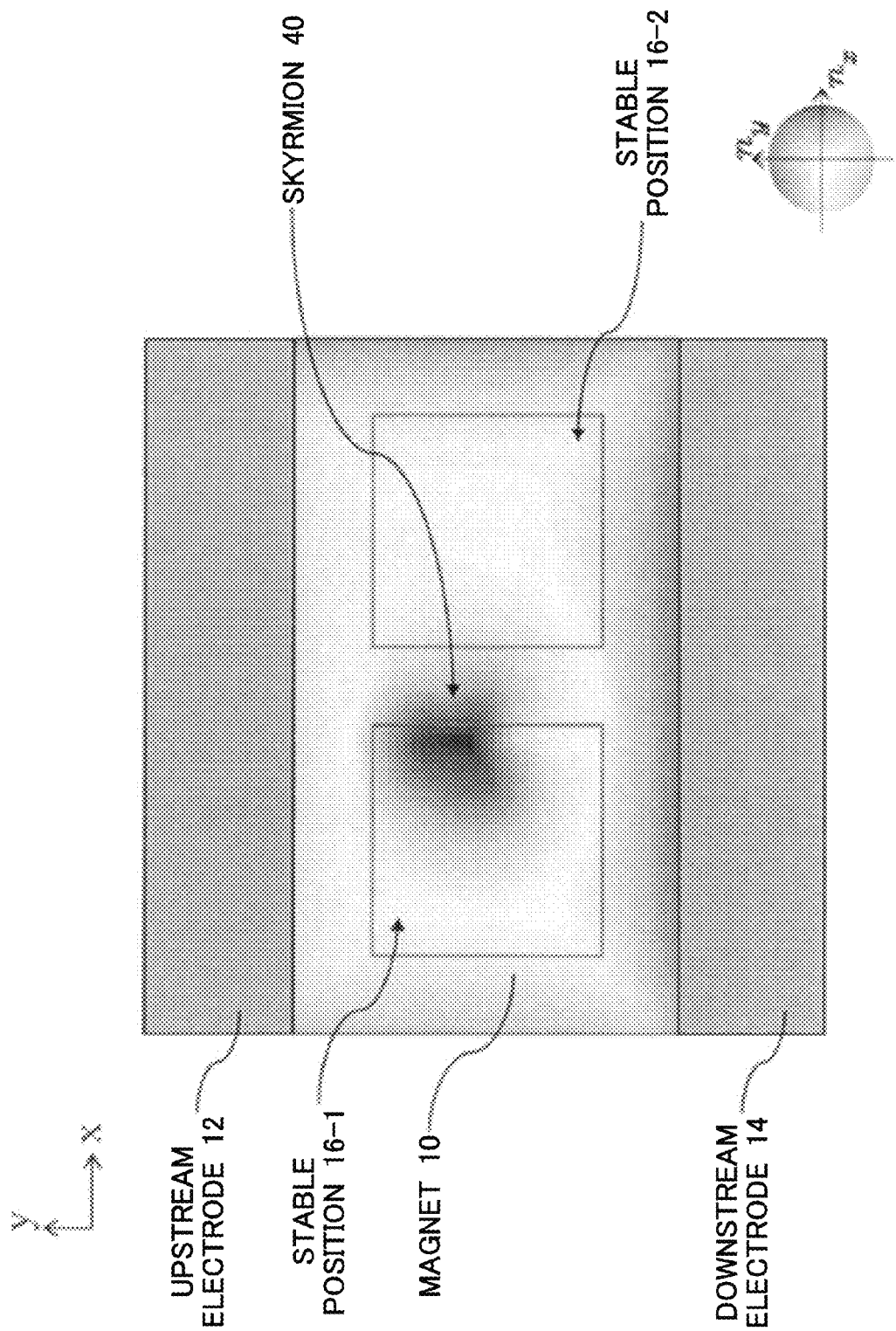
FIG. 9B shows a simulation result of a magnetic moment of the magnet 10 at t=2000(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a first positive current pulse to transfer a skyrmion is caused to flow through the magnet 10 from the upstream electrode 12 to the downstream electrode 14.

FIG. 9B shows a simulation result of a magnetic moment of the magnet 10 at t=2000(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a first positive current pulse to transfer a skyrmion is caused to flow through the magnet 10 from the upstream electrode 12 to the downstream electrode 14. The skyrmion 40 moves toward the boundary between the stable position 16-1 and the stable position 16-2.

Figure 9C:
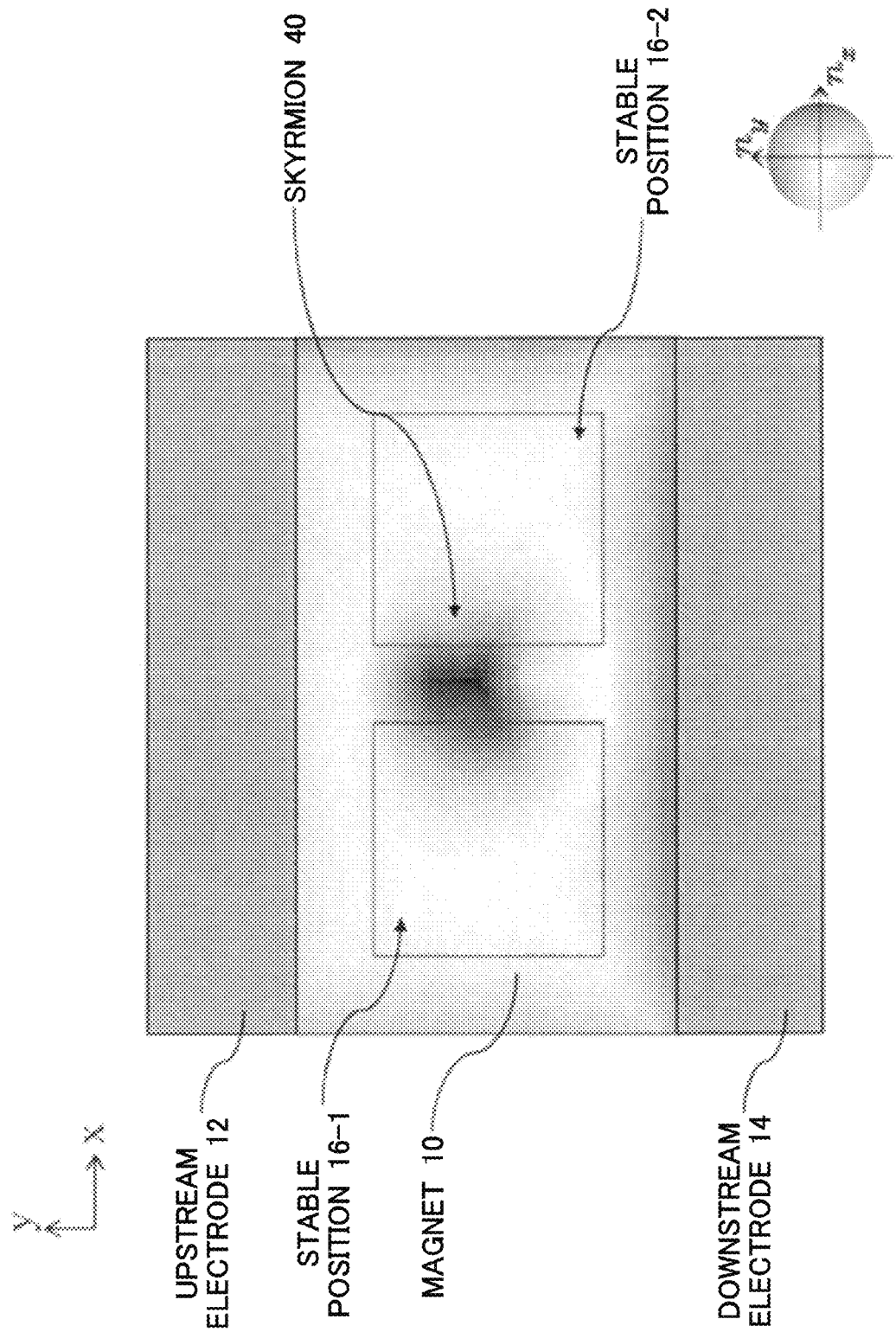
FIG. 9C shows a simulation result of a magnetic moment of the magnet 10 at t=4000(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a first positive current pulse to transfer a skyrmion is caused to flow through the magnet 10 from the upstream electrode 12 to the downstream electrode 14.

FIG. 9C shows a simulation result of a magnetic moment of the magnet 10 at t=4000(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a first positive current pulse to transfer a skyrmion is caused to flow through the magnet 10 from the upstream electrode 12 to the downstream electrode 14. Although the first current pulse to transfer a skyrmion is in the OFF state, the skyrmion 40 passes across the boundary between the stable position 16-1 and the stable position 16-2 by inertia.

Figure 9D:
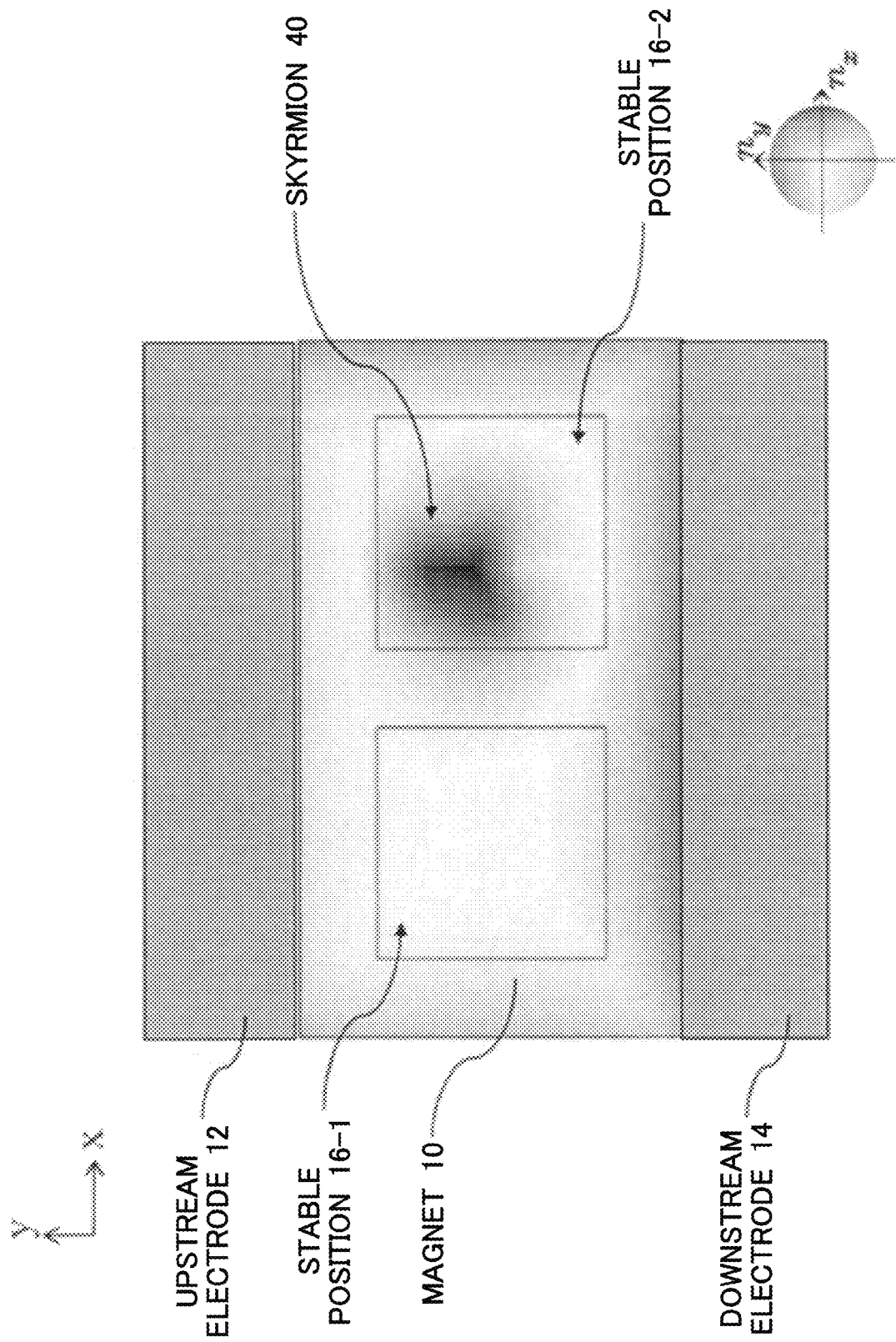
FIG. 9D shows a simulation result of a magnetic moment of the magnet 10 at t=7000(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a first positive current pulse to transfer a skyrmion is caused to flow through the magnet 10 from the upstream electrode 12 to the downstream electrode 14.

FIG. 9D shows a simulation result of a magnetic moment of the magnet 10 at t=7000(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a first positive current pulse to transfer a skyrmion is caused to flow through the magnet 10 from the upstream electrode 12 to the downstream electrode 14. The skyrmion 40 is stable in the stable position 16-2. In this manner, it is possible to transfer the skyrmion 40 from the stable position 16-1 to the stable position 16-2 by the first positive current pulse to transfer a skyrmion.

Figure 9E:
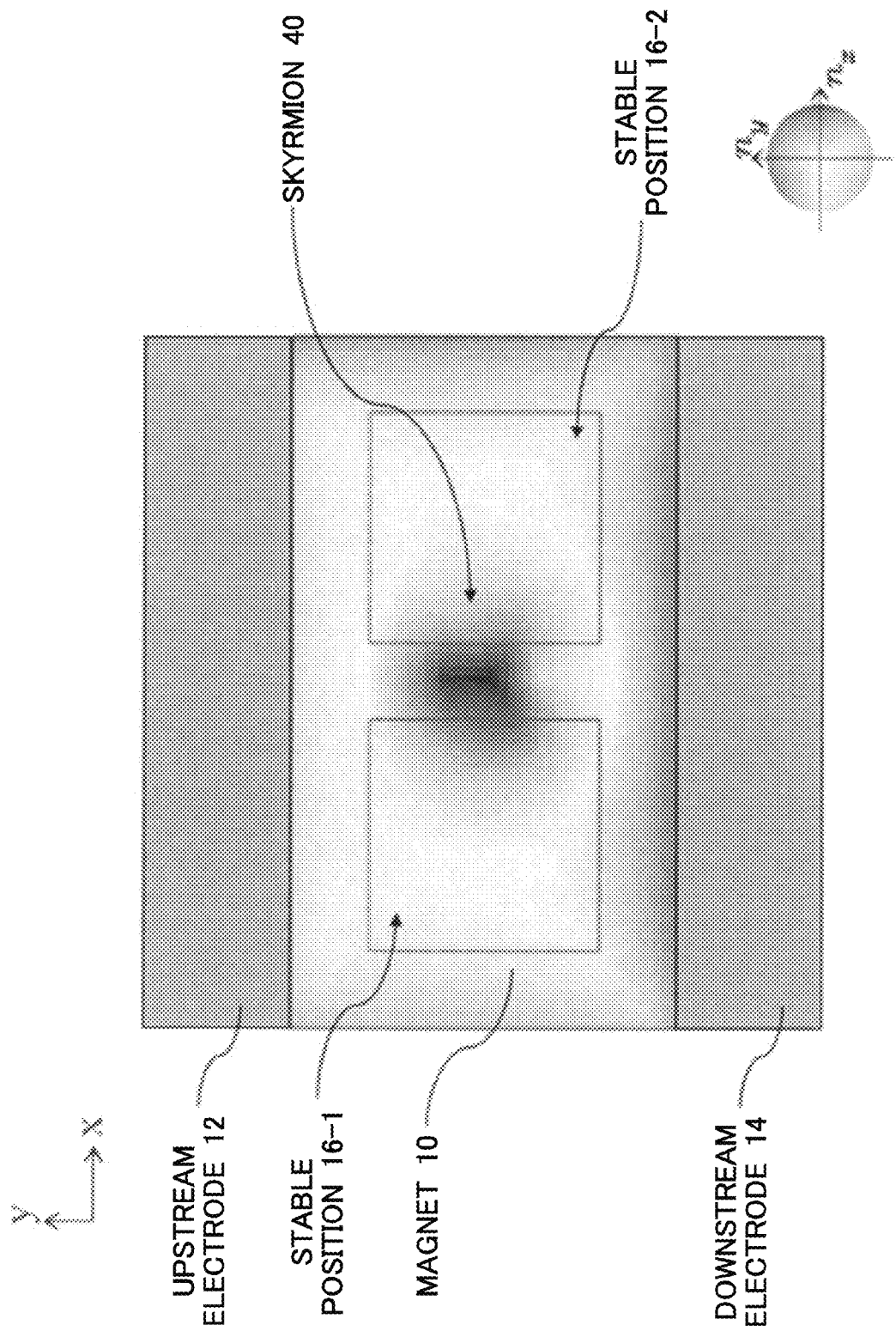
FIG. 9E shows a simulation result of a magnetic moment of the magnet 10 at t=13000(1/J) when a transferring configuration with a direction perpendicular to a current direction is provided in which a direction in which current is caused to flow between the upstream electrode 12 and the downstream electrode 14 is arranged substantially perpendicular to a direction in which the skyrmion is transferred, and a second negative current pulse to transfer a skyrmion is caused to flow through the magnet 10 from the upstream electrode 12 to the downstream electrode 14.

FIG. 9E shows a simulation result of a magnetic moment of the magnet 10 at t=13000(1/J) when a transferring configuration with a direction perpendicular to a current direction is provided in which a direction in which current is caused to flow between the upstream electrode 12 and the downstream electrode 14 is arranged substantially perpendicular to a direction in which the skyrmion is transferred, and a second negative current pulse to transfer a skyrmion is caused to flow through the magnet 10 from the upstream electrode 12 to the downstream electrode 14. In a case where the negative current pulse, that is, the current from the downstream electrode 14 to the upstream electrode 12 is applied to the magnet 10, spin-transfer torque in the negative direction of the x axis (that is, the direction from the stable position 16-2 to the stable position 16-1) acts on the skyrmion 40. The skyrmion 40 moves out of the stable position 16-2, and moves in the boundary direction between the stable position 16-2 and the stable position 16-1. The skyrmion 40 passes across the boundary between the stable position 16-2 and the stable position 16-1.

Figure 9F:
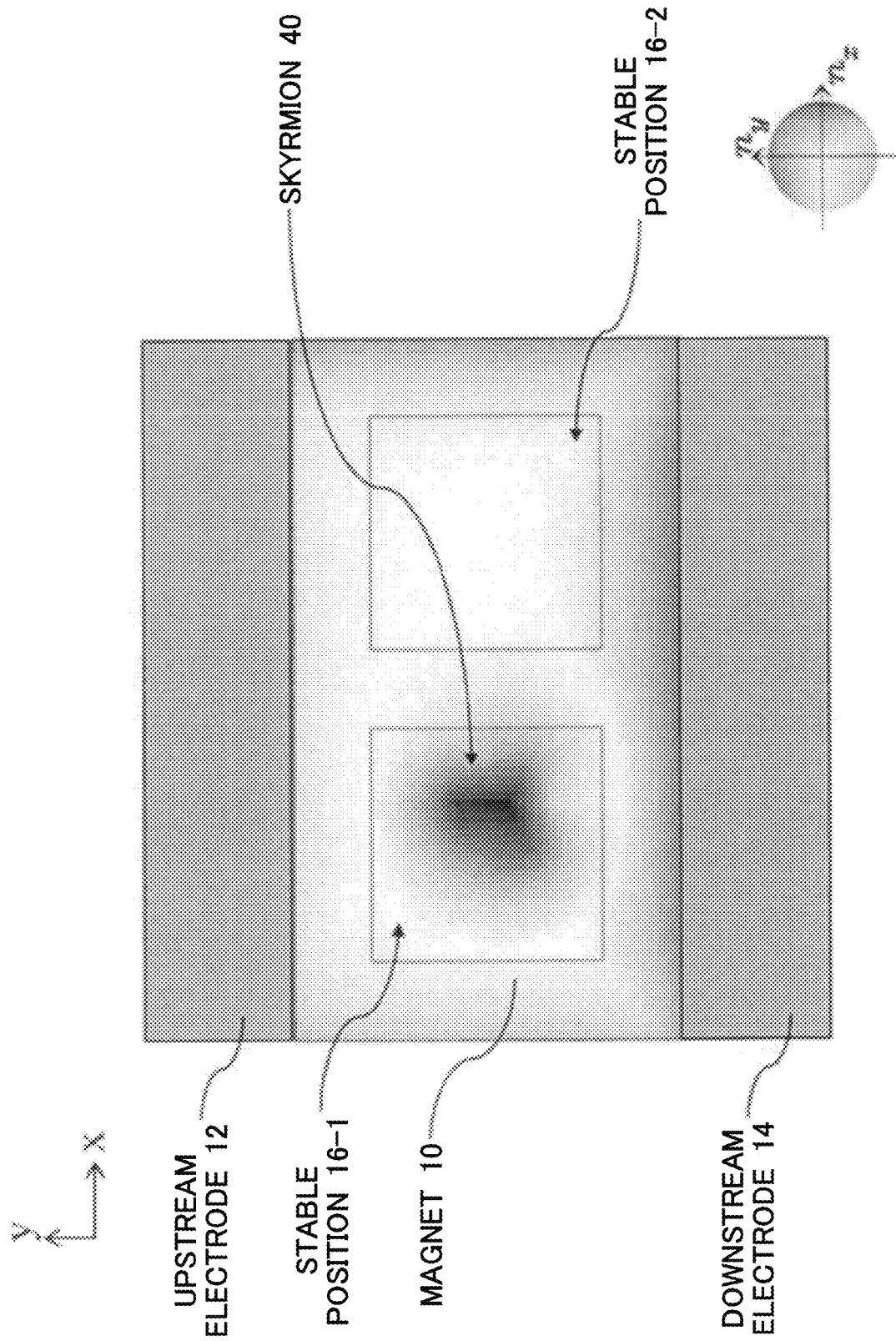
FIG. 9F shows a simulation result of a magnetic moment of the magnet 10 at t=18000(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a second negative current pulse to transfer a skyrmion is caused to flow through the magnet 10 from the upstream electrode 12 to the downstream electrode 14.

FIG. 9F shows a simulation result of a magnetic moment of the magnet 10 at t=18000(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a second negative current pulse to transfer a skyrmion is caused to flow through the magnet 10 from the upstream electrode 12 to the downstream electrode 14. The skyrmion 40 is stabilized in the stable position 16-1.

Figure 9G:
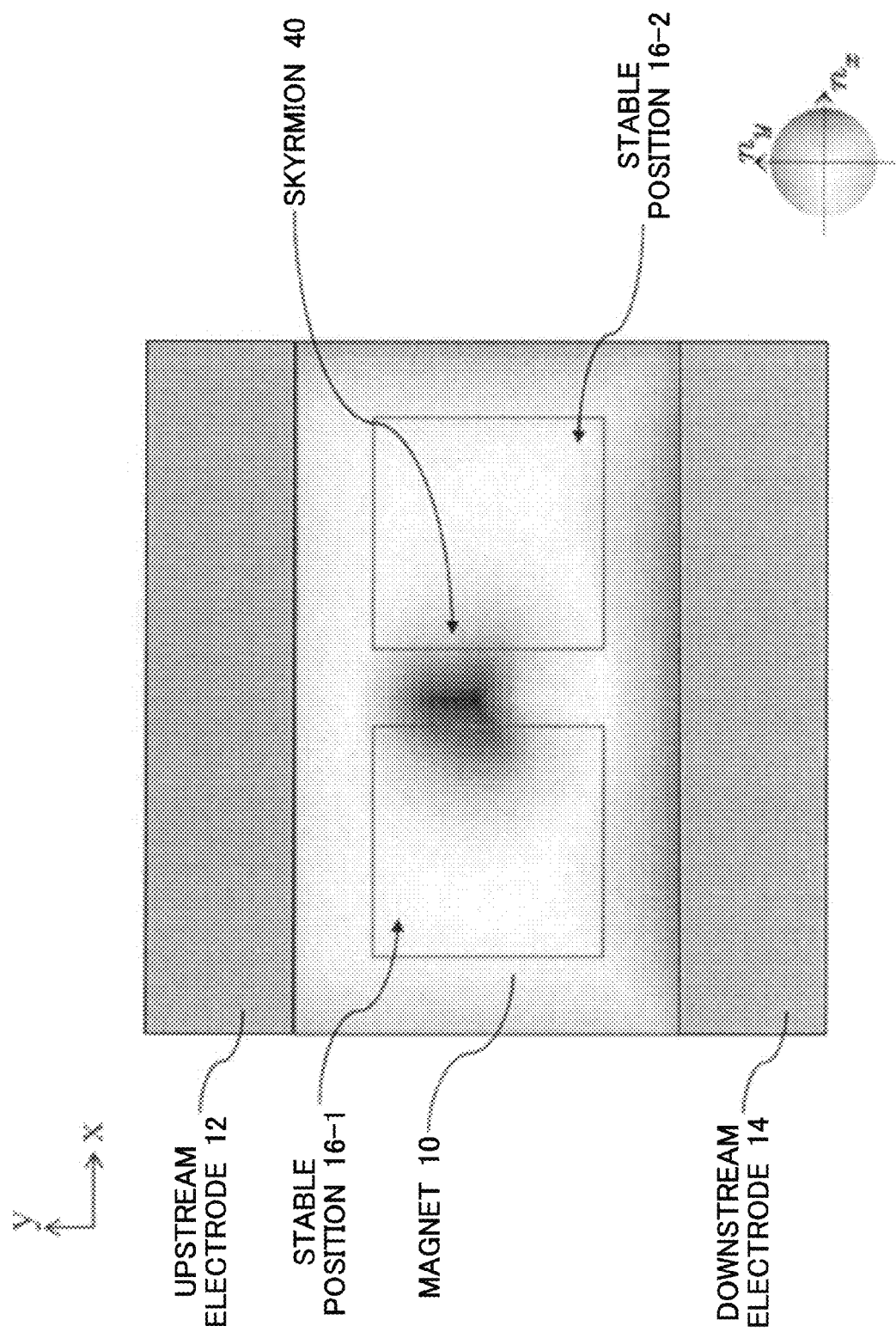
FIG. 9G shows a simulation result of a magnetic moment of the magnet 10 at t=23000(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a third positive current pulse to transfer a skyrmion is caused to flow through the magnet 10 from the upstream electrode 12 to the downstream electrode 14.

FIG. 9G shows a simulation result of a magnetic moment of the magnet 10 at t=23000(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a third positive current pulse to transfer a skyrmion is caused to flow through the magnet 10 from the upstream electrode 12 to the downstream electrode 14. The skyrmion 40 passes across the boundary between the stable position 16-1 and the stable position 16-2.

Figure 9H:
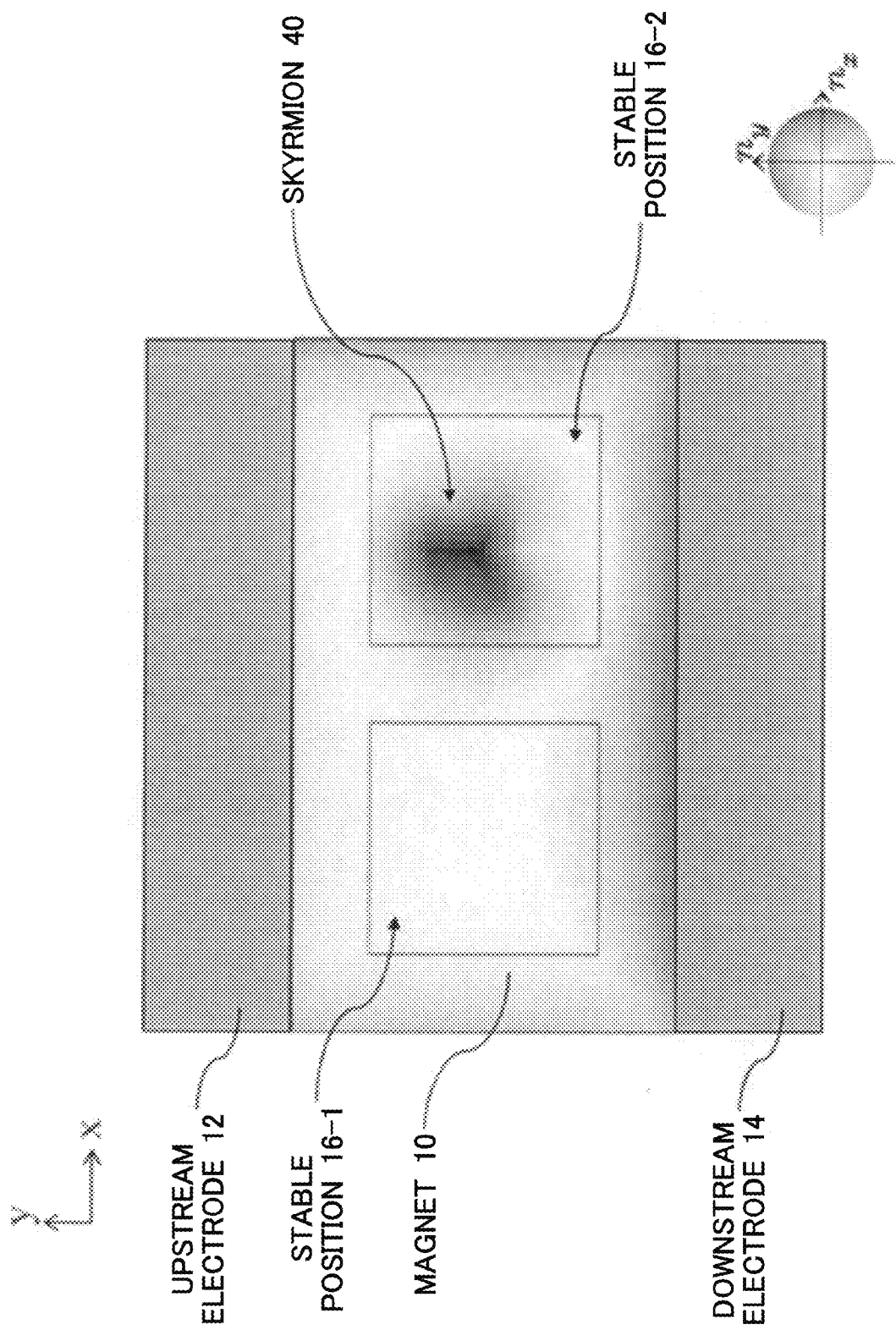
FIG. 9H shows a simulation result of a magnetic moment of the magnet 10 at t=27000(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a third positive current pulse to transfer a skyrmion is caused to flow through the magnet 10 from the upstream electrode 12 to the downstream electrode 14.

FIG. 9H shows a simulation result of a magnetic moment of the magnet 10 at t=27000(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a third positive current pulse to transfer a skyrmion is caused to flow through the magnet 10 from the upstream electrode 12 to the downstream electrode 14. The skyrmion 40 is stabilized in the stable position 16-2.

As described above, it is possible to transfer the skyrmion 40 from the stable position 16-1 to the stable position 16-2 by applying, from the upstream electrode 12 to the downstream electrode 14, the positive current pulse to transfer a skyrmion having the current density of approximately 0.001 J for a period of approximately 3000 (1/J). Also, it is possible to transfer the skyrmion 40 from the stable position 16-2 to the stable position 16-1 by applying the negative current pulse to transfer a skyrmion having the current density of approximately $0.001\xi$ for a period of approximately 3000(1/J). Also, it is possible to transfer, to the stable position 16-2, the skyrmion 40 returned to the stable position 16-1 by applying the positive current pulse to transfer a skyrmion again. The above-described matters can be summarized as follows.

(1) It is possible to transfer the skyrmion 40 from the stable position 16-1 to the stable position 16-2, and also cause the skyrmion 40 to exist stably in the stable position 16-2, if the positive current pulse to transfer a skyrmion having the current density of approximately $0.001\xi$ is caused to flow from the upstream electrode 12 to the downstream electrode 14 for a period of approximately 3000(1/J).

(2) It is possible to transfer the skyrmion 40 from the stable position 16-2 to the stable position 16-1, and also cause the skyrmion 40 to exist stably in the stable position 16-2, if the negative current pulse to transfer a skyrmion having the same degree of the current density as that of the positive current pulse to transfer a skyrmion is caused to flow from the upstream electrode 12 to the downstream electrode 14 for a period which is the same as the period for the positive current pulse to transfer a skyrmion.

That is, according to the transferring configuration with a direction perpendicular to a current direction, it is possible to transfer the skyrmion 40 easily between a plurality of the stable positions 16 arrayed in a direction orthogonal to the direction of the current to transfer a skyrmion. A time needed for a current pulse to be applied when the skyrmion is transferred is approximately 3000(1/J), that is, roughly 1 nsec. Therefore, it is possible to transfer the skyrmion 40 between the stable positions 16 at a very high velocity. Since the transfer of the skyrmion 40 corresponds to information of "1" or "0", the skyrmion memory 100 can overwrite information at a very high velocity. This velocity is equal to the velocity of high-speed SRAM constituted in the CMOS circuit. In addition, since the skyrmion memory 100 is non-volatile, it is possible to prepare a perfect memory as a combined non-volatile memory with the CPU logic circuit. The current density is 0.001 and the current consumption is also small.

Fourth Embodiment

Simulation experiment is performed regarding an operation for erasing the skyrmion 40 by applying a current pulse to erase a skyrmion in the transferring configuration with a direction perpendicular to a current direction. This embodiment can be used in the following case, for example. In a case where the skyrmion 40 disappears from the stable positions 16 in the memory cell of a specific track for some reasons, it is not possible to use this track as a memory. In this case, it is possible to use the track can be used as a normal track if the skyrmion 40 is erased once from all memory cells in the track, and then the skyrmion 40 is generated in the stable position 16-1 of all memory cells.

In order to include such a reset function, an apparatus capable of erasing the skyrmion 40 completely from the memory cell is necessary.

Figure 10:
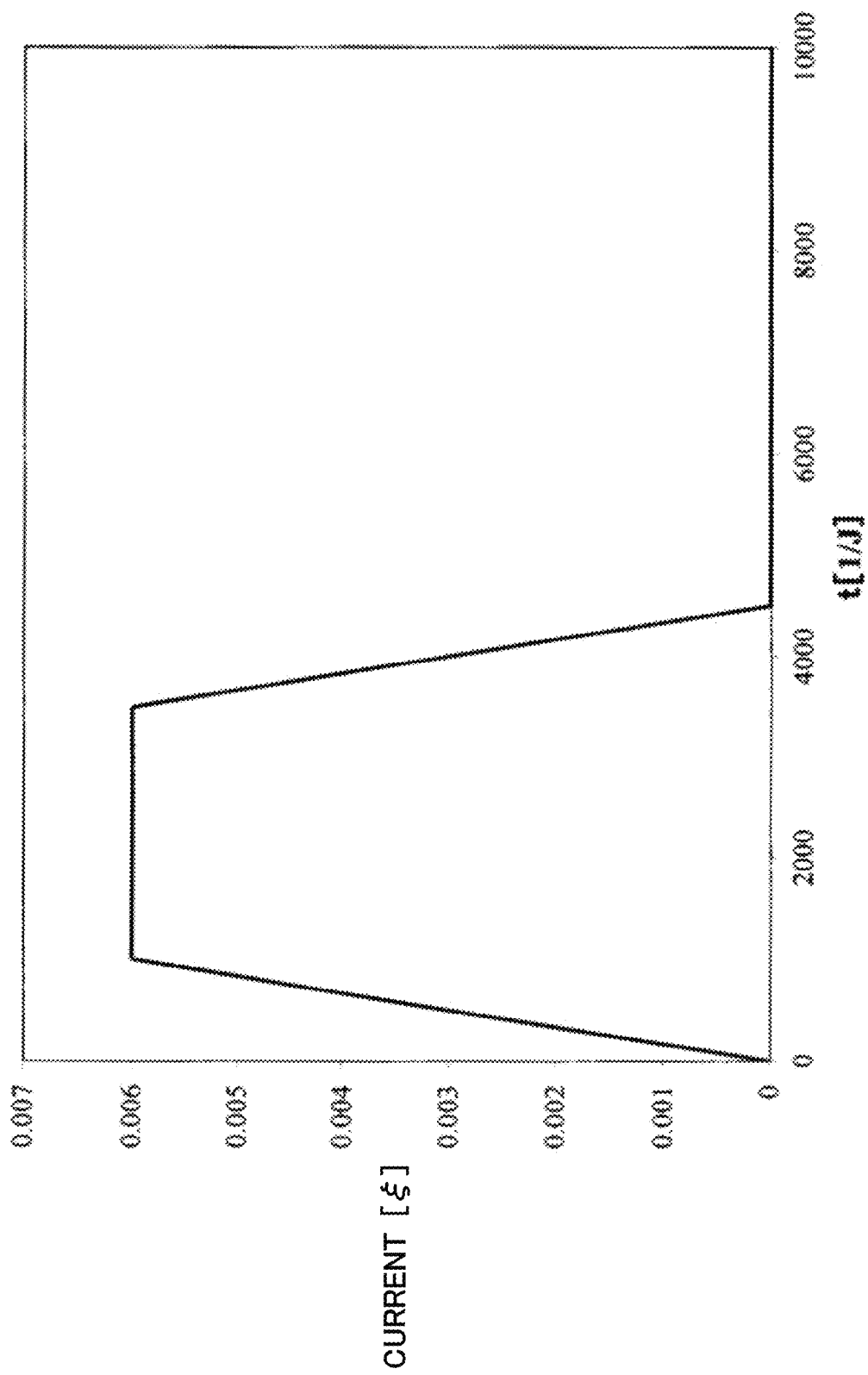
FIG. 10 shows a positive current pulse to erase a skyrmion in which a transferring configuration with a direction perpendicular to a current direction is provided in which a direction in which a current is caused to flow between the upstream electrode 12 and downstream electrode 14 is arranged substantially perpendicular to a direction in which the skyrmion is transferred, and which is caused to flow from the upstream electrode 12 to the downstream electrode 14.

FIG. 10 shows a positive current pulse to erase a skyrmion in which a transferring configuration with a direction perpendicular to a current direction is provided in which a direction in which a current is caused to flow between the upstream electrode 12 and downstream electrode 14 is arranged substantially perpendicular to a direction in which the skyrmion is transferred, and which is caused to flow from the upstream electrode 12 to the downstream electrode 14. In the present example, the skyrmion 40 exists in the stable position 16-1. A first current pulse to erase a skyrmion having a current density of $0.006\xi$ is applied during an application time of $4500(1/J)$. The current density of the current pulse to erase a skyrmion is greater than the current density of the current pulse to transfer a skyrmion. It should be noted that rising time and falling time of the first current pulse to erase a skyrmion are taken to be $1000(1/J)$, and the application time of pulse is taken to be $2500(1/J)$.

Figure 11A:
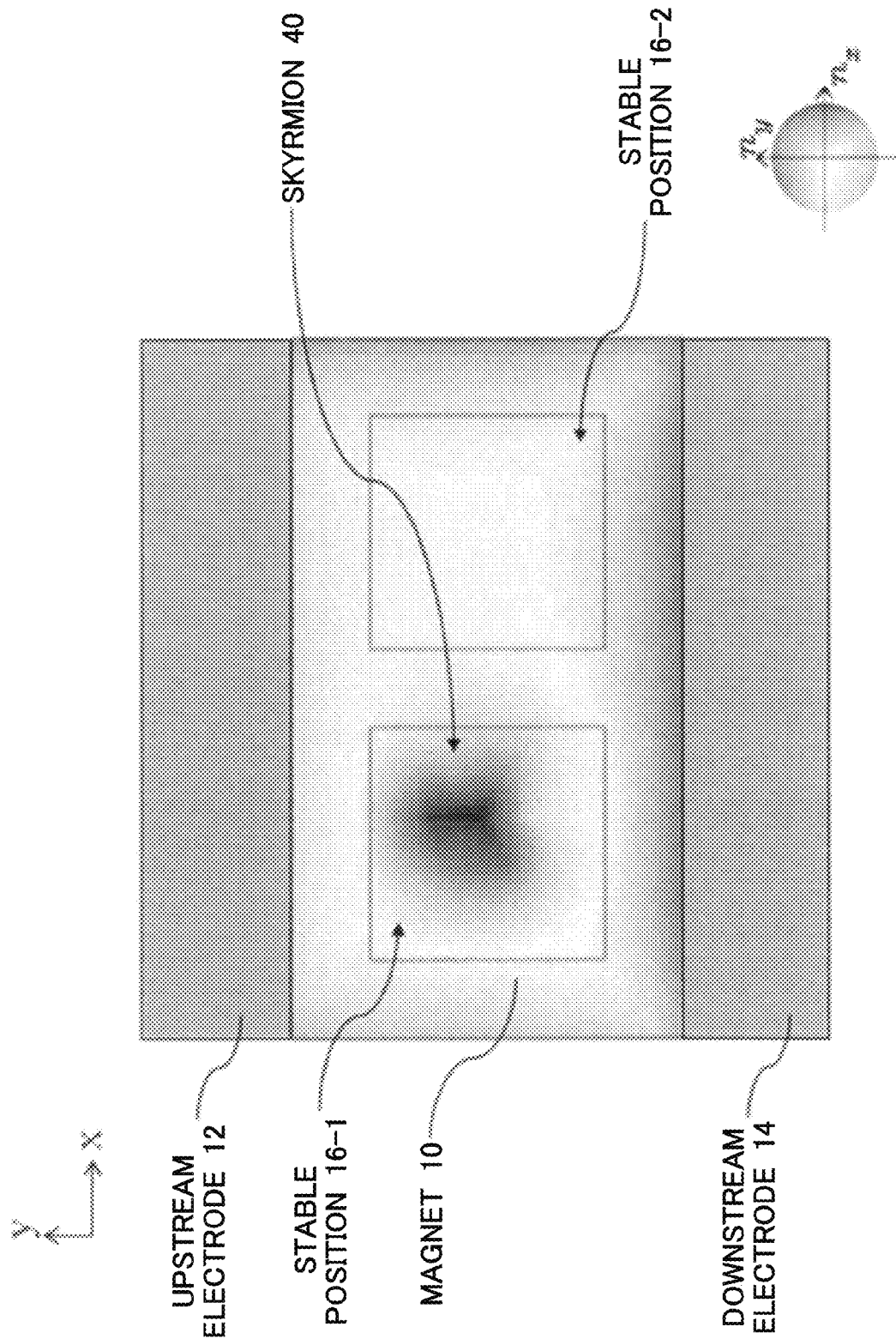
FIG. 11A shows a simulation result of a magnetic moment of the magnet 10 at t=0(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a second current pulse to erase a skyrmion is caused to flow through the magnet 10 from the upstream electrode 12 to the downstream electrode 14.

FIG. 11A shows a simulation result of a magnetic moment of the magnet 10 at $t=0(1/J)$ when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a second current pulse to erase a skyrmion is caused to flow through the magnet 10 from the upstream electrode 12 to the downstream electrode 14. In an initial state shown in FIG. 11A, the skyrmion 40 exists in the stable position 16-1.

Figure 11B:
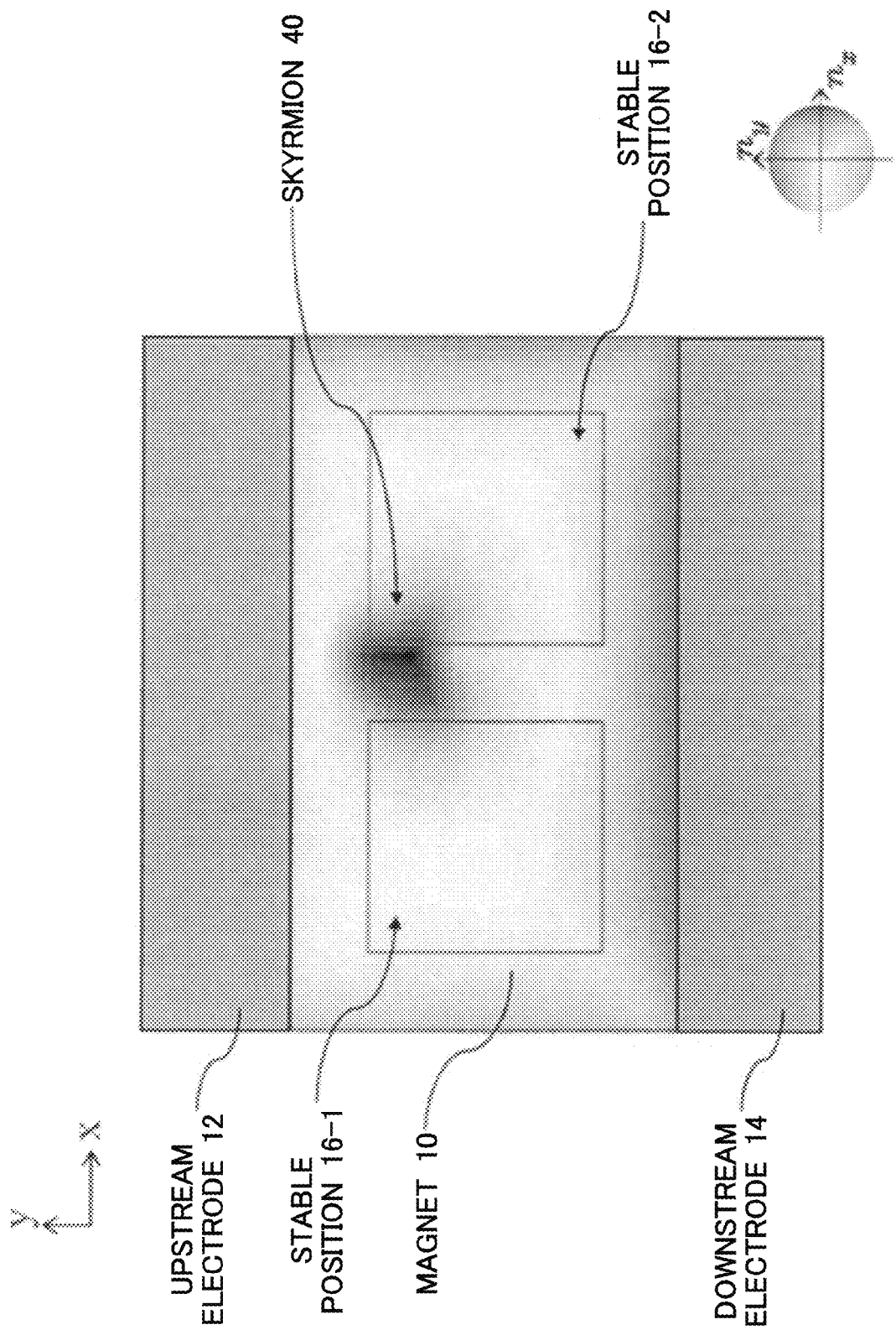
FIG. 11B shows a simulation result of a magnetic moment of the magnet 10 at t=2000(1/J) when a transferring configuration with a direction perpendicular to a current direction in which a direction in which a current is caused to flow between the upstream electrode 12 and the downstream electrode 14 is arranged substantially perpendicular to a direction in which the skyrmion is transferred, and a second current pulse to erase a skyrmion is caused to flow through the magnet 10 from the upstream electrode 12 to the downstream electrode 14.

FIG. 11B shows a simulation result of a magnetic moment of the magnet 10 at $t=2000(1/J)$ when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a second current pulse to erase a skyrmion is caused to flow through the magnet 10 from the upstream electrode 12 to the downstream electrode 14. The skyrmion 40 passes through a region closer to the upstream electrode 12 in the boundary between the stable position 16-1 and the stable position 16-2 to move toward the stable position 16-2.

Figure 11C:
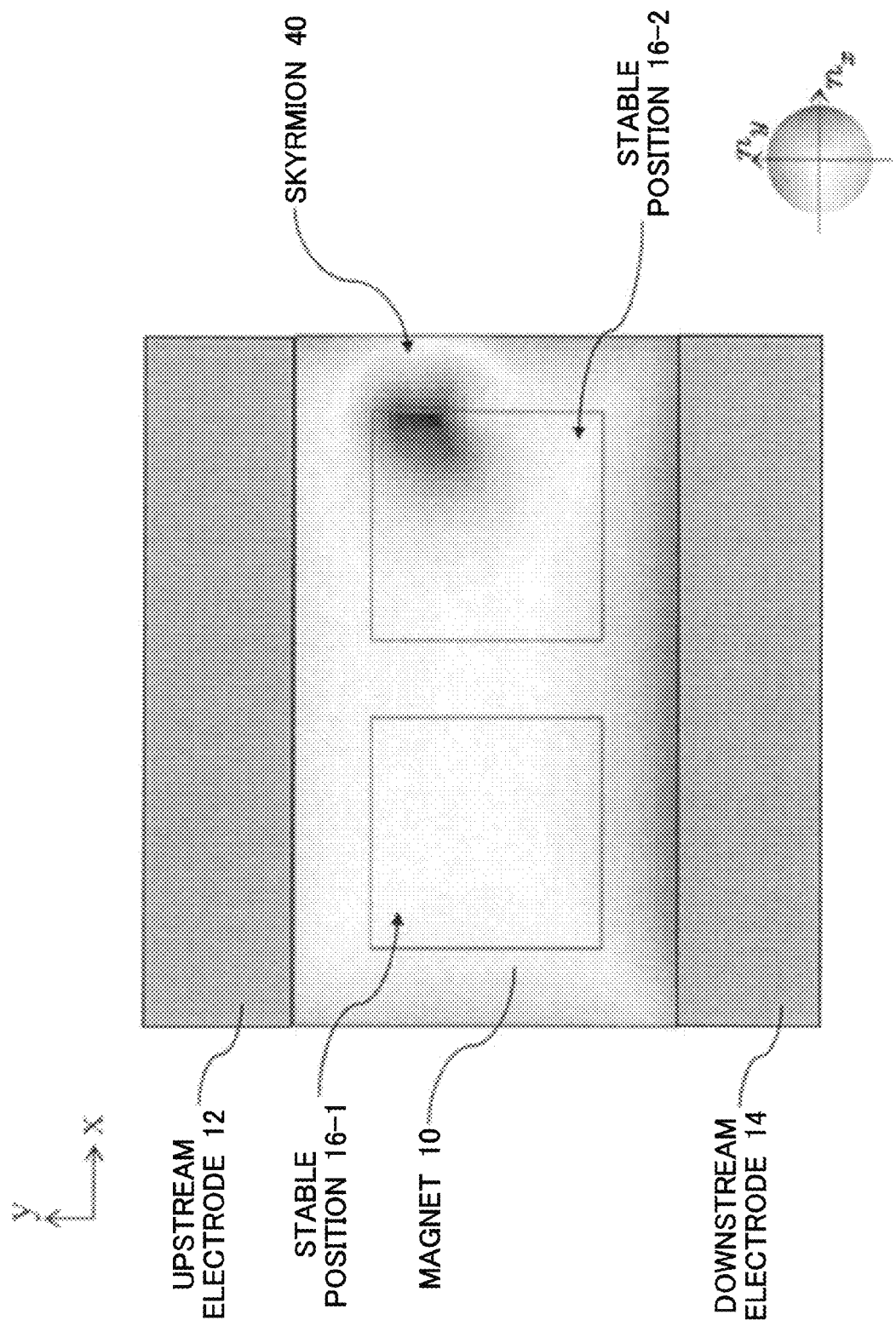
FIG. 11C shows a simulation result of a magnetic moment of the magnet 10 at t=3500(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a second current pulse to erase a skyrmion is caused to flow through the magnet 10 from the upstream electrode 12 to the downstream electrode 14.

FIG. 11C shows a simulation result of a magnetic moment of the magnet 10 at $t=3500(1/J)$ when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a second current pulse to erase a skyrmion is caused to flow through the magnet 10 from the upstream electrode 12 to the downstream electrode 14. The skyrmion 40 enters the end portion of the stable position 16-2.

Figure 11D:
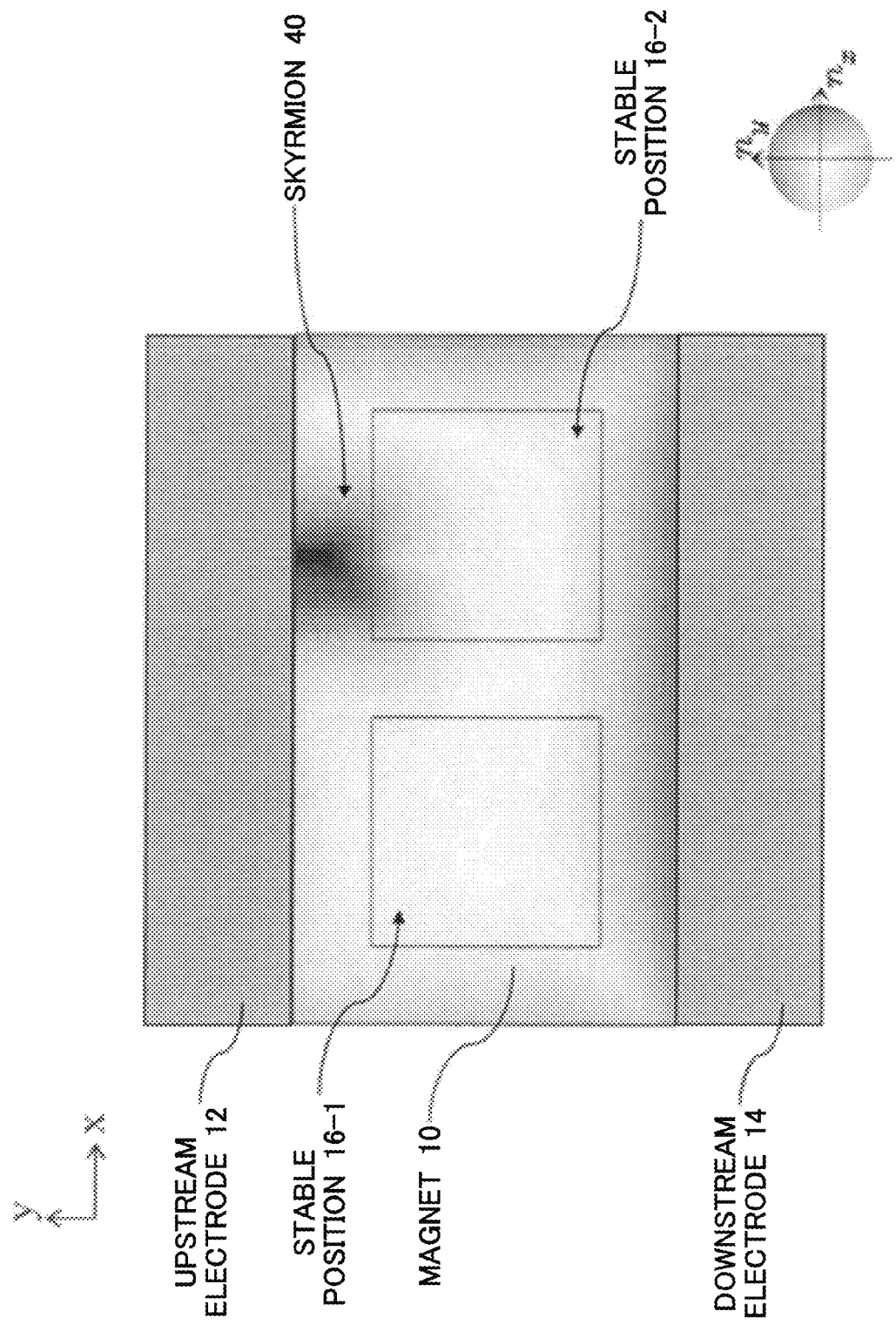
FIG. 11D shows a simulation result of a magnetic moment of the magnet 10 at t=5000(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a second current pulse to erase a skyrmion is caused to flow through the magnet 10 from the upstream electrode 12 to the downstream electrode 14.

FIG. 11D shows a simulation result of a magnetic moment of the magnet 10 at $t=5000(1/J)$ when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a second current pulse to erase a skyrmion is caused to flow through the magnet 10 from the upstream electrode 12 to the downstream electrode 14. After the state shown in FIG. 11C, the skyrmion 40 overcomes the potential barrier in the end portion in the positive direction of the x axis of the magnet 10 and starts to disappear. Subsequently, the skyrmion 40 disappears in the end portion in the positive direction of the y axis in the boundary between the magnet 10 and the upstream electrode 12. Next, simulation experiment is performed regarding an operation for erasing the skyrmion 40 that exists in the stable position 16-2.

Figure 12:
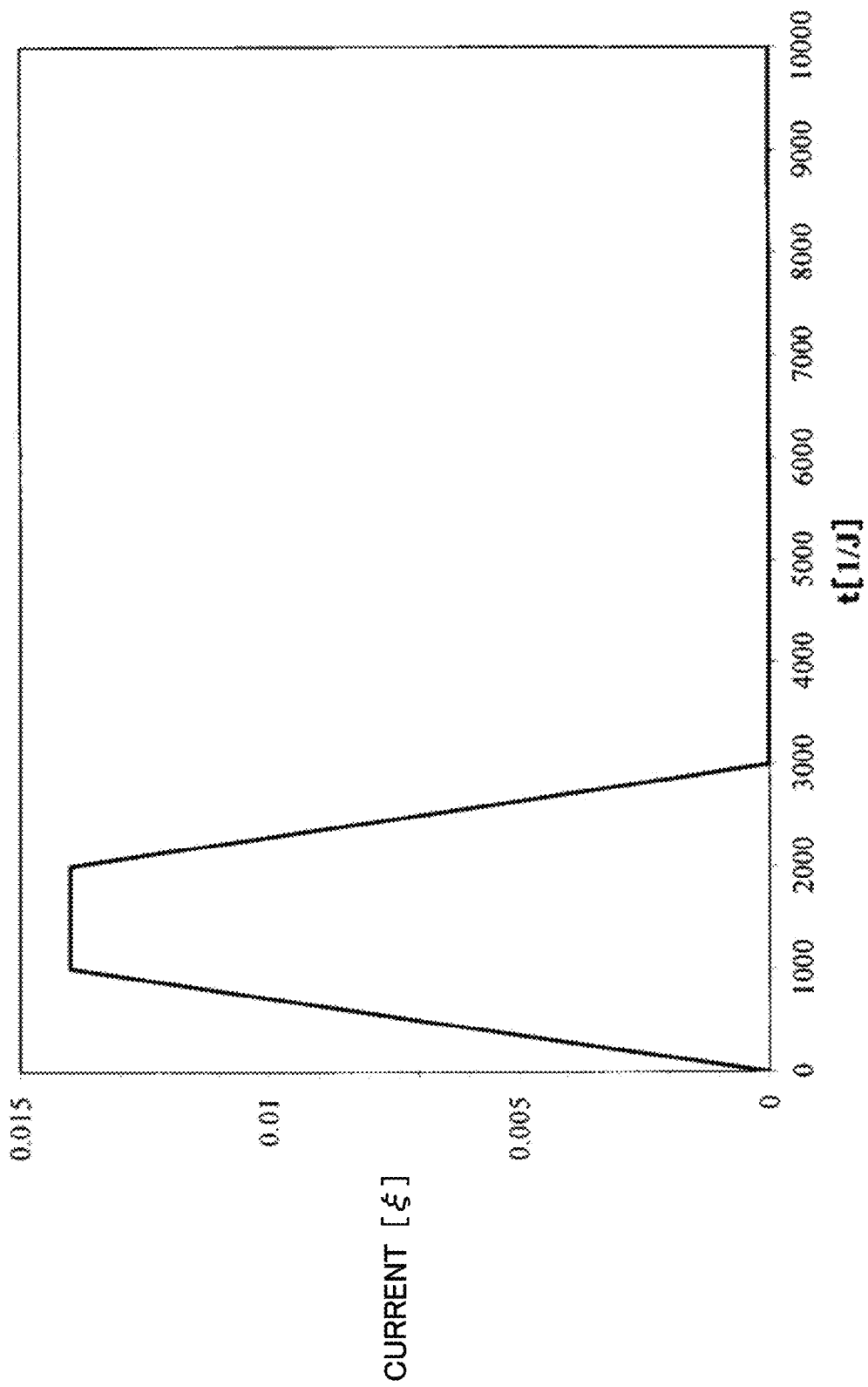
FIG. 12 shows a positive current pulse to erase a skyrmion in which a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a positive current pulse to erase a skyrmion is caused to flow from the upstream electrode 12 to the downstream electrode 14.

FIG. 12 shows a positive current pulse to erase a skyrmion in which a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and which is caused to flow from the upstream electrode 12 to the downstream electrode 14. A current density is $0.014\xi$. An application time of current is taken to be $3000(1/J)$. It should be noted that rising time and falling time of the third current pulse to erase a skyrmion are taken to be $1000(1/J)$, and the application time of pulse is taken to be $1000(1/J)$.

Figure 13A:
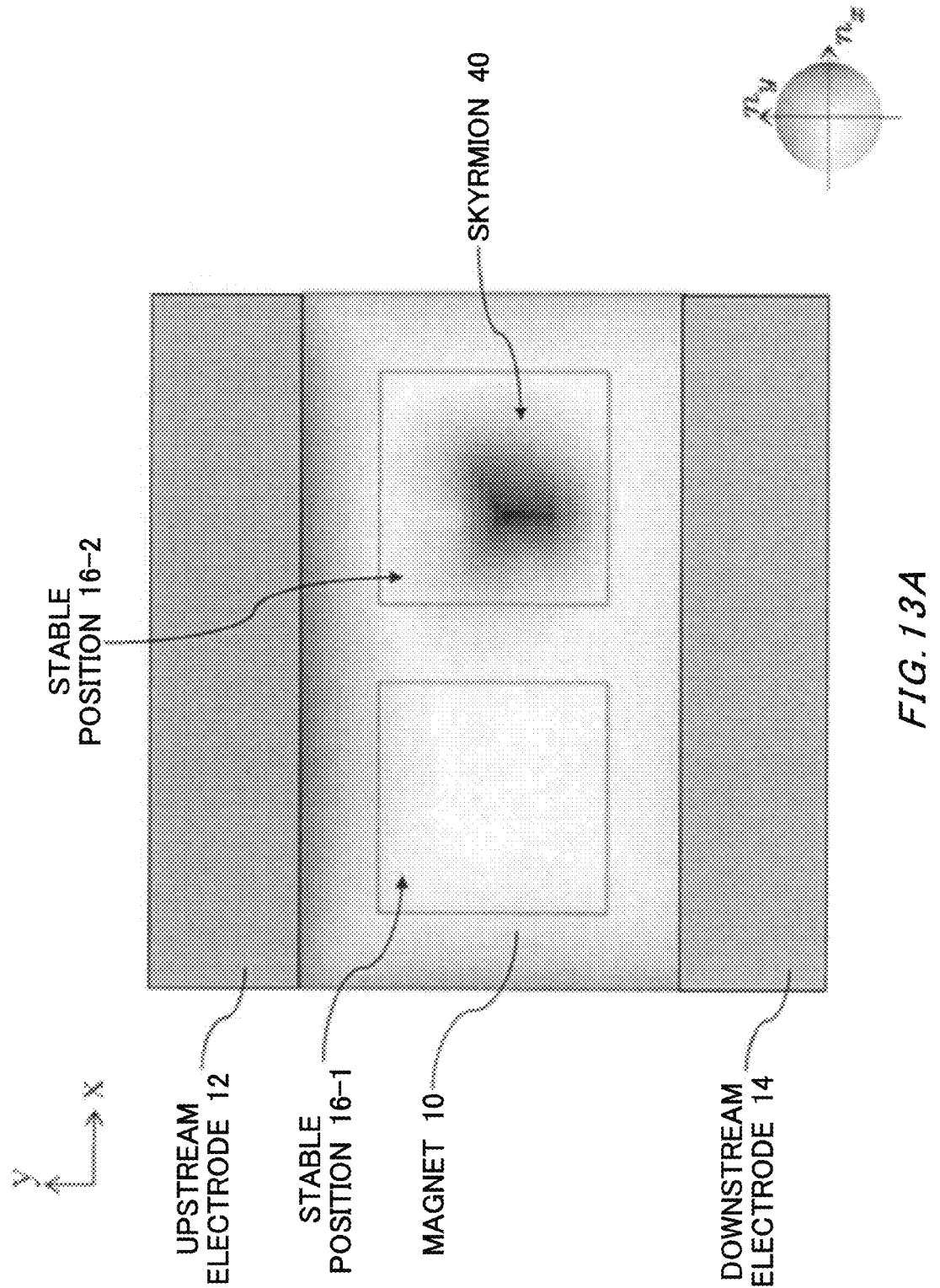
FIG. 13A shows a simulation result of a magnetic moment of the magnet 10 at t=0(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a fourth current pulse to erase a skyrmion is caused to flow through the magnet 10 from the upstream electrode 12 to the downstream electrode 14.

FIG. 13A shows a simulation result of a magnetic moment of the magnet 10 at $t=0(1/J)$ when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a fourth current pulse to erase a skyrmion is caused to flow through the magnet 10 from the upstream electrode 12 to the downstream electrode 14. In an initial state shown in FIG. 13A, the skyrmion 40 exists in the stable position 16-2.

Figure 13B:
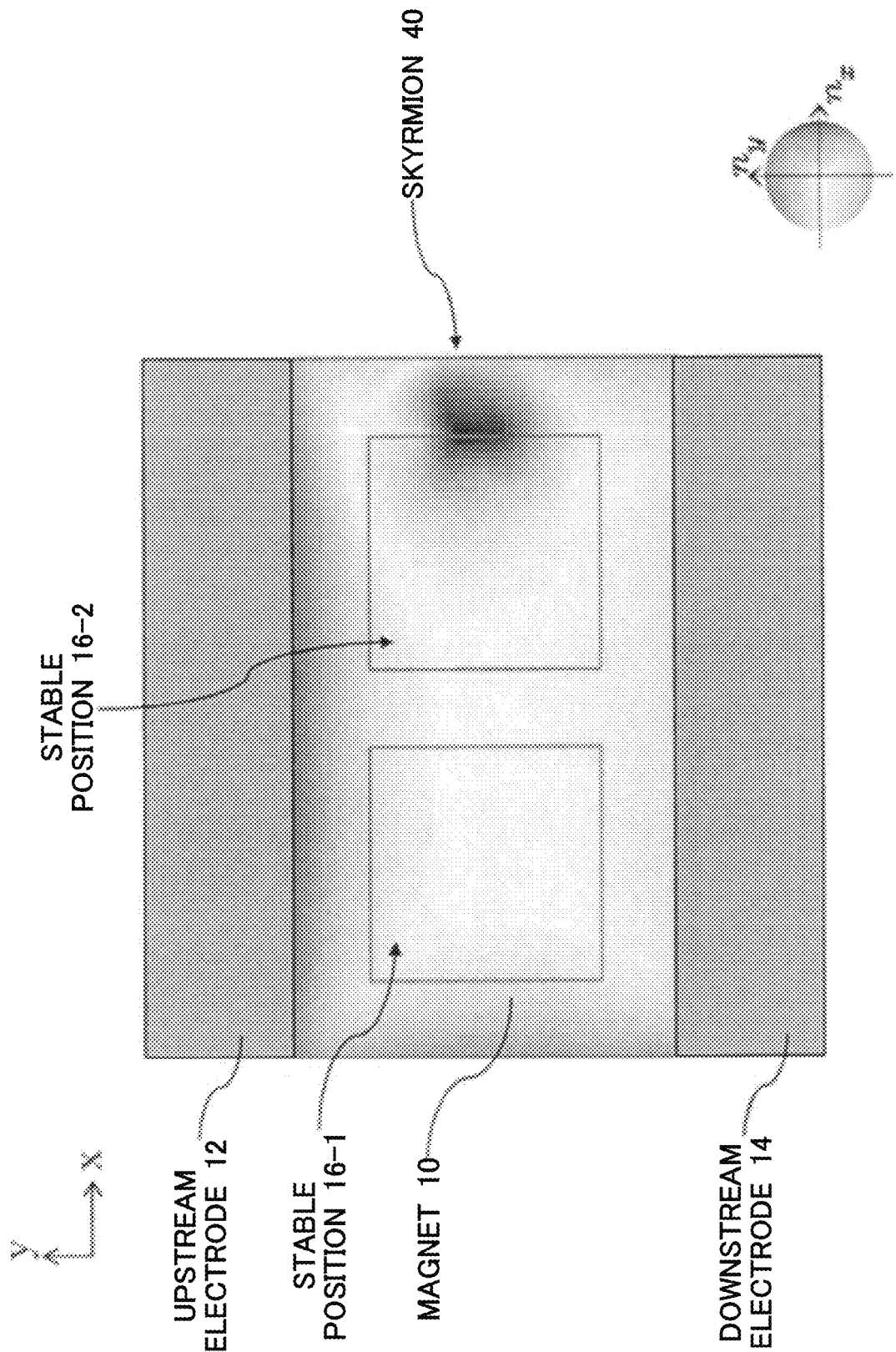
FIG. 13B shows a simulation result of a magnetic moment of the magnet 10 at t=2600(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a fourth current pulse to erase a skyrmion is caused to flow through the magnet 10 from the upstream electrode 12 to the downstream electrode 14.

FIG. 13B shows a simulation result of a magnetic moment of the magnet 10 at $t=2600(1/J)$ when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a fourth current pulse to erase a skyrmion is caused to flow through the magnet 10 from the upstream electrode 12 to the downstream electrode 14. The skyrmion 40 is in contact with the end portion of the positive direction side of the x axis of the magnet 10. In the present example, since the application time of current pulse to erase a skyrmion is long, the skyrmion 40 overcomes the potential barrier in the end portion of the magnet 10.

Figure 13C:
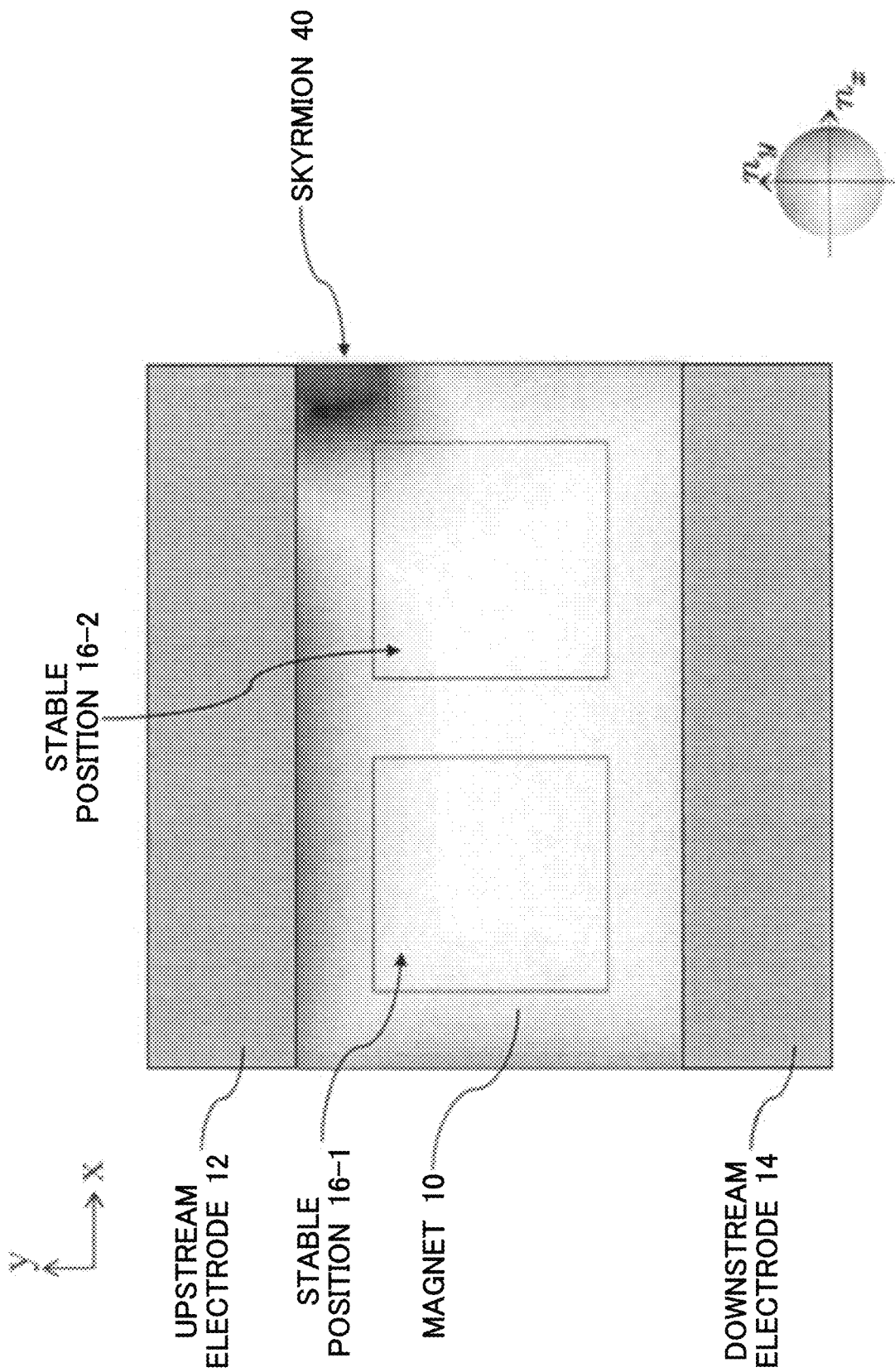
FIG. 13C shows a simulation result of a magnetic moment of the magnet 10 at t=3400(1/J) when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a fourth current pulse to erase a skyrmion is caused to flow through the magnet 10 from the upstream electrode 12 to the downstream electrode 14.

FIG. 13C shows a simulation result of a magnetic moment of the magnet 10 at $t=3400(1/J)$ when a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a fourth current pulse to erase a skyrmion is caused to flow through the magnet 10 from the upstream electrode 12 to the downstream electrode 14. The skyrmion 40 moves the end portion on the positive direction side of the x axis the magnet 10 while disappearing toward the upstream electrode 12. Subsequently, the skyrmion 40 disappears in the end portion of the positive direction of the y axis in the boundary between the magnet 10 and the upstream electrode 12.

As described above, conditions to erase a skyrmion conditions in a case where the magnet 10 and the stable positions 16 of the present example are used are shown as follows.

(3) In a case where the skyrmion 40 exists in the stable position 16-1, the current density is 0.006 and the application time of pulse is 4500(1/J).

(4) In a case where the skyrmion 40 exists in the stable position 16-2, the current density is 0.014 and the application time of pulse is 3000(1/J) or more.

Design rules of (1) to (4) in a case of the magnetic element having two or more stable positions 16 are shown by physical quantity of J. They have high adaptivity. It should be noted that in the above-described conditions, in a case where the current density is increased, the application time of pulse may be decreased. Also, the design rules of the magnetic element described herein do not change even for the dipole magnet, the frustrated magnet, or the stacking structure of the magnetic material and the non-magnetic material. If the substances are determined, an exchange interaction energy J is also determined. The above-described design rules can be applied if this J is determined.

In this manner, in the present specification, the transferring configuration with a direction perpendicular to a current direction is provide, in which a direction in which a current is caused to flow between the upstream electrode 12 and the downstream electrode 14 is arranged substantially perpendicular to the direction where the skyrmion 40 is transferred, and an optimal arrangement of a method of transferring and erasing a skyrmion through current is shown. Also, in the present invention, it became possible to transfer and erase the skyrmion 40 through an extremely short pulse current of approximately nanoseconds. The skyrmion memory 100 disclosed in the present specification does not consume electrical power for holding the memory. The skyrmion memory 100 functions as a non-volatile memory. Therefore, a low-power consumption high-speed non-volatile memory is achieved. It can be expected to make a large impact on putting, into practical application, a skyrmion magnetic element, a skyrmion memory to which this skyrmion magnetic element is applied, a skyrmion memory embedded CMOS-LSI device, and a personal computer, data recording medium, a data recording apparatus, and data communication apparatus with a built-in skyrmion memory.

The skyrmion has an extra fine structure having a diameter of 1 to 500 nm of nanoscale size, and the skyrmion can be applied as a magnetic element with large storage capacity capable of making extra fine large amounts of bit information extra fine.

Since the skyrmion memory 100 is a non-volatile magnetic memory which can be applied to the memory capable of high-speed storage and erasing, it can be expected as a device that provides an alternative non-volatile memory of DRAM or high-speed SRAM currently used as an information operation. In particular, the achievement of the optimal arrangement of the method of transferring a skyrmion through current by the present invention provides great contributions to this achievement.

Figure 14:
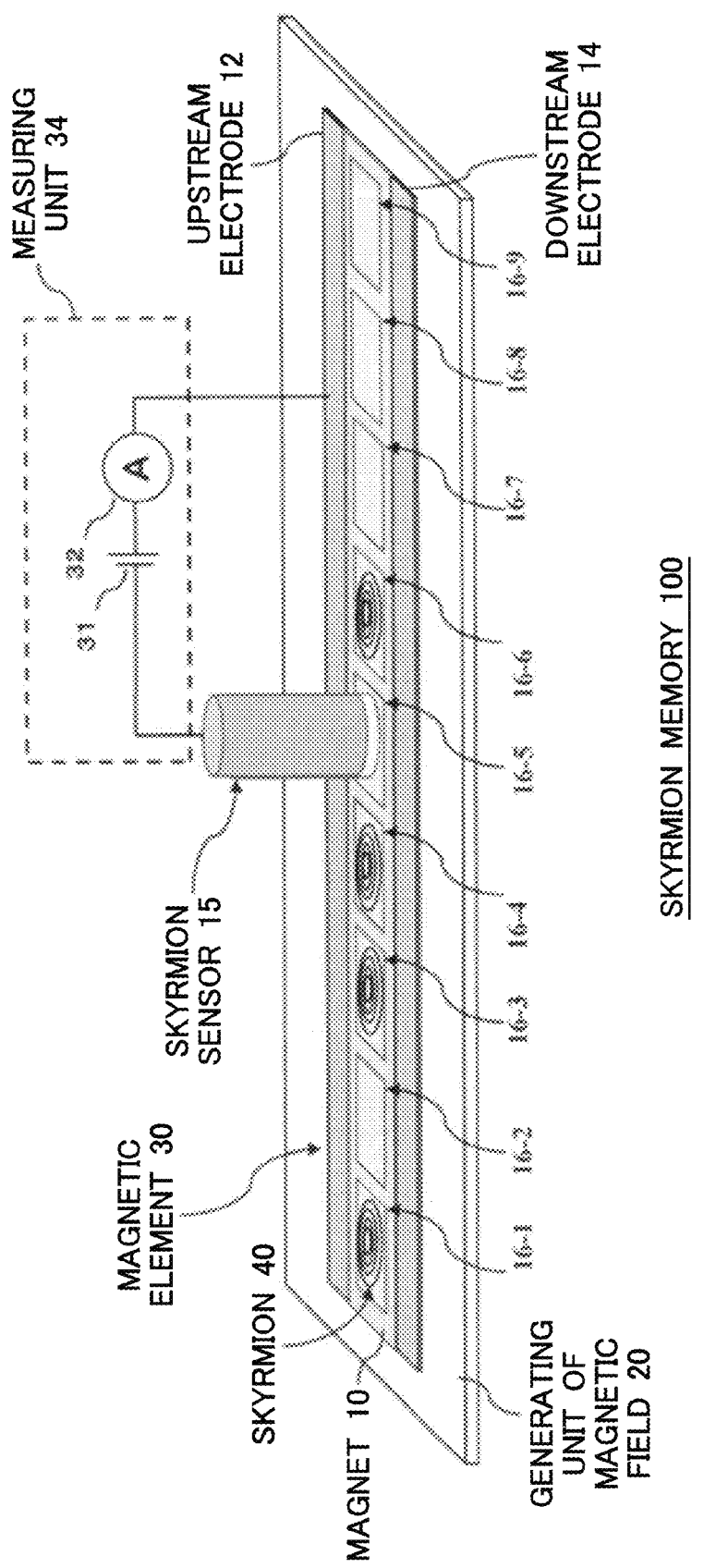
FIG. 14 is a schematic view showing another configuration example of the skyrmion memory 100 in a transferring configuration with a direction perpendicular to a current direction is provided in which a direction in which the current is caused to flow between the upstream electrode 12 and the downstream electrode 14 is arranged substantially perpendicular to a direction in which the skyrmion is transferred.

FIG. 14 is a schematic view showing another configuration example of the skyrmion memory 100. The skyrmion memory 100 of the present example functions as a shift register. The skyrmion memory 100 of the present example has three or more stable positions 16 arrayed in a direction orthogonal to the direction where the current to transfer a skyrmion is caused to flow. In the present example, three or more stable positions 16 are arranged in the magnet 10 sandwiched by the upstream electrode 12 and the downstream electrode 14. It should be noted that FIG. 14 omits a power supply 52 causing a current to flow between the upstream electrode 12 and the downstream electrode 14.

By such a configuration, it is possible to provide a shift register function sequentially transferring data from the stable position 16 on the left side to the stable position 16 on the right side, for example The skyrmion memory 100 of the present example has a stable position 16-1, a stable position 16-2, . . . and a stable position 16-9. The skyrmion memory 100 generates a skyrmion in the stable position 16-1 at the left end according to the signal "1" or "0" of information conveyed by the external circuit. The skyrmion memory 100 may be formed in a magnet shape having a notch structure for generating the skyrmion in the stable position 16-1. The skyrmion memory 100 may have a current path having a local magnetic field by a current coil. When the positive current pulse to transfer a skyrmion is caused to flow from the upstream electrode 12 to the downstream electrode 14, the skyrmion 40 moves from one stable position 16 to the right one by one. Also, when the negative current pulse to transfer a skyrmion is caused to flow, the skyrmion 40 moves from one stable position 16 to the left one by one. If the skyrmion sensor 12 is installed in the stable position 16-5, it is possible to sense the skyrmion passing through the stable position 16-5. Thereby, it is possible to read information temporarily stored. Also, the skyrmion sensor 12 may be provided for all stable positions 16. Thereby, it is possible to read each bit of information held by the skyrmion memory 100 simultaneously. The presence or absence of the skyrmion 40 in each stable position 16 corresponds to one bit of information.

Figure 15:
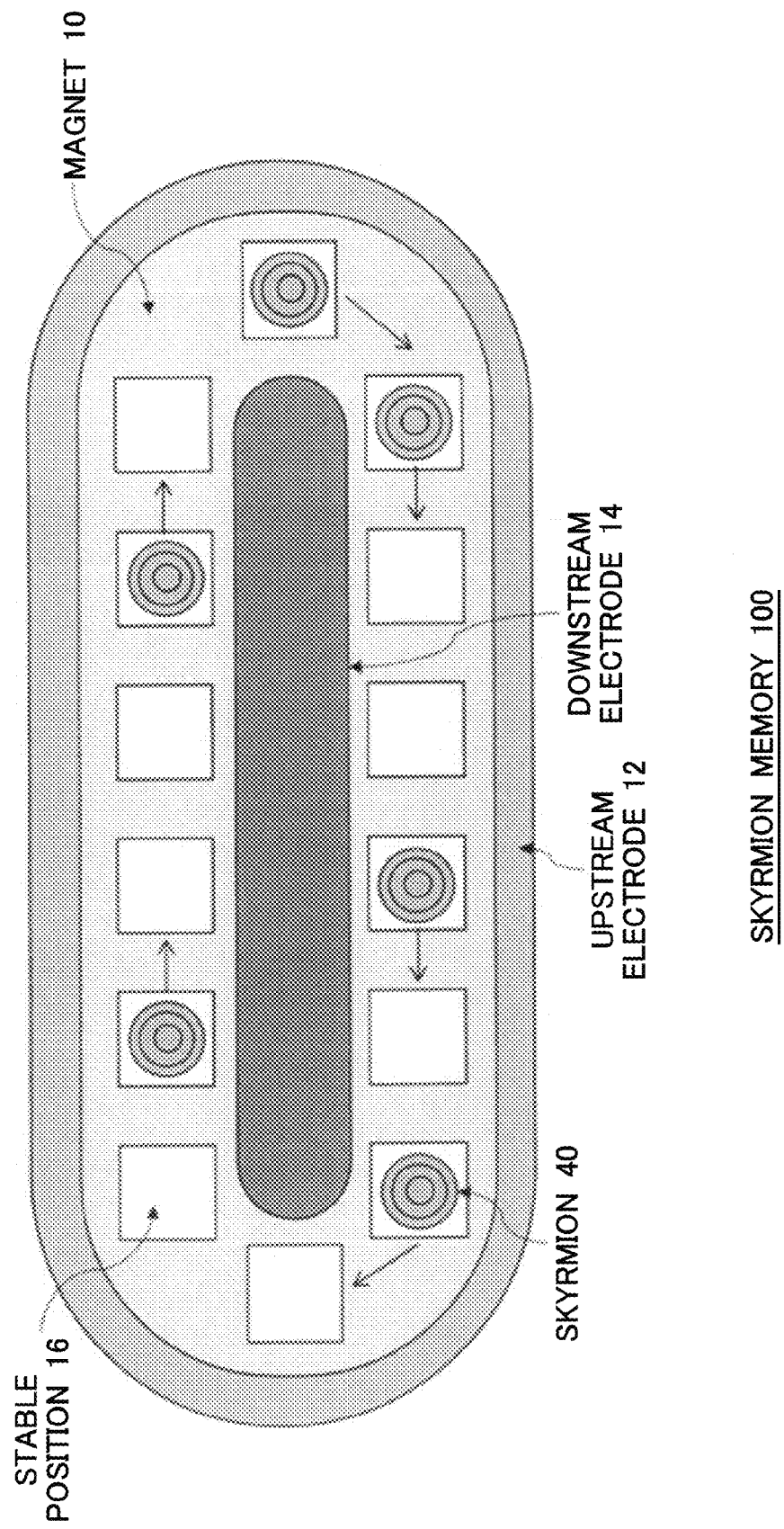
FIG. 15 is a schematic view showing another configuration example of the skyrmion memory 100 in which a transferring configuration with a direction perpendicular to a current direction is provided in which a direction in which a current is caused to flow between the upstream electrode 12 and the downstream electrode 14 is arranged substantially perpendicular to a direction in which the skyrmion is transferred, and a magnet with a closed-path pattern is used.

FIG. 15 is a schematic view showing another configuration example of the skyrmion memory 100. The magnet 10 in the skyrmion memory 100 of the present example has a closed-path pattern. That is, the magnet 10 has an inner circumference edge and an outer circumference edge that define an inner circumference and an outer circumference in the plane parallel to the spreading direction, respectively. In the magnet 10 of the present example, both the outer circumference and the inner circumference have an oval shape, and also have a circuit shape in which the interval between the outer circumference and the inner circumference is almost constant. The oval shape may be a substantially square shape. In this case, corners are designed to have an appropriate curvature. A closed-path magnet may be formed in a meander shape. There may be various types of magnets with a closed-path pattern.

One of the upstream electrode 12 and the downstream electrode 14 is connected to the inner circumference edge in the plane parallel to the spreading direction of the magnet 10, and the other one is connected to the outer circumference edge of the magnet 10 in the plane parallel to the spreading direction of the magnet 10. In the present example, the upstream electrode 12 is connected to the outer circumference edge of the magnet 10, and the downstream electrode 14 is connected to the inner circumference edge of the magnet 10. In this case, the transferring configuration with a direction perpendicular to a current direction is provided in which the current is caused to flow through the magnet 10 in the orientation from the upstream electrode 12 to the downstream electrode 14, and the skyrmion 40 is transferred substantially perpendicular to the direction of current. Thereby, spin-transfer torque is caused to act such that the skyrmion 40 makes a clockwise lap around the magnet 10 when viewed from the surface side of the magnet 10.

A plurality of stable positions 16 are arrayed so as to make one circuit of the closed-path pattern of the magnet 10. The stable positions 16 are preferably arrayed such that moving time of the skyrmion 40 between each stable position 16 is equal. The interval between each stable position 16 may be the same. Also, in FIG. 15, the shape of each stable position 16 is square. However, the stable positions 16 in the arc-shaped portion of the magnet 10 may have a different shape from the shape of the stable positions 16 in the linear portion of the magnet 10. Each stable position 16 may have two sides parallel to the outer circumference edge and the inner circumference edge of the magnet 10, and two sides orthogonal to the outer circumference edge and the inner circumference edge.

It should be noted that in FIG. 15, the power supply 52, the generating unit of magnetic field 20, the skyrmion sensor 15, and the measuring unit 34 are omitted. The skyrmion sensor 12 is provided relative to at least one stable position 16. When information is read, the current pulse to transfer a skyrmion is applied multiple times such that the position of the skyrmion 40 sequentially shifts, and each skyrmion 40 makes one circuit around the plurality of stable positions 16. The skyrmion sensor 12 detects a pattern of the presence or absence of the skyrmion 40. After the current pulse is applied, the skyrmion 40 is positioned inside one stable position 16 stably. Therefore, it is possible to confirm the position of the skyrmion 40, and it is easy to detect the presence or absence of the skyrmion 40. Also, it is not necessary to cause the current to flow constantly in order to control the skyrmion 40. Therefore, it is possible to reduce the power consumption. This memory can function as a non-volatile memory that does not consume electrical power to hold storage.

Also, the skyrmion memory 100 generates a skyrmion in one of the stable positions 16 according to the signal "1" or "0" of information conveyed from the external circuit. The skyrmion memory 100 may be formed in a magnet shape having a notch structure to generate the skyrmion in the stable position 16. Also, the skyrmion memory 100 may have a current path having a local magnetic field by a current coil.

Figure 16A:
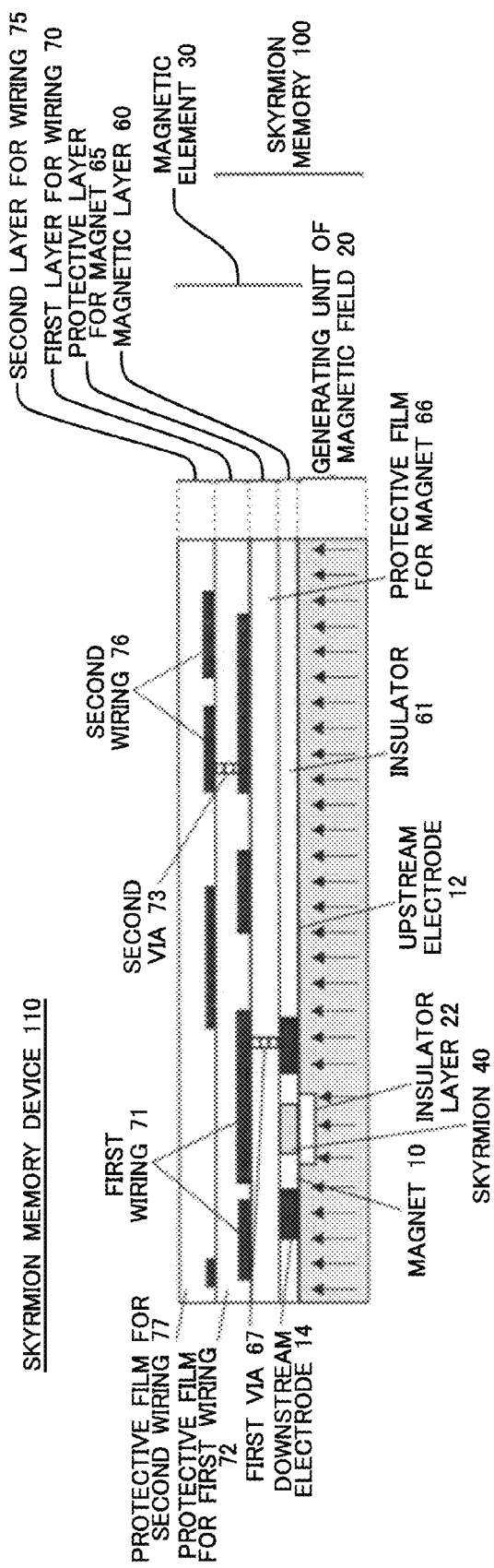
FIG. 16A shows a cross-sectional structure of the skyrmion memory device 110.

FIG. 16A shows a cross-sectional structure of the skyrmion memory device 110. The skyrmion memory device 110 is a device including at least one skyrmion memory 100. The skyrmion memory device 110 includes the generating unit of magnetic field 20 which is a ferromagnetic layer and the magnetic element 30 formed over the generating unit of magnetic field 20. The generating unit of magnetic field 20 has a dip of which a film thickness is thin in a portion of a lower portion of each stable position 16 in order to form the stable positions 16. An insulator layer 22 may be arranged in the dip. A non-magnetic layer is provided between the magnetic element 30 and the generating unit of magnetic field 20. This non-magnetic layer may be formed from the same material as the insulator 22. The magnetic element 30 of the present example has a constitution similar to that of the magnetic element 30 shown in FIG. 3, FIG. 14, or FIG. 15. FIG. 16A shows the downstream electrode 14 and the upstream electrode 12 only, out of the metal electrode included in the magnetic element 30 shown in FIG. 3, FIG. 14, or FIG. 15, and omits other metal electrodes. FIG. 16A does not illustrate a cross-sectional view of the measuring unit 34. The magnetic element 30 has a stacking structure in which a magnetic layer 60, a protective layer for magnet 65, a first layer for wiring 70, and a second layer for wiring 75 are stacked in order.

The protective layer for magnet 65 has a protective film for magnet 66 and a first via 67. The protective film for magnet 66 protects the magnetic layer 60. The first via 67 supplies each metal electrode with currents to transfer, generate, erase, and detect a skyrmion. Although FIG. 16A shows a single first via 67, the first via 67 is provided to each metal electrode.

The first layer for wiring 70 has a first wiring 71, a protective film for the first wiring 72, and a second via 73. The first wiring 71 forms a path that supplies a voltage or a current to transfer, generate, erase, and detect a skyrmion. The protective film for the first wiring 72 functions as an insulating film between layers for forming the first wiring 71 and the second via 73.

In a case where it is difficult to route the path to transfer, generate, erase, and detect a skyrmion within the same layer, a second layer for wiring 75 may be formed on the first layer for wiring 70 as shown in FIG. 16A.

The second layer for wiring 75 has a second wiring 76 and a protective film for the second wiring 77. The second wiring 76 is connected to the second via 73. The protective film for the second wiring 77 functions as an insulating film between layers for insulating the second wiring 76. The second via 73 connects the first wiring 71 and the second wiring 76. The second wiring 76 forms paths for transmitting the voltage or the current to transfer, generate, erase, and detect a skyrmion with the first wiring 71. These paths may be connected to an external power supply of the skyrmion memory device 110, or the like, via an external terminal.

Figure 16B:
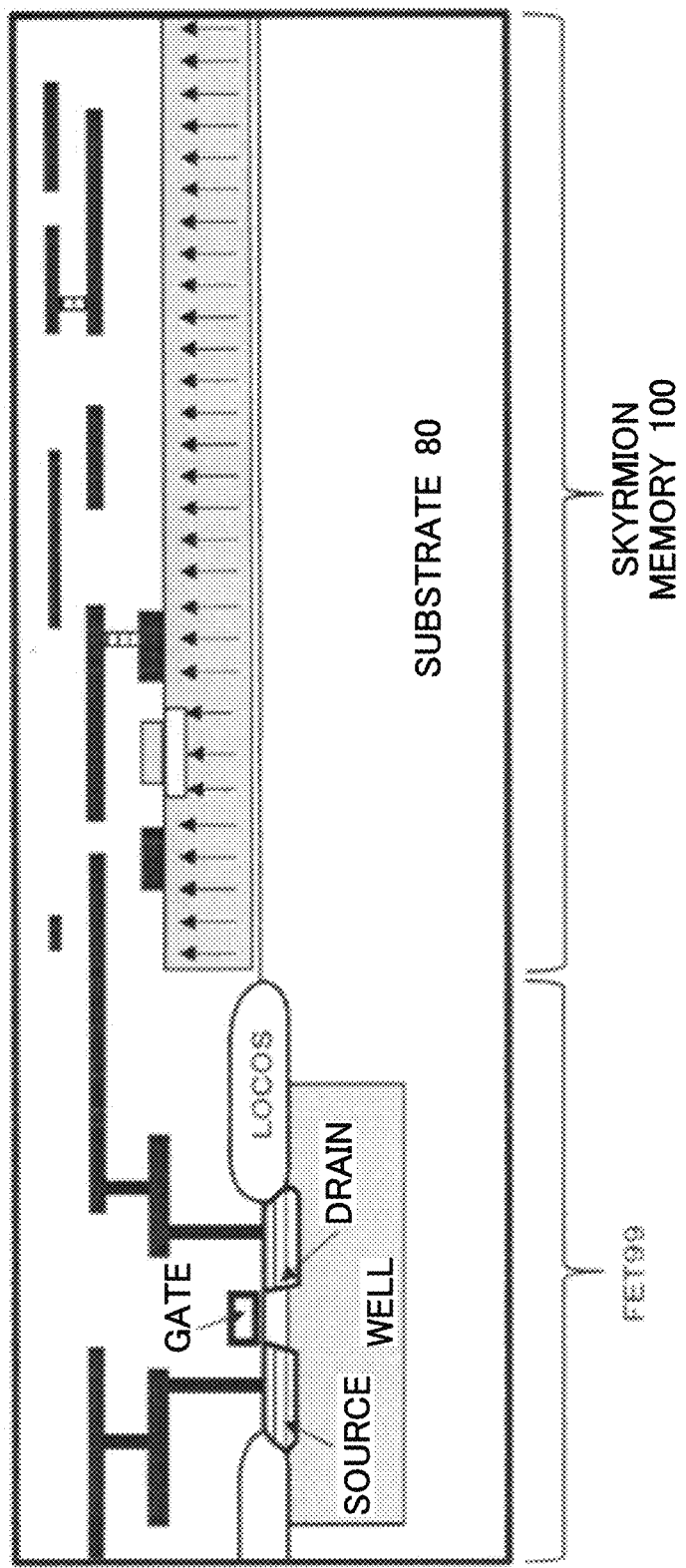
FIG. 16B shows another example of the cross-sectional structure of the skyrmion memory device 110.

FIG. 16B shows another example of the cross-sectional structure of the skyrmion memory device 110. The skyrmion memory device 110 of the present example has a substrate 80, a skyrmion memory 100, and a FET 99. In the present example, the skyrmion memory 100 and the FET 99 are formed on the same plane of the substrate 80. The substrate 80 is a semiconductor substrate of silicon or the like. As shown in FIG. 16A, the generating unit of magnetic field 20 of the skyrmion memory 100 has a dip. An insulator layer is arranged in the dip. The FET 99 may function as a switch that selects the skyrmion memory 100 which performs transfer of the skyrmion 40 or the like, which will be described below. The FET 99 is a general FET capable of being formed by a general semiconductor process.

The FET 99 has each region of a predetermined conductivity-type well, source, and drain formed on the surface of the substrate 80. Also, the FET 99 has a gate electrode formed on a channel between the source and drain. Also, the FET 99 has an element separation layer (LOCOS: LOcal Oxidation of Silicon) between the FET 99 and other elements of the skyrmion memory 100 or the like. The FET 99 of the present example has a two-layered wiring layer. The wiring layer for the FET 99 may be the same layer as the first layer for wiring 70 and the second layer for wiring 75 of the skyrmion memory 100. Also, a part of the wiring layer of the FET 99 may be connected to a part of the wiring of the skyrmion memory 100.

Figure 17:
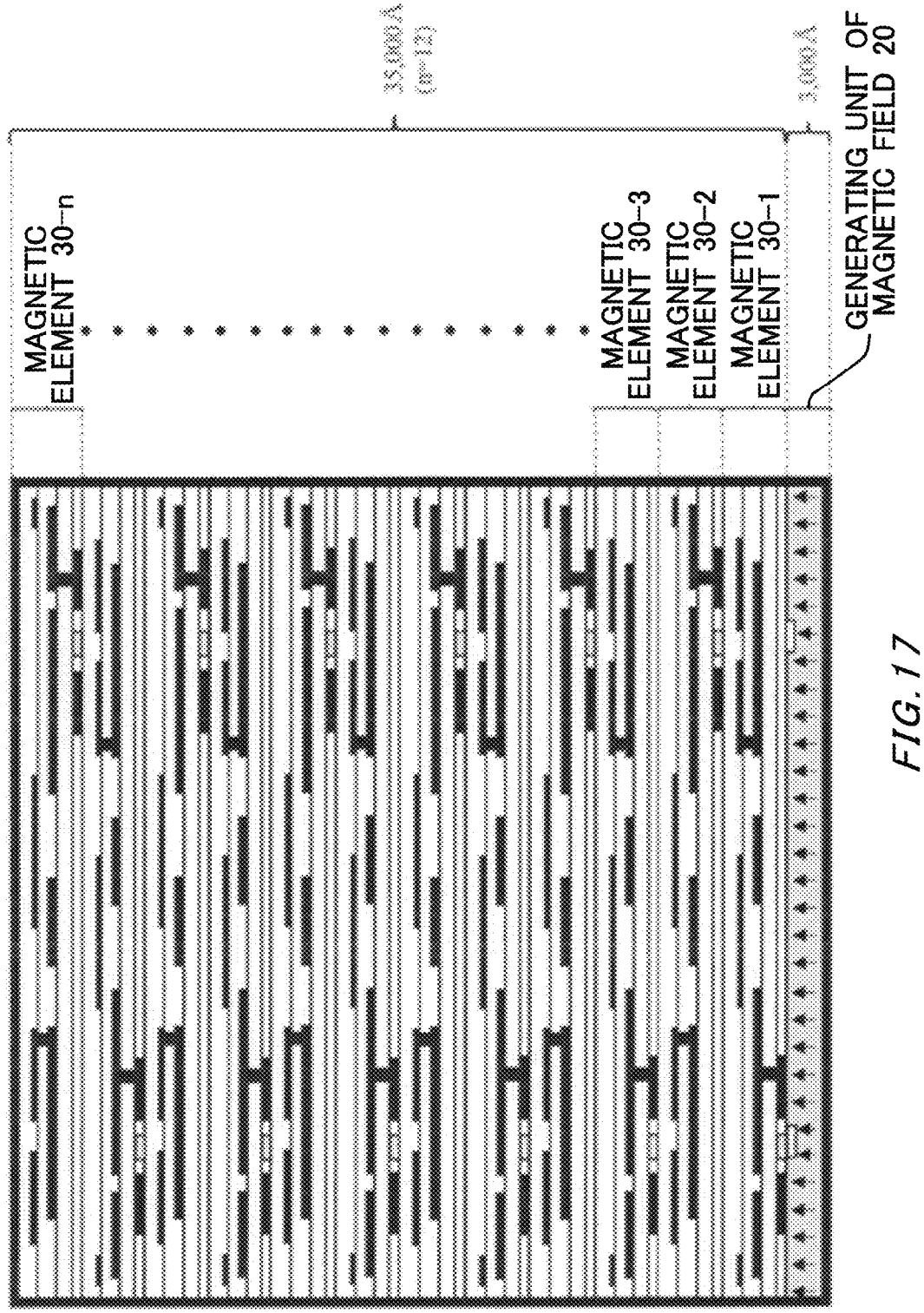
FIG. 17 shows the skyrmion memory device 110 in which n layers of the magnetic elements 30 are stacked.

FIG. 17 shows the skyrmion memory device 110 in which n layers of the magnetic elements 30 are stacked. The skyrmion memory device 110 of the present example is a case of n=12. The generating unit of magnetic field 20 has a film thickness of 3000 Å. The generating unit of magnetic field 20 has a dip of which a film thickness is thin in a portion of a lower portion of each stable position 16 in order to form the stable positions 16. An insulator layer is arranged in the dip. The magnetic element 30 has a structure in which the magnetic element 30-1 to the magnetic element 30-*n* are stacked. The magnetic element 30 of the present example has a film thickness of 35000 Å in total. The skyrmion memory device 110 of the present example stacks a plurality of the magnetic elements 30 on the common generating unit of magnetic field 20, thereby making it possible to increase density. The skyrmion memory device 110 of the present example can achieve density that is n-times of the skyrmion memory device 110 shown in FIG. 16A. In the present example, the magnet 10 of the magnetic element 30 of an adjacent layer may be provided in the non-overlapping position.

Figure 18:
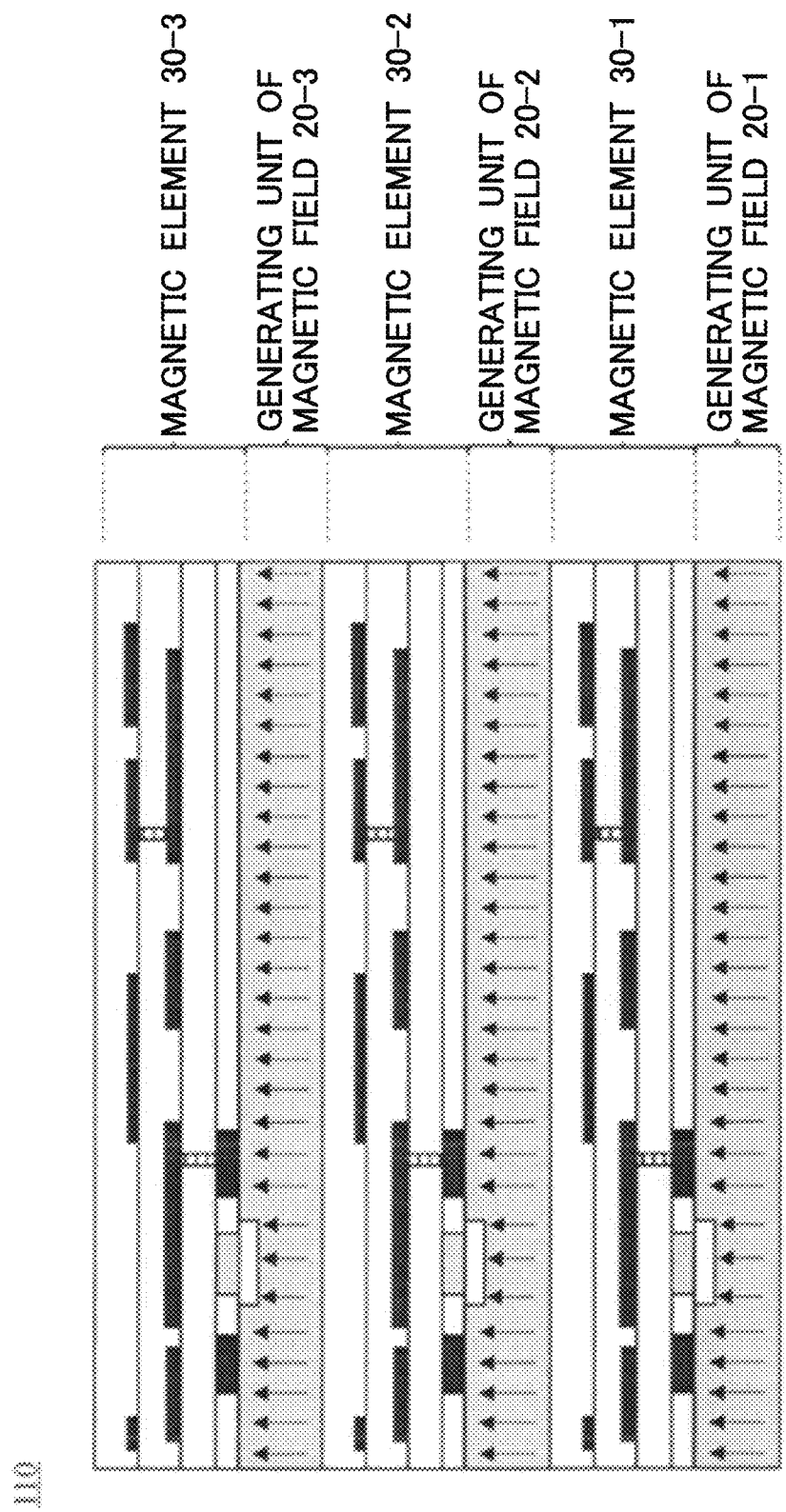
FIG. 18 shows the skyrmion memory device 110 having a plurality of generating units of magnetic field 20 in a stack direction.

FIG. 18 shows the skyrmion memory device 110 having a plurality of generating units of magnetic field 20 in a stack direction. The generating unit of magnetic field 20 has a dip of which a film thickness is thin in a portion of a lower portion of each stable position 16 in order to form the stable positions 16. An insulator layer is arranged in the dip. The skyrmion memory device 110 of the present example has a plurality of generating unit of magnetic field 20 stacked therein, and has one layer of the magnetic element 30 for each generating unit of magnetic field 20. Thereby, the magnetic element 30 can keep the magnetic field intensity received from the generating unit of magnetic field 20 constant. The generating unit of magnetic field 20 may be arranged at an appropriate interval according to materials of the magnetic element 30, or the like.

Figure 19:
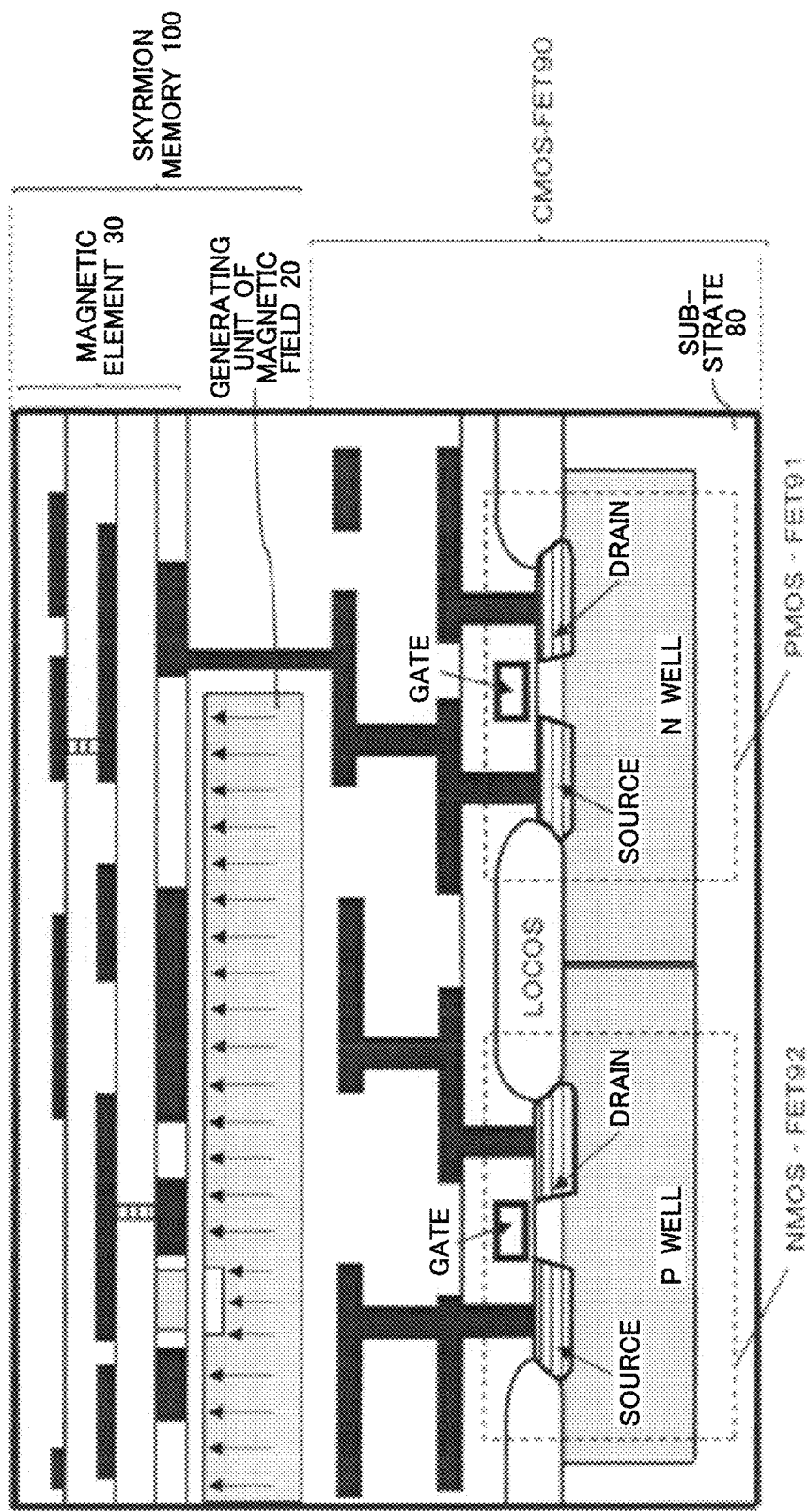
FIG. 19 shows one example of the configuration of the skyrmion memory device 110.

FIG. 19 shows one example of the constitution of the skyrmion memory device 110. The skyrmion memory device 110 of the present example is different from the skyrmion memory device 110 described in FIG. 16A to FIG. 18 in that it includes a CMOS-FET 90 between the substrate 80 and the skyrmion memory 100. The skyrmion memory device 110 of the present example includes the skyrmion memory 100 and the CMOS-FET 90. The CMOS-FET 90 is one example of the semiconductor element and is formed on the substrate 80. The skyrmion memory 100 is formed on the CMOS-FET 90. The magnetic element 30 is formed over the CMOS-FET 90. The generating unit of magnetic field 20 may be formed between the magnetic element 30 and the CMOS-FET 90. The generating unit of magnetic field 20 has a dip of which a film thickness is thin in a portion of a lower portion of each stable position 16 in order to form the stable positions 16. An insulator layer is arranged in the dip. The CMOS-FET 90 may function as a logic circuit, which will be described below.

The CMOS-FET 90 includes a PMOS-FET 91 and an NMOS-FET 92. The CMOS-FET 90 and the PMOS-FET 91 are general FETs capable of being formed by a general silicon process. The CMOS-FET 90 of the present example has a two-layered Cu wiring layer.

In the skyrmion memory device 110, the CMOS-FET 90 that forms a logic circuit and the skyrmion memories 100 that is a non-volatile magnetic element are stacked, and formed within the same chip. Therefore, the skyrmion memory device 110 can reduce power consumption. Consequently, it is possible to reconfigure a large-scale CPU device that currently needs large power consumption with a normally-off large-scale CPU device, playing a major role for achieving low-power consumption. Further, it also provides contributions to significant improvement of calculation speed of CPU. The calculation speed of CPU is subjected to tremendous restriction including setting of standby time or the like to weigh timing for exchange with an external memory. The skyrmion memory device 110 of the present example releases this restriction all at once, and in addition, can exchange data with a high-speed non-volatile magnetic element directly, and thus, speed performance of CPU improves rapidly.

Figure 20:
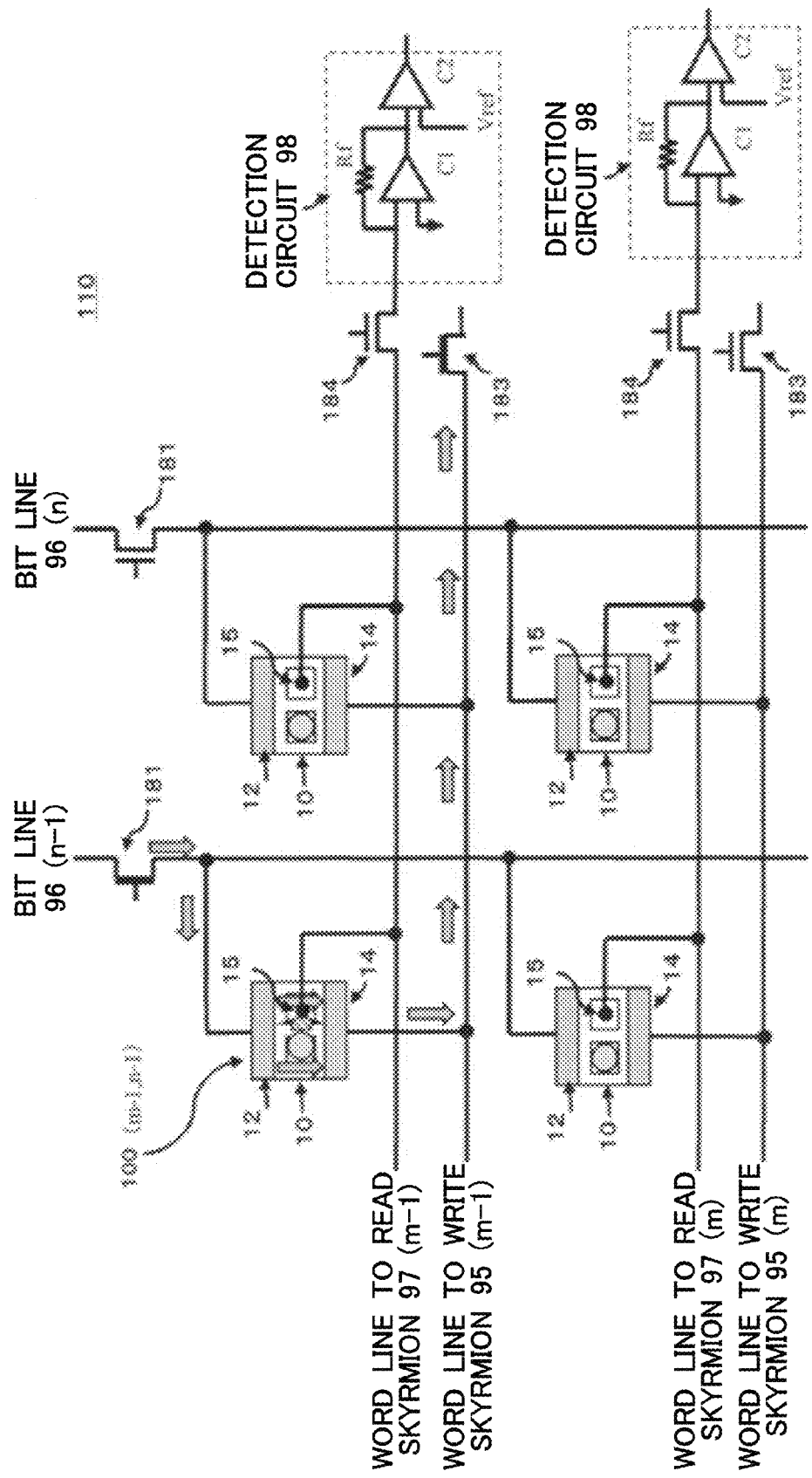
FIG. 20 shows one example of the circuit configuration of the skyrmion memory device 110.

FIG. 20 shows one example of the circuit configuration of the skyrmion memory device 110. The skyrmion memory device 110 of the present example includes a plurality of matrix-like skyrmion memory 100, which are originally shown in FIG. 3. However, the skyrmion memory 100 shown in FIG. 20 does not have the power supply 52. The power supply 52 is connected to the skyrmion memory 100 via a bit line 96 or a word line to write a skyrmion 95 shown in FIG. 20. The measuring unit 34 is connected to the skyrmion memories 100 via the bit line 96 or a word line to read a skyrmion 97 shown in FIG. 20. A detection circuit 98 shown in FIG. 20 functions as a part of the measuring unit 34. FIG. 20 shows the (n−1)-th column, the n-th column, the (m−1)-th row, and the m-th row only, out of a plurality of columns and rows in the matrix.

The skyrmion memory device 110 includes a plurality of skyrmion memories 100, a plurality of bit lines 96, a plurality of word lines to write a skyrmion 95, a plurality of word lines to read a skyrmion 97, a plurality of switches 181, a plurality of switches 183, a plurality of switches 184, and a plurality of detection circuits 98. The bit line 96 is provided in each column of the matrix. Also, the word line to read a skyrmion 97 and the word line to write a skyrmion 95 are provided in each row of the matrix. The bit line 96 is connected to the upstream electrode 12 of each skyrmion memory 100 of the column. The word line to read a skyrmion 97 is connected to the skyrmion sensor 12 of the skyrmion memory 100 of the row. The word line to write a skyrmion 95 is connected to the downstream electrode 14 of each skyrmion memory of the row. The switch 181 is provided in each bit line 96. The switch 183 is provided in each word line to write a skyrmion 95. The switch 184 is provided in each word line to read a skyrmion 97. The switches 181, 183, and 184 are FETs, for example.

The bit line 96, the word line to write a skyrmion 95, and the word line to read a skyrmion 97 are connected to the external power supply via each switch. The external power supply is the power supply 52 or a power supply 31 for measuring, for example. The power supply 52 and the power supply 31 for measuring may be common power supply. Also, the external power supply may be provided for each bit line 96, and may also be provided in a plurality of bit lines 96 in common.

The detection circuit 98 is connected to the word line to read a skyrmion 97, and detects a current flowing through the word line to read a skyrmion 97. The detection circuit 98 functions as an ammeter 32 in the measuring unit 34. The detection circuit 98 may be provided for each word line to read a skyrmion 97, and may also be provided in a plurality of the word lines to read a skyrmion 97 in common.

In a case where data "1" is written in one of the skyrmion memories 100 (that is, in a case where the skyrmion 40 is arranged in the stable position 16-2), the corresponding switch 181 and the corresponding switch 183 are controlled to be in the ON-state, and the corresponding bit line 96 and the corresponding word line to write a skyrmion 95 are selected. For example, in a case where data is written in the skyrmion memory 100 (m−1, n−1), the switch 183 corresponding to the word line to write a skyrmion 95 (m−1) and the switch 181 corresponding to the bit line 96 (n−1) are turned ON. Subsequently, as shown by the arrows in FIG. 20, when the positive current pulse to transfer a skyrmion is caused to flow from the bit line 96 (n−1) to the word line to write a skyrmion, the skyrmion 40 is arranged in the stable position 16-2 of the skyrmion memory 100 (m−1, n−1).

Figure 21:
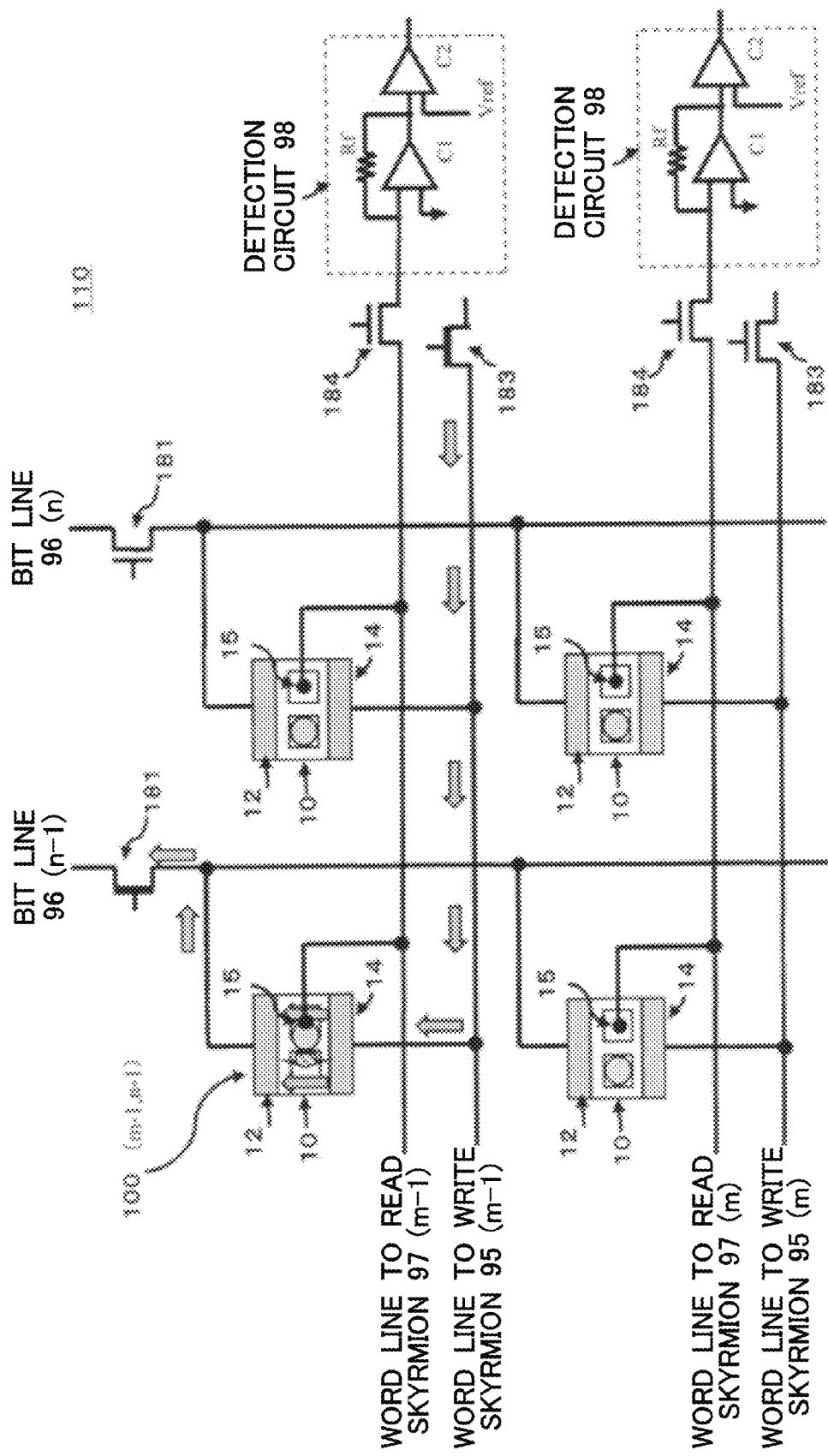
FIG. 21 shows one example of an operation of writing data "0" in the skyrmion memory 100.

FIG. 21 shows one example of an operation of writing data "0" in the skyrmion memory 100. That is, one example of the operation is shown in which the skyrmion 40 is arranged in the stable position 16-1. Similar to the case where data "1" is written, the bit line 96 and the word line to write a skyrmion 95 corresponding to the skyrmion memory 100 in which data "0" is written are selected by the switch 181 and the switch 183. However, in a case where data "0" is written, a negative current pulse to transfer a skyrmion is caused to flow through the skyrmion memory 100 from the bit line 96 to the word line to write a skyrmion 95. Thereby, the skyrmion 40 of the skyrmion memory 100 moves in the stable position 16-1, and data "0" is written.

For example, in a case where data "0" is written in the skyrmion memory 100 (m−1, n−1), the switch 183 corresponding to the word line to write a skyrmion 95 (m−1) and the switch 181 corresponding to the bit line 96 (n−1) are turned ON. Subsequently, as shown by the arrows in FIG. 21, when a negative current pulse to transfer a skyrmion is caused to flow from the bit line 96 (n−1) to the word line to write a skyrmion 95 (m−1), the skyrmion 40 moves in the stable position 16-1 of the skyrmion memory 100 (m−1, n−1). In this manner, the bit line 96 and the word line to write a skyrmion 95 function as a first electric line to transfer a skyrmion and a second electric line to transfer a skyrmion that supply a current to transfer a skyrmion that transfers the skyrmion 40 between a plurality of the stable positions 16.

Figure 22:
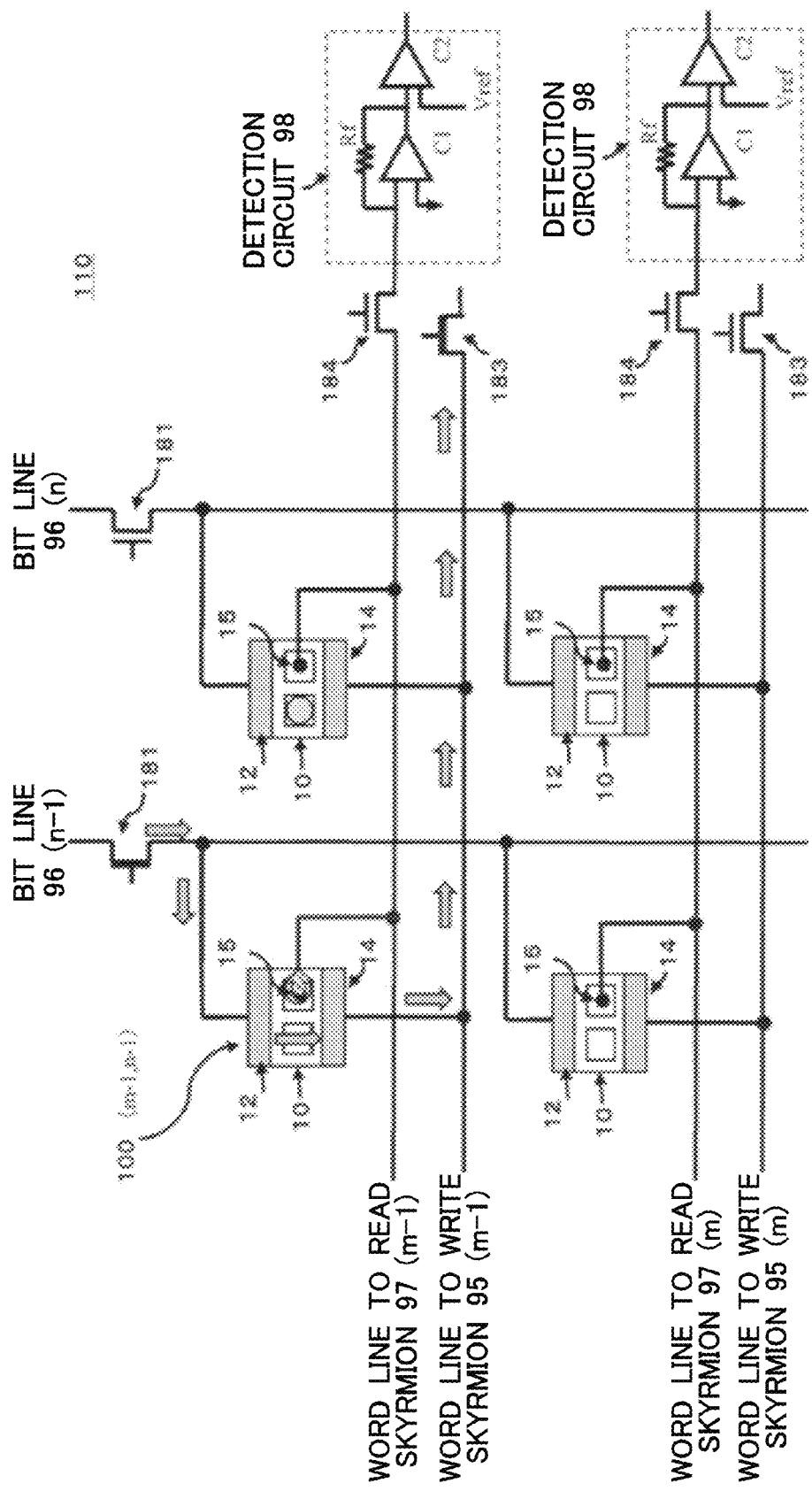
FIG. 22 shows one example of an operation of erasing a skyrmion 40 of the skyrmion memory 100.

FIG. 22 shows one example of an operation of erasing a skyrmion 40 of the skyrmion memory 100. In a case where the skyrmion 40 is erased, similar to writing data, the bit line 96 and the word line to write a skyrmion 95 corresponding to the skyrmion memory 100 that erases the skyrmion 40 are selected by the switch 181 and the switch 183. Moreover, a current to erase a skyrmion is caused to flow through the skyrmion memory 100 from the bit line 96 to the word line to write a skyrmion 95. The current to erase a skyrmion has a current density higher than that of the current to transfer a skyrmion, as described above.

For example, in a case where the skyrmion 40 of the skyrmion memory 100 (m−1, n−1) is erased, the switch 183 corresponding to the word line to write a skyrmion 95 (m−1) and the switch 181 corresponding to the bit line 96 (n−1) are turned ON. Subsequently, as shown by the arrows in FIG. 22, when the current pulse to erase a skyrmion is caused to flow from the bit line 96 (n−1) to the word line to write a skyrmion 95 (m−1), the skyrmion 40 of the skyrmion memory 100 (m−1, n−1) disappears while overcoming the potential barrier at the end portion of the magnet 10. In this manner, the word line to write a skyrmion 95 and the bit line 96 also function as electric lines to erase a skyrmion that supply the current to erase a skyrmion that erase the skyrmion 40.

Figure 23:
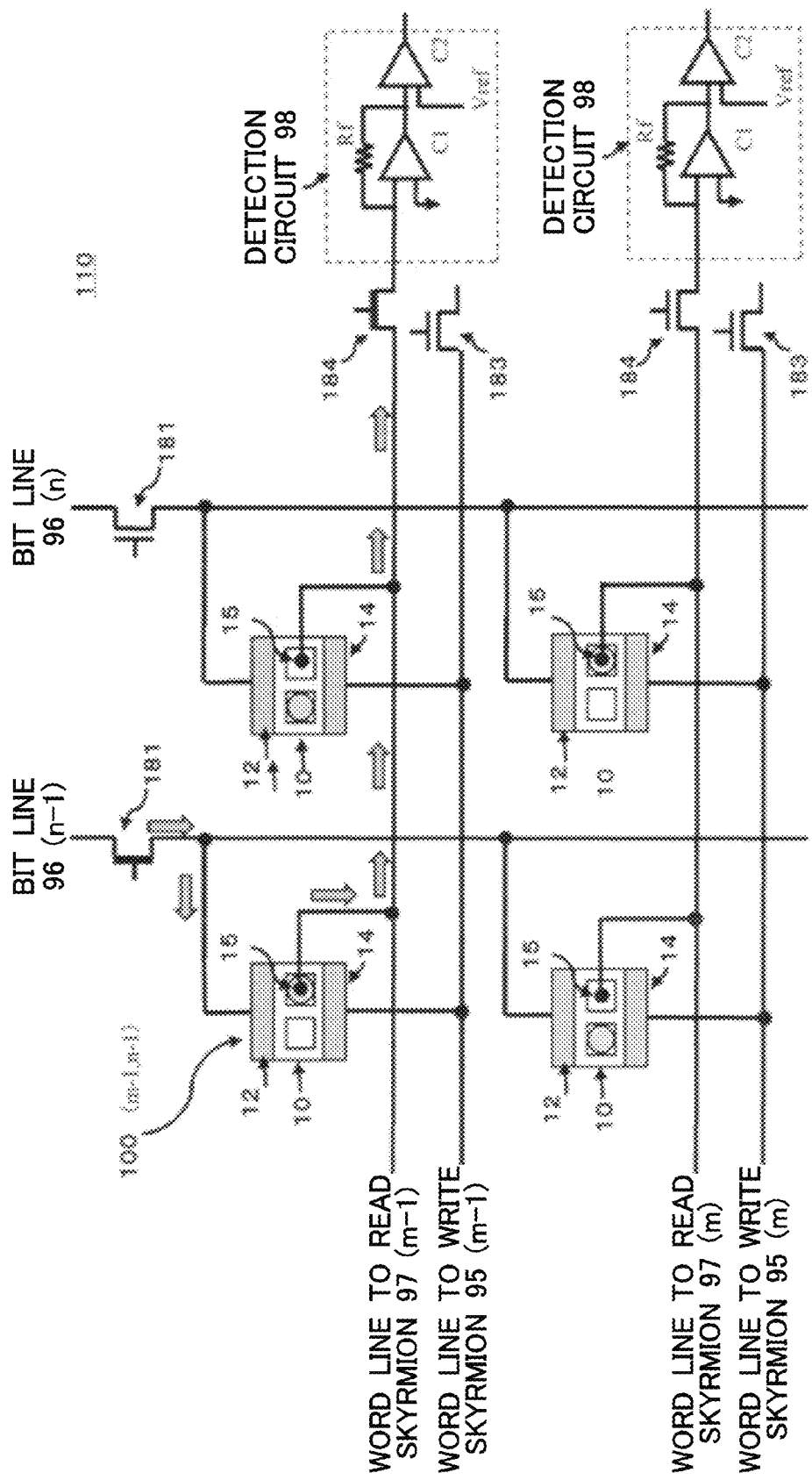
FIG. 23 shows one example of a read operation of the skyrmion memory device 110.

FIG. 23 shows one example of a read operation of the skyrmion memory device 110. The read operation of the skyrmion memory device 110 refers to a case where the presence or absence of the skyrmion 40 in a predetermined position (the stable position 16-2 in the present example) of the magnet 10 of each skyrmion memory 100 is detected. In selecting the skyrmion memory 100 of the read operation, the corresponding bit line 96, the corresponding word line to write a skyrmion 95, and the corresponding word line to read a skyrmion 97 are selected by the switch 181 and the switch 184.

In the read operation, the switch 181 and the switch 184 are turned ON. In this case, the current according to the presence or absence of the skyrmion 40 flows from the upstream electrode 12 to the skyrmion sensor 15. The detection circuit 98 detects the current caused to flow through the skyrmion sensor 12 via the word line to read a skyrmion 97. The detection circuit 98 of the present example converts the current into a voltage, and outputs the converted voltage. It is possible to measure the presence or absence of the skyrmion 40 in the stable position 16-2 from the voltage.

For example, in a case where data of the skyrmion memory 100 (m−1, n−1) is read, the switch 184 corresponding to the word line to read a skyrmion 97 (m−1) and the switch 181 corresponding to the bit line 96 (n−1) are turned ON. Subsequently, a predetermined voltage is applied from the bit line 96 (n−1) to the upstream electrode. Thereby, the current of the word line to read a skyrmion 97 according to the presence or absence of the skyrmion 40 in the stable position 16-2 of the skyrmion memory 100 (m−1, n−1) is generated.

The detection circuit 98 converts the current of the word line to read a skyrmion 97 into a voltage, and detects the presence or absence of the skyrmion 40 in the stable position 16-2. The detection circuit 98 of the present example includes the feedback resistor Rf, the amplification circuit C1, and the circuit for voltage comparison C2, and converts the current into a voltage. The current input from the word line to read a skyrmion 97 to the detection circuit 98 is input in the amplification circuit C1. The feedback resistor Rf is provided in parallel to the amplification circuit C1. The amplification circuit C1 converts the current from the word line to read a skyrmion 97 into a voltage. An output voltage and the reference voltage Vref of the amplification circuit C1 are input in the circuit for voltage comparison C2. The circuit for voltage comparison C2 outputs "1" in a case where the output voltage of the amplification circuit C1 is greater than the reference voltage Vref. Meanwhile, the circuit for voltage comparison C2 outputs "0" in a case where the output voltage of the amplification circuit C1 is smaller than the reference voltage Vref. In a case where the skyrmion 40 is present, the current flown into the detection circuit 98 becomes small. C2 outputs "0". In a case where the skyrmion 40 is not present, the current caused to flow through the detection circuit 98 becomes large. C2 outputs "1". The output is inverted according to the presence or absence of the skyrmion. The output corresponds to the presence or absence of the skyrmion if an inverter is added after C2. Thereby, it is possible to read data of the skyrmion memory 100.

As described above, as shown in FIG. 20 to FIG. 23, the skyrmion memory device 110 can select any skyrmion memory 100, and transfer, erase and read the skyrmion 40. The FET arranged in the vicinity of the skyrmion memory 100, the amplification circuit C1 and the circuit for voltage comparison C2 of the detection circuit 98 include a FET device. The plurality of skyrmion memories 100 are arrayed in a planar shape. Also, the skyrmion memories 100 arrayed in a planar shape may be stacked. The skyrmion memory 100 can significantly increase the density since it is possible to stack the skyrmion memory.

Figure 24A:
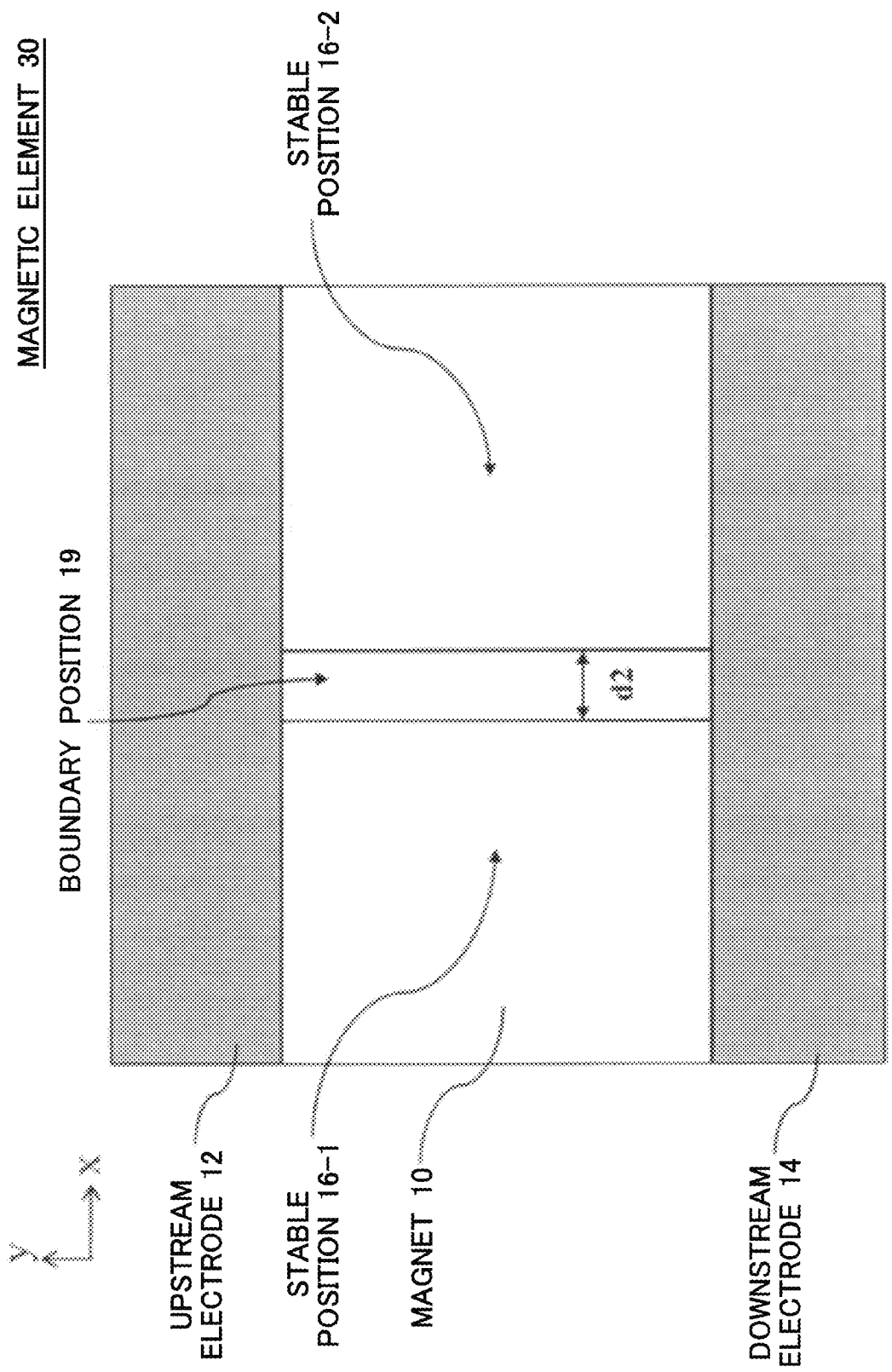
FIG. 24A is a schematic view showing another configuration example of the magnetic element 30.

FIG. 24A is a schematic view showing another structure example of the magnetic element 30. FIG. 24A shows the surface of the upstream electrode 12, the downstream electrode 14, and the magnet 10 out of the constitution of the magnetic element 30. The magnet 10 of the present example has the stable position 16-1, the stable position 16-2, and a boundary position 19. The boundary position 19 divides a region of the magnet 10 into two regions in a direction orthogonal to the direction in which the current to transfer a skyrmion is caused to flow (the x axis direction of the present example). The boundary position 19 has the property of becoming a barrier for the movement of the skyrmion 40. The boundary position 19 of the present example refers to a region where intensity of the external magnetic field is greater than that of the external magnetic field of the stable position 16-1 and the stable position 16-2. The generating unit of magnetic field 20 may generate the external magnetic field.

The boundary position 19 may be formed in a linear shape such that one end is in contact with the upstream electrode 12 and the other end is connected to the downstream electrode 14. Also, the end side of the boundary position 19 between the upstream electrode 12 and the downstream electrode 14 may be formed with a curve. Also, each end portion in the y axis direction of the boundary position 19 may have a gap relative to the upstream electrode 12 and the downstream electrode 14. However, the gap should be set to not allow the skyrmion 40 to pass therethrough.

The stable position 16-1 and the stable position 16-2 of the present example have the same height as the magnet 10 in the y axis direction. The stable position 16-1 and the stable position 16-2 may have the same size as the stable position 16-1 and the stable position 16-2 described in connection to FIG. 3. In this case, the magnet 10 of the present example is smaller than the magnet 10 described in connection to FIG. 3. The width of the boundary position 19 in the x axis direction is a width which is capable of functioning as the barrier of the skyrmion 40, and in which the skyrmion 40 can overcome through the current to transfer a skyrmion. Also, the distance d2 between the stable positions 16, that is, the width d2 in the x axis direction of the boundary position 19 may be in the range of $\lambda/2 > d_2 > \lambda/10$. To improve the density, d2 is desirably as narrow as possible. However, when d2 is narrower than $\lambda/10$, there is a case where the skyrmion 40 cannot remain in one of the two stable positions 16 stably, and the skyrmion moves in the other stable position 16 unintentionally.

Figure 24B:
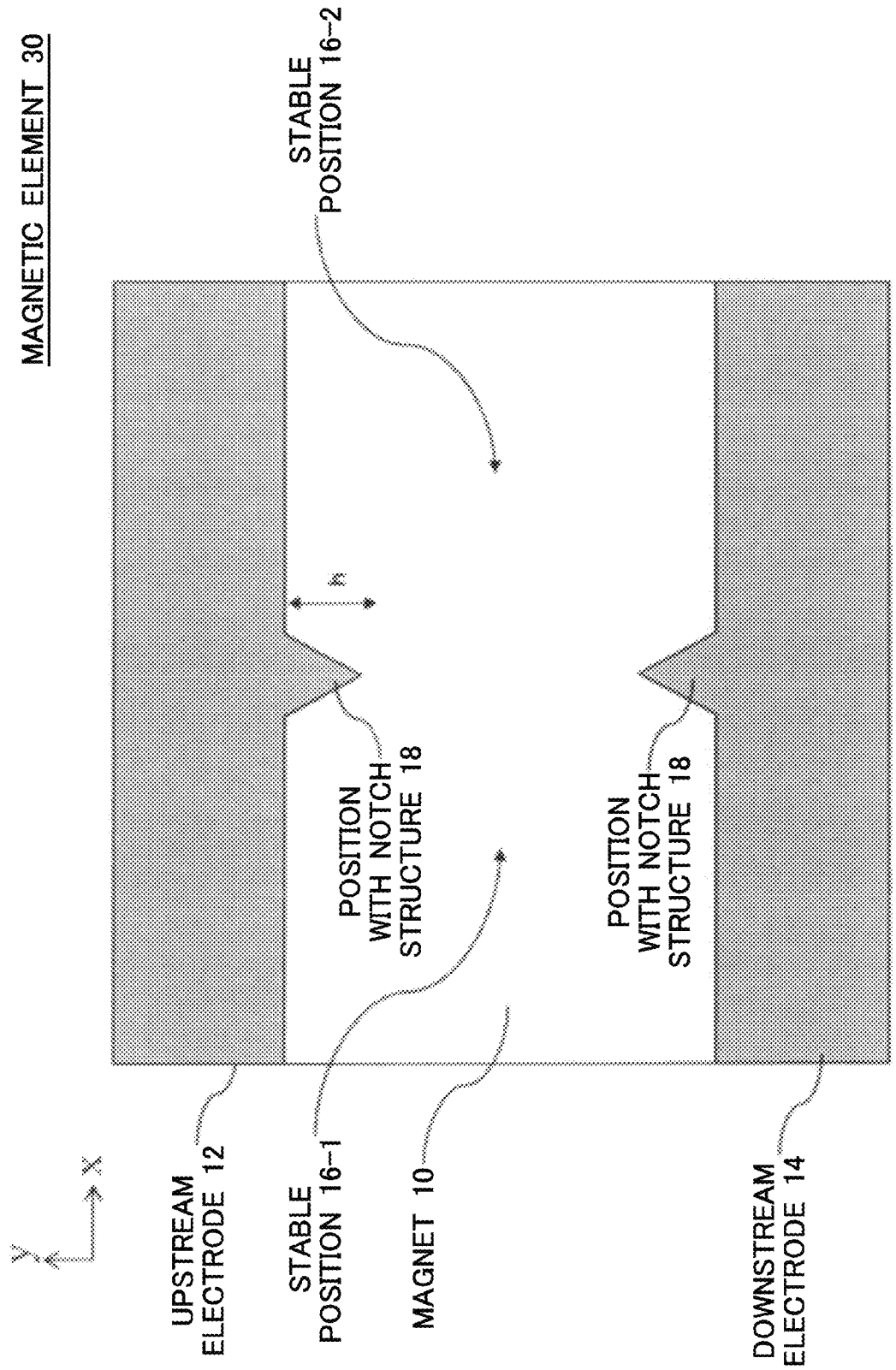
FIG. 24B is a schematic view showing another configuration example of the magnetic element 30.

FIG. 24B is a schematic view showing another structure example of the magnetic element 30. FIG. 24B shows the surface of the upstream electrode 12, the downstream electrode 14, and the magnet 10 out of the constitution of the magnetic element 30. Each of the upstream electrode 12 and the downstream electrode 14 of the present example has a position with a notch structure 18 that protrudes inside the magnet 10. For example, the position with a notch structure 18 may be positioned in the center portion of the magnet 10 in the x axis direction. That is, the position with a notch structure 18 may be positioned such that the magnet 10 is divided into two parts in the x axis direction. Each region of the magnet 10 divided by the position with a notch structure 18 functions as the stable positions 16. In the present example, the region of the magnet 10 on the negative direction side of the x axis functions as the stable position 16-1 and the region of the magnet 10 on the positive direction side of the x axis functions as the stable position 16-2.

The height h of each position with a notch structure 18 in the x axis direction may only need to be the barrier in the movement of the skyrmion 40. As one example, the height h may be approximately 10, taking a lattice constant "a" of the magnet 10 as a unit. Also, the height h may be set such that the height of the magnet 10 sandwiched between both tips of the positions with a notch structure 18 is approximately 30 to 40, taking the lattice constant "a" of the magnet 10 as a unit. Also, the positions with a notch structure 18 of the upstream electrode 12 and the downstream electrode 14 preferably have the same shape. The position with a notch structure 18 may be formed in, for example, triangle, square, and other polygonal shapes, and an arc shape of a semicircle or the like.

Also, in a case where the stable positions 16 are formed with only the position with a notch structure 18, the generating unit of magnetic field 20 may not have a dip (insulator layer 22) in the position opposite to the stable positions 16. Also, the stable positions 16 may be formed in combination with the position with a notch structure 18 and the insulator layer 22. Also, the position with a notch structure 18 and the boundary position 19 shown in FIG. 24A may be combined.

Figure 25:
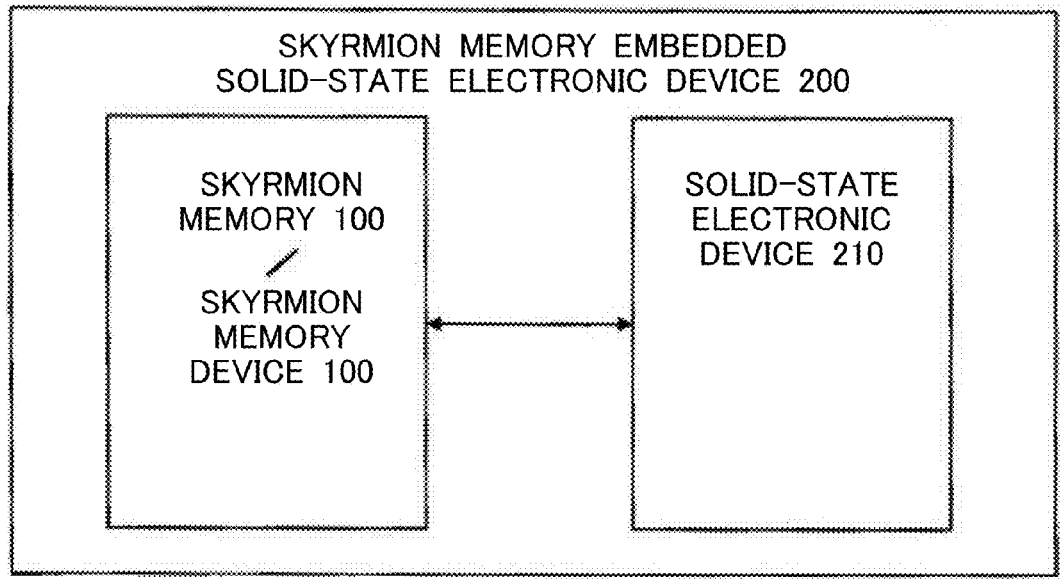
FIG. 25 is a schematic view showing the configuration example of a skyrmion memory embedded solid-state electronic device 200.

FIG. 25 is a schematic view showing the configuration example of a skyrmion memory embedded solid-state electronic device 200. The skyrmion memory embedded solid-state electronic device 200 includes the skyrmion memory 100 or the skyrmion memory device 110, and a solid-state electronic device 210. The skyrmion memories 100 or the skyrmion memory device 110 corresponds to the skyrmion memory 100 or the skyrmion memory device 110 described in FIG. 1 to FIG. 24B, respectively. The solid-state electronic device 210 is a CMOS-LSI device, for example The solid-state electronic device 210 has a function for at least one of writing data in the skyrmion memory 100 or the skyrmion memory device 110, and reading data from the skyrmion memory 100 or the skyrmion memory device 110.

Figure 26:
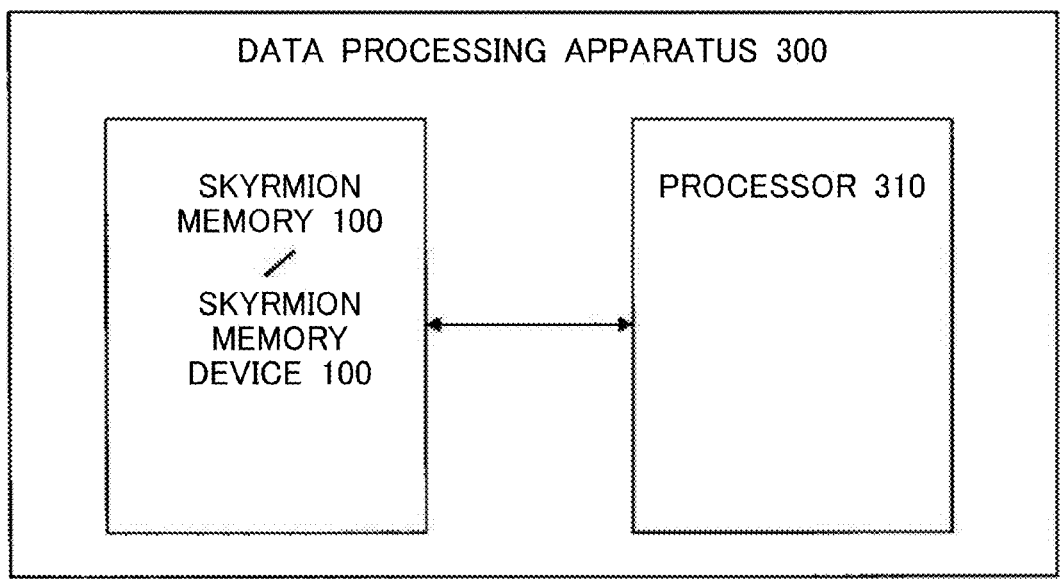
FIG. 26 is a schematic view showing the configuration example of a data processing apparatus 300.

FIG. 26 is a schematic view showing the configuration example of a data processing apparatus 300. The data processing apparatus 300 includes the skyrmion memories 100 or the skyrmion memory device 110, and a processor 310. The skyrmion memory 100 or the skyrmion memory device 110 corresponds to the skyrmion memory 100 or the skyrmion memory device 110 described in FIG. 1 to FIG. 24B, respectively. The processor 310 has a digital circuit that processes a digital signal, for example. The processor 310 has a function for at least one of writing data in the skyrmion memory 100 or the skyrmion memory device 110, and reading data from the skyrmion memory 100 or the skyrmion memory device 110.

Figure 27:
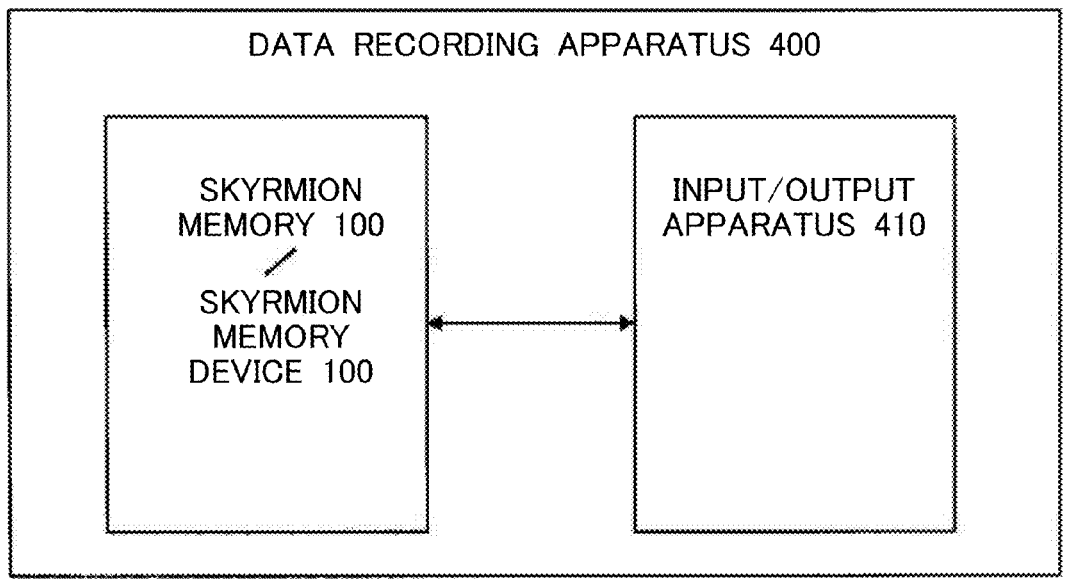
FIG. 27 is a schematic view showing the configuration example of a data recording apparatus 400.

FIG. 27 is a schematic view showing the configuration example of a data recording apparatus 400. The data recording apparatus 400 includes the skyrmion memory 100 or the skyrmion memory device 110, and an input/output apparatus 410. The data recording apparatus 400 is a memory device of, for example, a hard disk, USB memory or the like. The skyrmion memory 100 or the skyrmion memory device 110 corresponds to the skyrmion memory 100 or the skyrmion memory device 110 described in FIG. 1 to FIG. 24B, respectively. The input/output apparatus 410 has a function for at least one of writing data from the outside in the skyrmion memory 100 or the skyrmion memory device 110, and reading data from the skyrmion memory 100 or the skyrmion memory device 110 to output the data to the outside.

Figure 28:
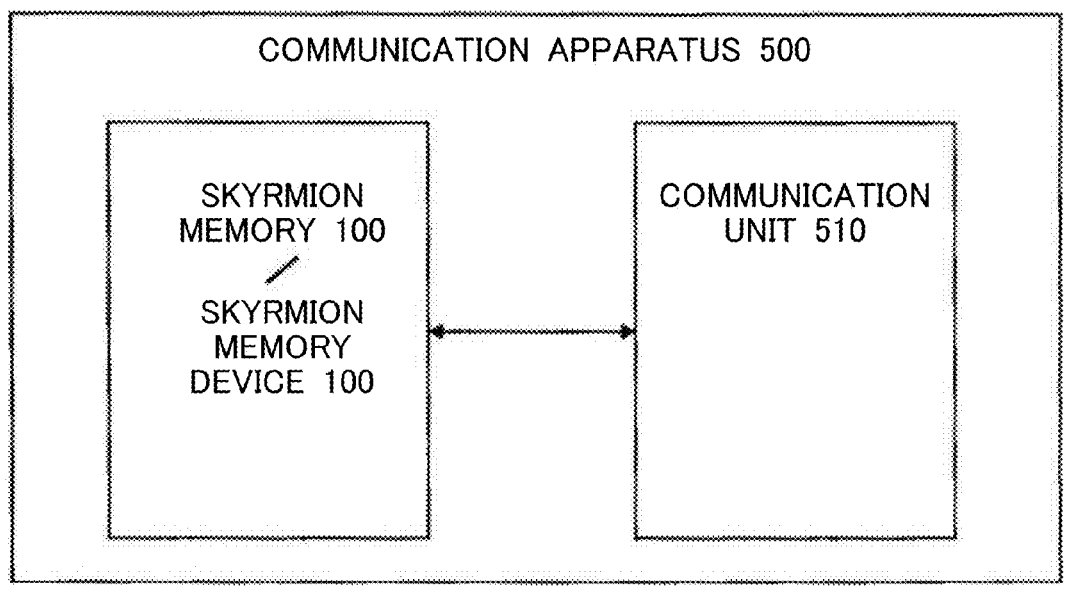
FIG. 28 is a schematic view showing the configuration example of a communication apparatus 500.
Figure 29:
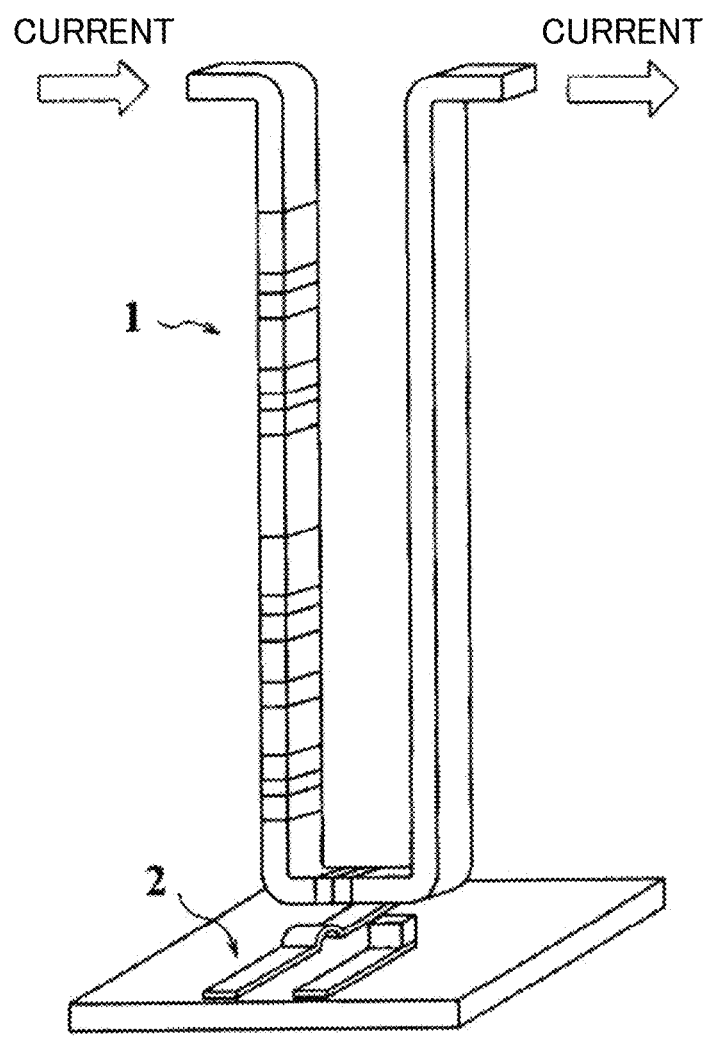
FIG. 29 is a view showing the principle of driving of magnetic domain with current.

FIG. 28 is a schematic view showing the configuration example of a communication apparatus 500. The communication apparatus 500 refers to a general apparatus having a function for communication with the outside of a mobile telephone, a smartphone, a tablet terminal, or the like, for example. The communication apparatus 500 may be portable, and may also be non-portable. The communication apparatus 500 includes the skyrmion memory 100 or the skyrmion memory device 110, and a communication unit 510. The skyrmion memory 100 or the skyrmion memory device 110 correspond to the skyrmion memory 100 or the skyrmion memory device 110 described in FIG. 1 to FIG. 24B, respectively. The communication unit 510 has a function for communication with the outside of the communication apparatus 500. The communication unit 510 may have a wireless communication function, may have a wired communication function, and may also have both of the wireless communication and the wired communication. The communication unit 510 has at least one of a function for writing data received from the outside in the skyrmion memory 100 or the skyrmion memory device 110, a function for transmitting data read from the skyrmion memory 100 or the skyrmion memory device 110 to the outside, and a function for operating based on control information stored by the skyrmion memory 100 or the skyrmion memory device 110.

Also, since it is possible to achieve power saving in the electronic equipment adopting the skyrmion memory 100 or the skyrmion memory device 110, it is possible to achieve an increased lifetime for the mounted battery. This enables the user side to be provided with further revolutionary specifications in the mobile electronic equipment adopting the skyrmion memory 100 or the skyrmion memory device 110. The electronic equipment may be a variety of items including a personal computer, an image recording apparatus, or the like.

Also, regarding a CPU embedded communication apparatus (a mobile telephone, a smartphone, a tablet terminal, or the like), by adopting the skyrmion memory 100 or the skyrmion memory device 110, it is possible to achieve loading of image information and operations of a wide range of large-scale application programs faster, and achieve a high-speed responsiveness, and thus it is possible to secure usage environment which is comfortable for users. Also, since it is possible to achieve faster image display to be displayed on screen or the like, it is possible to further improve the usage environment.

Also, by adopting the skyrmion memory 100 or the skyrmion memory device 110 in the electronic equipment of a digital camera or the like, it is possible to record a moving image spanning a large capacity. Also, by adopting the skyrmion memory 100 or the skyrmion memory device 110 in the electronic equipment of a 4K television receiver or the like, it is possible to achieve high capacity for image recording. As a result, it is possible to eliminate the need for connecting the television receiver to an external hard disk. Also, in addition to a case where the skyrmion memory 100 or the skyrmion memory device 110 is adopted in the data recording apparatus including the hard disk, the skyrmion memory 100 or the skyrmion memory device 110 may be achieved specifically as a data recording medium.

Also, for the electronic equipment of a navigation system of an automobile, or the like, by adopting this skyrmion memory 100 or this skyrmion memory device 110, it is possible to achieve even higher resolution and also possible to easily store a large amount of map information.

Also, the skyrmion memory device 100 or the skyrmion memory 110 can be expected to have a large impact on the practical application of a self-driving apparatus and a flying apparatus. That is, the present invention brings much knowledge to humanity in complicated control processing for the flying apparatus, weather information processing, enriching services for passengers by providing video with high image quality, controlling an apparatus for space flight, and even recording enormous amounts of recording information of observed image information.

Also, the skyrmion memory 100 or the skyrmion memory device 110 uses a structure of magnetic moment, and the structure is a memory having topological stability, and thus, has high tolerance for high energy elementary particles in space. The skyrmion memory or the skyrmion memory device has an advantage which is very different from flash memory using an electric charge involving electrons as a storage holding medium. Therefore, the skyrmion memory or the skyrmion memory device is important as a recording medium in the apparatus for space flight, or the like.

LIST OF REFERENCE NUMERALS

10: magnet,
12: upstream electrode,
14: downstream electrode,
15: skyrmion sensor,
16: stable position,
16-1: stable position,
16-2: stable position,
18: position with a notch structure,
19: boundary position,
20: generating unit of magnetic field,
22: insulator layer,
30: magnetic element,
31: power supply for measuring,
32: ammeter
34: measuring unit,
40: skyrmion,
52: power supply,
60: magnetic layer,
61: insulator,
65: protective layer for magnet,
66: protective film for magnet,
67: first via,
70: first layer for wiring,
71: first wiring,
72: protective film for the first wiring,
73: second via,
75: second layer for wiring,
76: second wiring,
77: protective film for the second wiring,
80: substrate,
90: CMOS-FET,
91: PMOS-FET,
92: NMOS-FET,
95: word line to write a skyrmion,
96: bit line,
97: word line to read a skyrmion,
98: detection circuit,
100: skyrmion memory,
110: skyrmion memory device,
151: non-magnetic thin film,
181: switch,
183: switch,
184: switch,
200: skyrmion memory embedded solid-state electronic device,
210: solid-state electronic device,
300: data processing apparatus,
310: processor,
400: data recording apparatus,
410: input/output apparatus,
500: communication apparatus,
510: communication unit

What is claimed is:
1. A magnetic element capable of transferring a skyrmion, comprising:
a magnet in a thin layer shape surrounded by a non-magnetic material;

an upstream electrode being a non-magnetic metal connected to a spreading direction of the magnet;
a downstream electrode being a non-magnetic metal connected to a spreading direction of the magnet separately from the upstream electrode; and
a skyrmion sensor that detects a position of the skyrmion, wherein
the magnet has a plurality of stable positions in which the skyrmion exists more stably than in other regions of the magnet, and
a transferring configuration with a direction perpendicular to a current direction is provided in which a direction in which a current flowing between the upstream electrode and the downstream electrode is arranged substantially perpendicular to a direction in which one or more skyrmions are transferred.

2. The magnetic element according to claim 1, wherein the plurality of stable positions are provided in a region sandwiched between the upstream electrode and the downstream electrode in the magnet.

3. The magnetic element according to claim 2, wherein the plurality of stable positions are arrayed in a direction substantially orthogonal to an orientation of a current flowing between the upstream electrode and the downstream electrode.

4. The magnetic element according to claim 3, wherein the magnet exhibits at least a skyrmion crystal phase in which the skyrmion is generated and a ferromagnetic phase, according to an applied magnetic field.

5. The magnetic element according to claim 3, wherein the magnet is made from one of a chiral magnet, a dipole magnet, a frustrated magnet, and a stacking structure of a magnetic material and a non-magnetic material.

6. The magnetic element according to claim 3, wherein
the skyrmion sensor has, in one plane of the magnet, a stacking structure of a non-magnetic insulator thin film contacting a surface of the magnet and a magnetic metal provided on the non-magnetic insulator thin film, and
in the stacking structure, a resistance value changes according to the position of the skyrmion.

7. The magnetic element according to claim 6, wherein the skyrmion sensor is positioned in at least one stable position out of the plurality of stable positions between the upstream electrode and the downstream electrode.

8. The magnetic element according to claim 3, wherein a height Hm of the magnet sandwiched between the upstream electrode and the downstream electrode is such that $3 \cdot \lambda > Hm \geq \lambda/2$, where $\lambda$ denotes a diameter of the skyrmion to be generated in the magnet.

9. The magnetic element according to claim 3, wherein
each of the upstream electrode and the downstream electrode has a position with a notch structure that protrudes toward the inside of the magnet, and
each region of the magnet divided by each of the positions with a notch structure functions as the stable position.

10. The magnetic element according to claim 3, wherein a distance between the respective stable positions in the plurality of stable positions is such that $\lambda/2 > d2 \geq \lambda/10$, where $\lambda$ denotes a diameter of the skyrmion to be generated in the magnet.

11. A skyrmion memory, comprising:
the magnetic element according to claim 3;
a generating unit of magnetic field that is provided opposite to the magnet, and is capable of applying a magnetic field to the magnet;
a current path that is connected to the upstream electrode and the downstream electrode, and applies a pulse current to the magnet between the upstream electrode and the downstream electrode; and
a measuring unit that is connected to the skyrmion sensor, and detects the position of the skyrmion based on a detection result of the skyrmion sensor.

12. The skyrmion memory according to claim 11, wherein
the magnet has a closed-path pattern, and
the plurality of stable positions are arrayed so as to make one circuit of the closed-path pattern of the magnet.

13. The skyrmion memory according to claim 11, wherein
the skyrmion is transferred from a first stable position to a second stable position by causing a positive current pulse to transfer a skyrmion to flow between the upstream electrode and the downstream electrode, and
the skyrmion is transferred from the second stable position to the first stable position by causing a negative current pulse to transfer a skyrmion to flow between the upstream electrode and the downstream electrode.

14. The skyrmion memory according to claim 11, wherein in the generating unit of magnetic field, a film thickness of the magnet in a region opposite to the stable position is thinner compared to that in other regions.

15. The skyrmion memory according to claim 11, having a plurality of the magnetic elements stacked in a thickness direction.

16. A skyrmion memory device comprising:
the plurality of skyrmion memories according to claim 11,
a plurality of electric lines to transfer a skyrmion that are connected to the plurality of skyrmion memories, and supply, to the respective skyrmion memories corresponding thereto, a current to transfer a skyrmion that transfers the skyrmion between the plurality of stable positions;
a plurality of word lines to read a skyrmion that are connected to the plurality of skyrmion memories, and transmit a voltage or a current according to the position of the skyrmion of the respective skyrmion memories corresponding thereto;
a plurality of switches that are provided to the plurality of electric lines to transfer a skyrmion and the plurality of word lines to read a skyrmion, and select the skyrmion memory; and
a detection circuit that detects the position of the skyrmion in the skyrmion memory selected by the plurality of switches based on the current or the voltage flowing through the plurality of word lines to read a skyrmion.

17. The skyrmion memory device according to claim 16, wherein
a first electric line to transfer a skyrmion out of the plurality of electric lines to transfer a skyrmion is connected to the upstream electrode of the corresponding skyrmion memory,
a second electric line to transfer a skyrmion out of the plurality of electric lines to transfer a skyrmion is connected to the downstream electrode of the corresponding skyrmion memory,
the respective word lines to read a skyrmion are connected the skyrmion sensor of the corresponding skyrmion memory,
the plurality of switches select the corresponding first electric line to transfer a skyrmion and the corresponding second electric line to transfer a skyrmion in a case where the skyrmion is transferred or erased in one of the skyrmion memories, select one of the corresponding first electric line to transfer a skyrmion and the corresponding second electric line to transfer a skyrmion, and also select the corresponding word line to read a skyrmion in a case where the presence or absence of the skyrmion is detected in one of the skyrmion memories.

18. A data recording apparatus on which the skyrmion memory device according to claim 16 is mounted.

19. A data processing apparatus on which the skyrmion memory device according to claim 16 is mounted.

20. A communication apparatus on which the skyrmion memory device according to claim 16 is mounted.

* * * * *